United States Patent
DeVito et al.

(10) Patent No.: US 9,569,565 B2
(45) Date of Patent: Feb. 14, 2017

(54) COMPUTER-IMPLEMENTED SYSTEM AND METHOD FOR ROOF MODELING AND ASSET MANAGEMENT

(71) Applicant: CyberCity 3D, Inc., El Segundo, CA (US)

(72) Inventors: Kevin DeVito, Hermosa Beach, CA (US); Peter Ding, Redondo Beach, CA (US)

(73) Assignee: CYBERCITY 3D, INC, El Segundo, CA (US)

( * ) Notice: Subject to any disclaimer, the term of this patent is extended or adjusted under 35 U.S.C. 154(b) by 515 days.

(21) Appl. No.: 14/151,691

(22) Filed: Jan. 9, 2014

(65) Prior Publication Data

US 2014/0200861 A1 Jul. 17, 2014

Related U.S. Application Data

(60) Provisional application No. 61/751,687, filed on Jan. 11, 2013, provisional application No. 61/843,852, filed on Jul. 8, 2013.

(51) Int. Cl.
G06F 17/50 (2006.01)
(52) U.S. Cl.
CPC ....... *G06F 17/5004* (2013.01); *G06F 17/5009* (2013.01)
(58) Field of Classification Search
USPC ......................................................... 703/1, 2
See application file for complete search history.

(56) References Cited

U.S. PATENT DOCUMENTS

| 8,352,220 | B2 | 1/2013 | Wayne et al. |
| 8,412,492 | B2* | 4/2013 | Chang .................... G06T 17/00 703/1 |
| 2009/0177458 | A1 | 7/2009 | Hochart et al. |
| 2010/0063784 | A1* | 3/2010 | Chang .................... G06T 17/00 703/2 |
| 2011/0205245 | A1 | 8/2011 | Kennedy et al. |
| 2012/0035887 | A1 | 2/2012 | Augenbraun et al. |
| 2012/0209782 | A1 | 8/2012 | Pershing et al. |

OTHER PUBLICATIONS

KIPO Search Report and Written Opinion dated Apr. 16, 2014 for corresponding application No. PCT/US2014/010923.

* cited by examiner

*Primary Examiner* — Thai Phan
(74) *Attorney, Agent, or Firm* — Greenberg Traurig LLP

(57) ABSTRACT

Embodiments of the invention provide a computer-implemented system and method for generating a three-dimensional rooftop model. In some embodiments, the system and method can process stereo aerial images to generate a stereoscopic image, and generate a point-cloud field from at least a portion of the stereoscopic image. Some embodiments of the computer-implemented system and method can generate three-dimensional rooftop models using polylines and polygons derived from the point-cloud field. In some embodiments, a rooftop solar energy potential can be determined using a rooftop area calculated using the system and method. In some further embodiments, a rainwater run-off potential can be calculated using a measured rooftop area calculated using the computer-implemented system and method. In some embodiments, the system and method can display at least one building including at least one rooftop including one or more rooftop portions including a display of a solar potential and/or a rainwater runoff potential.

20 Claims, 70 Drawing Sheets

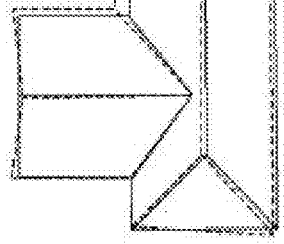
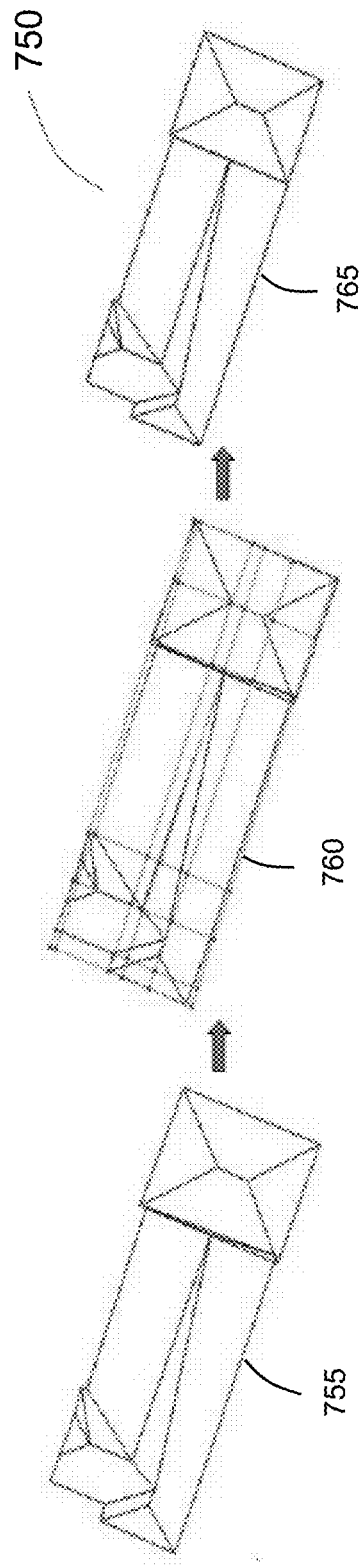
FIG. 7A
FIG. 7B

FIG. 9

"Old School" Calculation of Impervious Surface or Solar Roof Areas

- Historically tallied with digitization of 2D roof area for a *2-dimensional measurement*

Data Deliverables

1400

1490

1450

| Data Field | Description |
|---|---|
| EGID | Building ID number |
| Absolute Height | Height relative to sea level |
| Relative Height | Height relative to DTM |
| Surface Area Total | Total 3D area |
| Surface Area X, Y | 2D polygon total area |
| Slope Min | Slope of roof polygon minimum |
| Slope Max | Slope of roof polygon maximum |
| Roof Pitch Angle | Solar roof slope in degrees |
| Roof Type | Roof description (Flat, Saddle, etc) |
| Solar Azimuth | Roof orientation relative to North |
| Solar Surface Area | Solar roof surface area |
| 2D Solar Area | 2D polygon area measurement |
| Sp Façade | Superstructure façade area |
| SP Roof | Superstructure roof area |

1455 — EGID
1457 — Absolute Height
1459 — Relative Height
1461 — Surface Area Total
1463 — Surface Area X, Y
1465 — Slope Min
1467 — Slope Max
1469 — Roof Pitch Angle
1471 — Roof Type
1473 — Solar Azimuth
1475 — Solar Surface Area
1477 — 2D Solar Area
1479 — Sp Façade
1481 — SP Roof

FIG. 14

Example: Solar and Stormwater Runoff Analysis based on orientation, area, pitch, annual rainfall and azimuth

Economic Development
3D Buildings for Solar Resource Management

- Roof geometry, area and orientation determine the solar potential of a particular roof polygon
  - The size of the roof surface for solar panel installation
  - The pitch angle of the roof (calculating each roof surface or polygon)
  - The roof orientation to south (azimuth)

Environmental Protection:
3D Buildings & Storm Water Management

- Roof geometry and drainage characteristics determine how water flows off of a particular roof polygon
  - The size of the roof surface that comes in contact with rain
  - The pitch angle of the roof (calculating each roof surface or polygon)
  - The annual rainfall and its historic intensity

Calculating Storm Water Run off and collection

The analytical tools are available for accurate storm water analysis provided roof measurements are available and accurate

FIG. 28A

| Tool name | Figure | Remark |
|---|---|---|
| 1. Move point (2D) 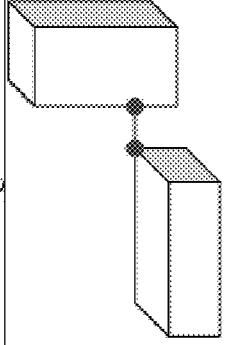 | 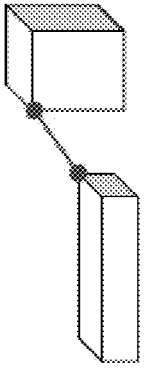 | Move one vertex to a new position (2D), or snap to another vertex (2D). |
| 2. Move Point (3D) | | Move one vertex to a new position (3D), or snap to another vertex (3D). |
FIG. 28B

FIG. 28C

| | | |
|---|---|---|
| 3. Move point to line | | Make the selected vertex snap to a line in XY plane. |
| 4. Set point height to average | | Calculate the average height of selected vertices and set it as the Z of each vertex. |
| 5. Set point Height to | | Select a vertex as base point, and set it height to another selected vertex. |
| 6. Change Point Height | | Change the selected point height. Each left click will arise or down one Z step that is defined in Table 2.1.9 |
| 7. Set lines parallel | | Set all selected line parallel to the ideal line. |
| 8. Rotate line endpoints to parallel baseline | | Rotate one endpoint to parallel the baseline. |
| 9. Set Z on two-line face | | Set point height on the face that is defined by two lines. |
| 10. Set Z on face | | Set point height on the ideal face. |
| 11. Set Z on two-line face along pointed line | | Set point on the face along the pointed line. The face is defined by the selected two lines. |
| 12. Set Z on the face along pointed line | | Set point on the selected face along the pointed line. |

| 2801a | 2801b | 2801c |
|---|---|---|
| 4. Create Object Base | | Create object base |
| 5. Create Overhang Roof | | Create Overhang roof by integrating selected 3D object and the referenced footprint. |
| 6. Snap Wall to inner wall | | As the stereo model doesn't fit footprint, after step 1.1.5, the walls of between two houses may not touch each other. The tool is used to make a wall snap to another inner wall |
| 10. Artificial Overhang Roof | | Create overhang roof for all houses inside of fence. The depth of the overhang is defined in Table 2.1.10 |
| 11. Group Object | | This tool realizes the following functionalities:<br>- group 3D objects in one building.<br>- label 3D objects in the same building<br>- derive the FootBase for each building and put it in level "MAPPOLYGON". |
| 14. Label objects in Fence | | This tool realizes the following functionalities:<br>- group 3D objects in fence into building by the referenced footprint data.<br>- label 3D objects in one building the same EGID code |
| 15. Classify objects in Fence | | This tool will classify the 3D object type: BB=1, FBB=2, SP(SS)=3. |

| 2801a | 2801b | 2801c |
|---|---|---|
| 17. Pack building in Fence | | This tool will remove all the shared inner walls of 3D objects inside of one building. |
| 18. Cut Roof | | This tool will remove all the shared inner roof faces of 3D objects inside of one building. Refer to Table 3.1.17 |
| 19. Set Object in Fence on DTM | | This tool will set the ground foot of each building on the DTM. Note that, the DTM grid have to be loaded before this action. |

| | 2801a | 2801b | 2801c |
|---|---|---|---|
| 2848a | 3. Object Splitting | Refer Table 2.1.1 and 2 | Check if all objects are splitted by the referenced footprint, and flag the errors. |
| 2848b | 4. Duplicated Object | | Find the duplicated 3D object, remove/flag the errors. |
| 2848c | 5. Vertex Snap | | Check if Vertices inside of snap box are snapped, and flag the error. The size of snap box is defined in Table 2.1.1 |
| 2848d | 6. Wall fits Roof | | Check if top wall fits roof, and flag the errors. |
| 2848e | 7. Reorder Object Structure | One 3D object is a cell element, and it has 3 children cell elements "roof", "wall" and "bottom". "roof" cell element contains all the roof faces, and "wall" cell contains all the wall faces. Each roof/(wall) face is a shape element. | Check and correct the 3D object cell structure. |
| 2848f | 8. Object Border (Face) | | Check if 3D objects missing face and flag the errors. |
| 2848g | 9. Object Touching | | Check if all objects inside of one building touch each other, and flag the error. |
| 2848h | 10. Building Touching | | Check if buildings touch each other along the footprint |

2845

| 2801a | 2801b | 2801c |
|---|---|---|
| 11. SP on Roof | | Check if SP(SS) sets on roof faces of Basic Building. The referenced footprint will be used. |
| 12. Object Classification | | Check object type code (BB=1, FBB=2, SP(SS)=0), and flag the errors. |
| 13. Missing Tag | | Find the 3D object missing the Tag element, flag the errors, or create the missing tag. |
| 14. Check/correct Face Orien | | Check and flag the face orien. For the houses of overhang roof, it's strongly recommended to use the footprint as reference. Refer to 4.3 for details. |
| 15. Debug QA Error Marks | | Check each error marks one by one. Refer to 4.3 for details. |
| 16. QA in Batch | | Quality check by batch and create QA report. Ref the 3.3.1 for details. |

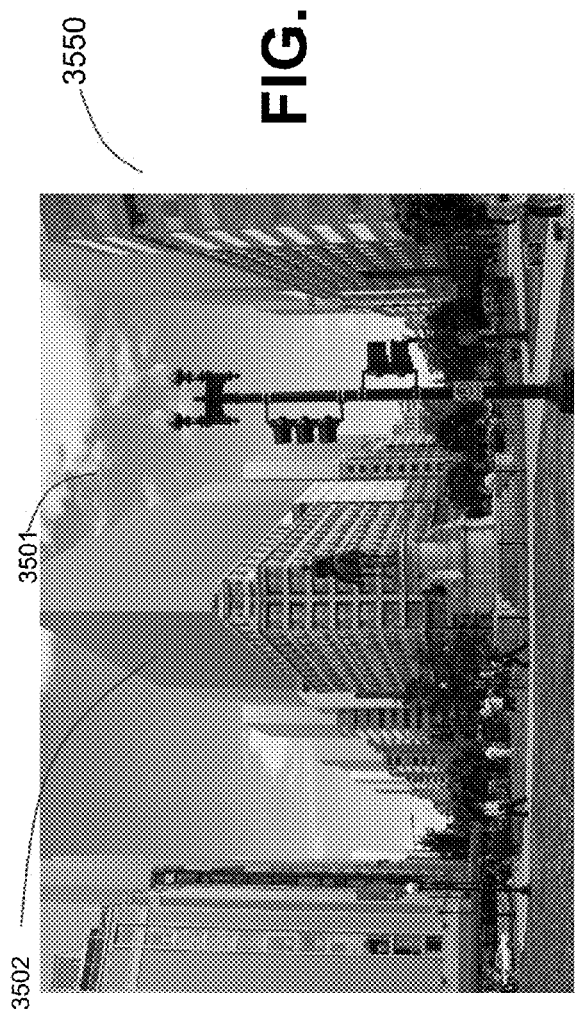
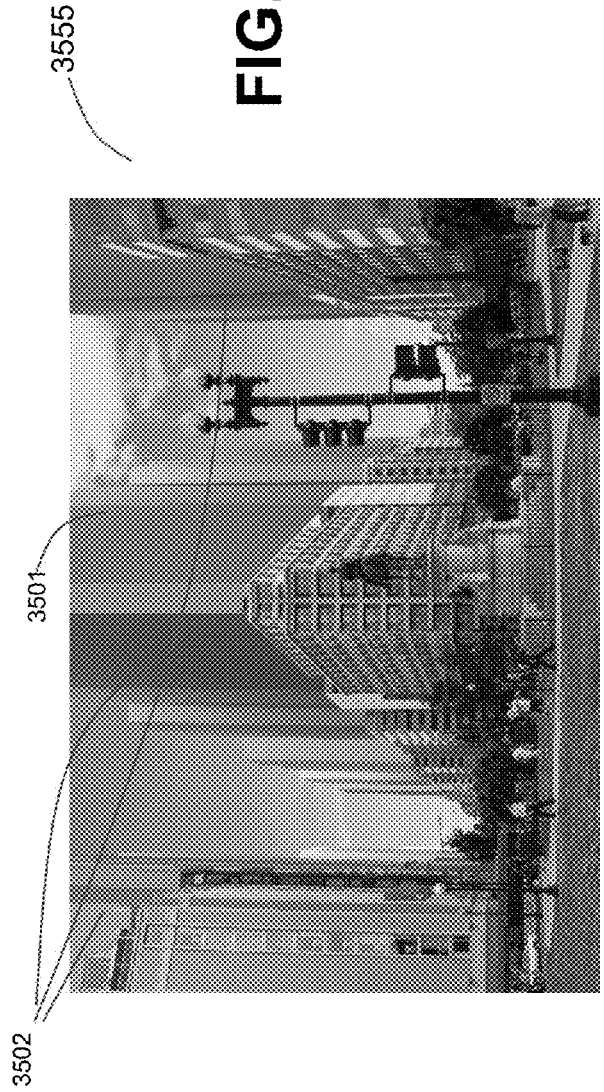

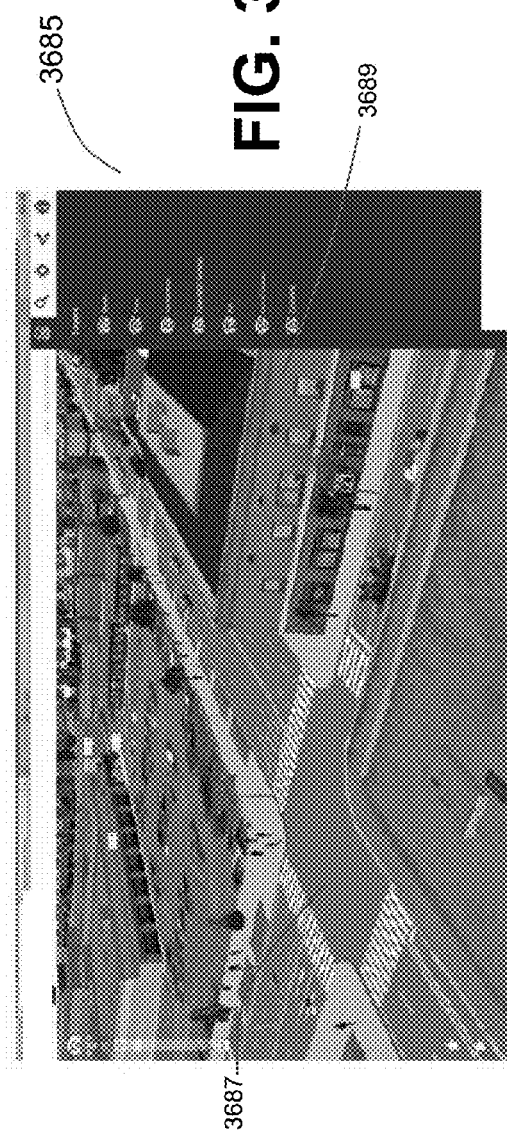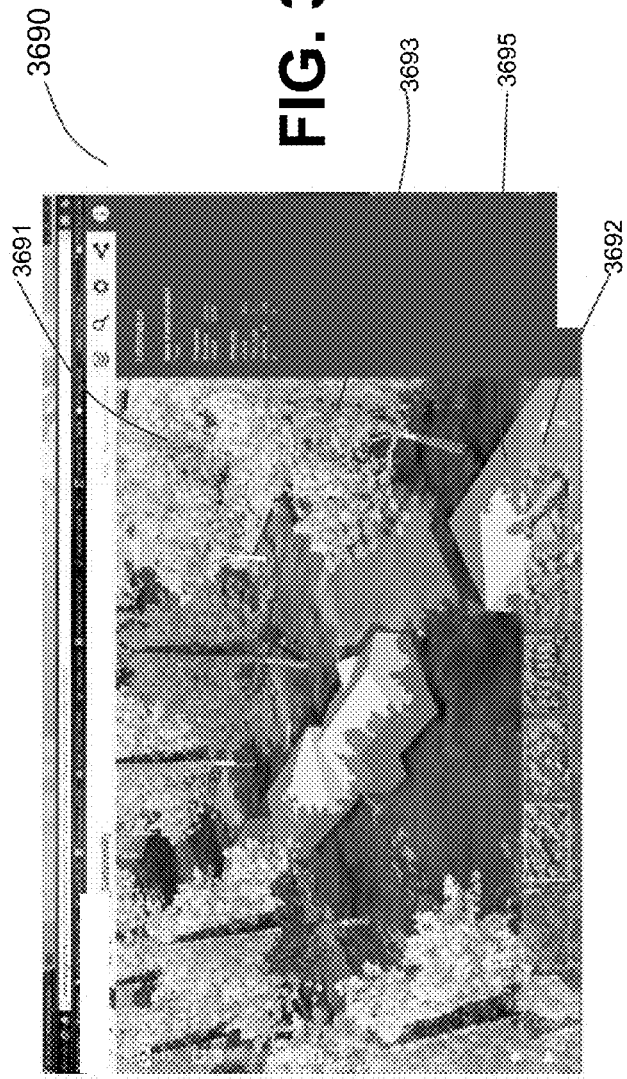

FIG. 41

COMPUTER-IMPLEMENTED SYSTEM AND METHOD FOR ROOF MODELING AND ASSET MANAGEMENT

CROSS REFERENCE TO RELATED APPLICATIONS

This application claims the benefit of filing date of U.S. Provisional Application Ser. No. 61/751,687 titled "A COMPUTER-IMPLEMENTED SYSTEM AND METHOD FOR ROOF MODELING AND ASSET MANAGEMENT", the specification of which is incorporated by reference herein in its entirety. This application also claims the benefit of filing date of U.S. Provisional Application Ser. No. 61/843,852 titled "A COMPUTER-IMPLEMENTED SYSTEM AND METHOD FOR ROOF MODELING AND ASSET MANAGEMENT", the specification of which is incorporated by reference herein in its entirety.

BACKGROUND

Remote building surveying (including building foot-print assessments, total roof geometry, and roof surface area measurements) offers an enormous potential to provide rapid, highly accurate solar energy potential, flood modeling, and stormwater run-off assessments. Systems and methods have been developed for remote building structure analysis using three dimensional geometric modeling. However, the prior-art methods generally use oblique data and images, two dimensional digitized roof data footprints, or traditional three dimensional CAD data, and generate geometric models using photogrammetry software. Using these methods, users often find that building data are required from more than one source thus adversely affecting costs. Furthermore, data manipulation and model generation often requires manual procedures, or may only be partially automated.

In response to growing environmental concerns and the need to provide a diverse energy economy, cities and municipalities are rapidly advancing programs to encourage the use of solar energy conversion to electricity. Current methods for solar radiation and photovoltaic energy potential are derived from querying and browsing GIS maps with different spatial data overlay (e.g. solar irradiation measured by local weather stations, and solar radiation models based on digital elevation models and/or raster layers). Current methods require significant volumes of overlay data, and extensive data interpolation to generate the photovoltaic potential of a roof area. The current methods also involve manual processing from remote sensing measurements shot obliquely. Moreover, well-known current methods do not enable individual home owners to determine the photovoltaic potential of their home, but only the photovoltaic potential of the surrounding area. The installation and integration of solar energy infrastructure can be costly, and often varies from roof top to roof top, thereby causing an undesirable return on investment for poorly planned installations.

Global sustainability efforts are also driving the utilization of home water collection surfaces for diversion and containment of rainwater in many cities and municipalities. Not only is the need driven by the demand for more effective management of water resources and water conservation, municipalities are realizing the need to determine tenant and owner responsibility for stormwater run-off. Management of the run-off is required in order to more effectively control local pollution of rivers, bays and coastal waters. Building data and roof area assessments can be used to more equitably and effectively implement regulations and urban drainage design.

Energy conservation efforts are driving the utilization of thermal capture images for heating or cooling energy escape assessments. There is a need for more enhanced measurement profiles related to thermal images and three dimensional roof and façade measurements. Further, energy conservation efforts are driving the utilization of new software for monitoring and optimizing energy within specific building floors. There is a need for more enhanced measurement profiles expressing information within buildings on a geospatial platform which also includes data queries and real-time monitoring. This information can be used in next generation mapping systems that can allow for greater marketing and management intelligence in government and commercial real estate property sales and management, in transaction based web maps and e-commerce sites.

Primarily driven by these emerging applications, there exists a need for systems and methods that provide more accurate, scalable, and automated building structure assessment information using stereo photographic imagery.

SUMMARY

Some embodiments of the invention comprise a computer-implemented roof area measurement system comprising a processor, and a non-transitory computer-readable storage medium in data communication with the processor, in which the non-transitory computer-readable storage medium including a rooftop modeling system executable by the processor is configured to prepare at least one three dimensional model of a physical rooftop including at least one rooftop by performing steps executable by the processor. The steps can comprise calculating at least one stereoscopic image using a first aerial image and a second aerial image of at least one physical rooftop, where the first aerial image and second aerial image include at least a 30% image overlap. The steps can further comprise calculating a point cloud from at least a portion of the at least one stereoscopic image, and generating at least one polygonal chain using at least a portion of the point cloud. The steps can comprise identifying at least one rooftop portion defined by a closed polygonal chain, and calculating a geometry and area of the at least one rooftop portion. The steps can comprise calculating a slope, and orientation to North of the at least one rooftop portion, and calculating a solar potential of the at least one rooftop portions using at least the geometry and area, slope and orientation to North of the at least one rooftop portions. The steps can also comprise displaying in a graphical user interface with the at least one three dimensional model including the at least one rooftop portions, and displaying a solar potential of at least one portion of the at least one rooftop.

In some embodiments, the computer-implemented system and method can further comprise the rooftop modeling system executable by the processor and configured to calculate a total rooftop area from the at least one rooftop portions. In some further embodiments, displaying the solar potential of at least one portion of the at least one rooftop comprises rendering the at least one rooftop portions in one or more colors correlated to the solar potential of the at least one portion of the at least one rooftop. In some other embodiments, displaying the solar potential of at least one portion of the at least one rooftop comprises rendering the at least one rooftop portions in one or more graphical patterns correlated to the solar potential of the at least one portion of the at least one rooftop.

Some embodiments of the computer-implemented system and method further comprise the rooftop modeling system executable by the processor and configured to calculate and display a rooftop solar potential using at least the total rooftop area and slope and orientation to North of the at least one rooftop portions.

In some further embodiments, the system and method further comprises the rooftop modeling system executable by the processor and configured to display a three dimensional model of at least one building comprising the at least one rooftop portion, and to display a roof data feature of the at least one building based at least in part on a user selection of the at least one rooftop portion. In some embodiments, the roof data feature comprises a display window comprising a data field including at least one of an absolute height, a relative height, a surface area total, a surface area XY, a slope min, a slope max, a roof pitch angle, a roof type, a solar azimuth, a solar surface area, a two dimensional solar area, an sP façade and an SP roof.

In some embodiments, the solar potential of at least one portion of the at least one rooftop can be designated to be a poor solar potential, a fair solar potential, a good solar potential and an excellent solar potential, a no solar potential, a low solar potential, a medium solar potential, a high solar potential, and or a highest solar potential.

In some embodiments, least one portion of the at least one rooftop is assigned a solar value. In some embodiments, the solar value comprises a numerical value, and the at least one portion of the at least one rooftop is rendered in a color assigned to the numerical value. In some other embodiments, at least one portion of the at least one rooftop is rendered with a graphical pattern assigned to the numerical value. In some further embodiments, the at least one rooftop comprises a plurality of solar values, and the rooftop is rendered in a plurality of colors based at least in part on the plurality of solar values.

Some embodiments include the system and method calculating and displaying a roof data feature comprising a display window comprising at an orientation to North, an area and a potential.

Some embodiments comprise a non-transitory computer-readable storage medium storing computer-readable instructions, which when executed by at least one processor of a computer, cause a roof area modeling system to perform steps comprising receiving and storing on a computer-readable storage medium a first file comprising using the least one processor, preparing at least one three dimensional model of a physical rooftop including at least one rooftop by performing steps executable by the processor. The steps can comprise acquiring at least a first aerial image and a second aerial image of at least one physical rooftop, in which the first aerial image and second aerial image include at least a 30% image overlap. The steps can also include calculating at least one stereoscopic image using the first aerial image and a second aerial image, and calculating a point cloud from at least a portion of the at least one stereoscopic image. The steps can also include generating at least one polygonal chain using at least a portion of the point cloud, identifying at least one rooftop portion defined by a closed polygonal chain, calculating a geometry and area of the at least one rooftop portion, and calculating a slope and orientation to North of the at least one rooftop portion. The steps can further include calculating a solar potential of the at least one rooftop portions using at least the geometry and area, slope, and orientation to North of the at least one rooftop portions, and displaying in a graphical user interface the at the least one three dimensional model including the at least one rooftop portions, and displaying a solar potential of at least one portion of the at least one rooftop.

Some embodiments comprise a non-transitory computer-readable storage medium storing computer-readable instructions, which when executed by at least one processor of a computer, cause a roof area modeling system to perform steps comprising receiving and storing on a computer-readable storage medium a first file comprising using the least one processor, preparing at least one three dimensional model including at least one rooftop by performing steps executable by the processor including calculating a total rooftop area from the at least one rooftop portions, and displaying the solar potential of at least one portion of the at least one rooftop by rendering the at least one rooftop portions in one or more colors correlated to the solar potential of the at least one portion of the at least one rooftop.

Some embodiments of the invention include a computer-implemented roof runoff measurement system comprising a processor, a non-transitory computer-readable storage medium in data communication with the processor including a rooftop modeling system executable by the processor, and configured to prepare at least one three dimensional model of at least one physical roof including at least one rooftop by performing steps executable by the processor. The steps can include calculating at least one stereoscopic image using a first aerial image and a second aerial image of at least one physical roof that include at least a 30% image overlap, calculating a point cloud from at least a portion of the at least one stereoscopic image, and generating at least one polygonal chain using at least a portion of the point cloud. The steps can further include identifying at least one rooftop portion defined by a closed polygonal chain, calculating a geometry and area of the at least one rooftop portion, and calculating a slope of the at least one rooftop portion. The steps can also include calculating a rainwater runoff potential of the at least one rooftop portions using at least the geometry and area, slope of the at least one rooftop portions, and displaying in a graphical user interface the at the least one three dimensional model including the at least one rooftop portions, and displaying a rainwater runoff potential of at least one portion of the at least one rooftop.

In some embodiments, the runoff potential is calculated based at least in part on a flow of rainwater per unit width of the at least one rooftop portion which is calculated using the expression:

$$q = \frac{iL}{\sqrt{1+S_0^2}}$$

where i is the rainfall intensity falling on the at least one rooftop portion with a longitudinal slope of So and length L.

In some embodiments, the runoff potential is calculated based at least in part on a time for a water droplet to travel from a top of the at least one roof portion to the bottom of the at least one roof portion based on a water droplet velocity calculated using the expression:

$$V = \frac{1.49}{n} y^{2/3} S_0^{1/2}$$

where n equals a roughness coefficient of the surface of the at least one rooftop portion and y is the depth of flow of rainwater runoff.

DESCRIPTION OF THE DRAWINGS

FIGS. 7A-7B illustrates a building geometry refinement and editing procedure generated by the computer-implemented system and method according to one embodiment of the invention.

FIG. 9 illustrates a GUI of a summary of building geometry measurement data generated by the computer-implemented system and method according to one embodiment of the invention.

FIG. 14 provides a listing of the data measurement listing produced using the computer-implemented system and method according to one embodiment of the invention.

FIG. 28A is an example of the three-dimensional modeling tools of one embodiment of the computer-implemented system and method.

FIG. 28B-E is an example of the three-dimensional editing tools of one embodiment of the computer-implemented system and method.

FIG. 28F-H is an example of the three-dimensional integration tools of one embodiment of the computer-implemented system and method.

FIG. 28I-K is an example of the three-dimensional QC tools of one embodiment of the computer-implemented system and method.

FIG. 28L is an example of the batch processing tools of one embodiment of the computer-implemented system and method.

FIGS. 35A-L illustrate renderings of examples of three dimensional visualization models of various building heights as calculated according to one embodiment of the computer-implemented system and method.

FIG. 36E illustrates one example of three dimensional augmented reality rendering of buildings according to one embodiment of the computer-implemented system and method.

FIG. 36F illustrates one example of three dimensional augmented reality rendering of buildings with real-time shading according to one embodiment of the computer-implemented system and method.

FIG. 41 illustrates one example of a comma-separated values file portion of a collada file according to at least one embodiment of the invention.

DETAILED DESCRIPTION

Figure 1A:
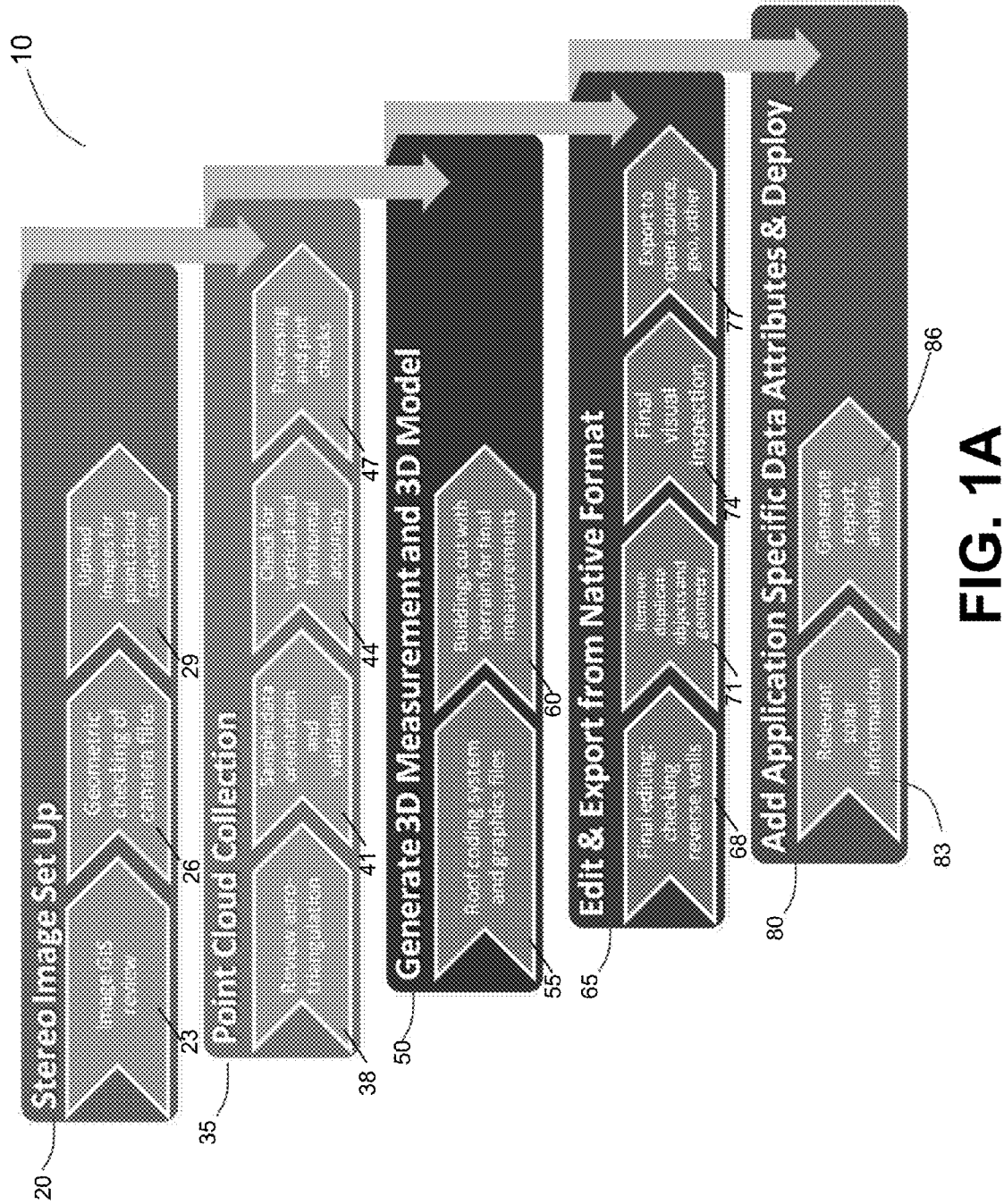
FIG. 1A illustrates a computer-implemented three dimensional model processing and generation system and method 10 summary work flow according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives that fall within the scope of embodiments of the invention.

Some embodiments of the invention include a computer-implemented system and method 10 for calculating and displaying roof area measurement data for at least one building or structure. For the purposes of describing the invention as disclosed, a roof can be described as the covering of at least part of the uppermost portion of a building or structure. In general, the characteristics of a roof are dependent upon the purpose of the building that it covers.

In some embodiments, one or more parameters generated by one or more modules of the computer-implemented system and method 10 can be used for solar energy evaluation. For example, in some embodiments, the computer-implemented system and method 10 can assign a solar resource to one or more rooftop areas of a building or structure. In order to fully assess any rooftop surface as a solar resource, the size of the roof surface, and the pitch angle of the roof requires calculation. In many instances, roofs can have one or more complex geometries, and therefore each roof segment or surface polygon needs to be calculated. Moreover, the relationship of a particular roof's orientation to the horizon is also important in understanding solar exposure. The determination of roof geometry, area and orientation facilitates the calculation of the solar potential of a particular roof polygon. The key parameters that are required to establish the solar energy potential (and therefore the financial and installation economics) include the size of the roof surface (for solar panel installation), the pitch angle of the roof (calculating each roof surface or polygon), and the orientation to south (the azimuth of the roof or roof polygon).

FIG. 1A illustrates a computer-implemented three dimensional model processing and generation system and method 10 summary work flow according to one embodiment of the invention. As an example, the system and method 10 summary work flow can be illustrated as comprising a plurality of process modules 20, 35, 50, 65, and 80, each comprising one or more main tasks (each comprising one or more actions by the user 195 and/or one or more actions by the system and method processed by the system architecture 180).

In some embodiments, the system and method 10 can comprise a stereo image set up process module 20 that can enable acquisition, image data review, and delivery of images for subsequent analysis and processing by the system and method 10. In some embodiments, one or more components of the computer system and method 10 can use automated photogrammetric techniques in combination with stereo aerial images, including aerial satellite imagery and/or multiple remote-sensing sources, including, but not limited to satellite images, aerial images, oblique and LiDAR imagery. Some embodiments of the computer-implemented system and methods 10 as depicted in FIGS. 1-9 and 13-35, and described throughout, include automated measurement systems that utilize mass-produced building images that are readily available (including from those described above). For example, as depicted in FIG. 1A, the "process module" 20 can include a plurality of main tasks including image GIS review 23, and geometric checking of camera files 26. In some embodiments, the "process module" 20 can conclude by progressing to a "point cloud collection" module 35 with image upload 29 for point cloud analysis. The "point cloud collection" module 35 can include a plurality of main tasks including review of aero-triangulation 38, and sample data orientation and validation 41. Although depicted as sequential main tasks, the system and method 10 can also include one or more main tasks that can be processed in parallel. Furthermore, in some embodiments, the system and method 10 can include other main tasks in addition to those shown and/or can include one or more main tasks that are processed in a different order to that depicted in FIG. 1A. In some embodiments, the module 35 can include proceeding with a check for vertical and horizontal accuracy 44 task, followed by processing and plot checks 47 tasks. Following the module 35, the system and method 10 can proceed to the "generate 3D measurement and three dimensional model" module 50. This module can include a roof coding system and graphic files 55, and buildings cut with terrain for final measurements 60 main tasks. In some embodiments, following conclusion of the modules 20, 35, 50, the system and method 10 can comprise an "edit and export to native format" module 65. The "edit and export to native format" module 65 can include a plurality of tasks including final editing: checking reverse walls 68, remove duplicate objects and geometry 71, final visual inspection 74, and concluding with export to open source, geo, other 77. Following data file processing using the "edit and export to native format" module 65, the system and method 10 can comprise an "add application specific data attributes and deploy" module 80 with main tasks comprising a relevant solar information 83 and a generate report and analysis 86. Although depicted as sequential process modules 20, 35, 50, 65, 80, the system and method 10 can also include one or more process modules 20, 35, 50, 65, 80 that can be processed in parallel. Furthermore, in some embodiments, the system and method 10 can include other process modules in addition to those shown and/or can include one or more process modules that are processed in a different order to that depicted in FIG. 1A.

Figure 1B:
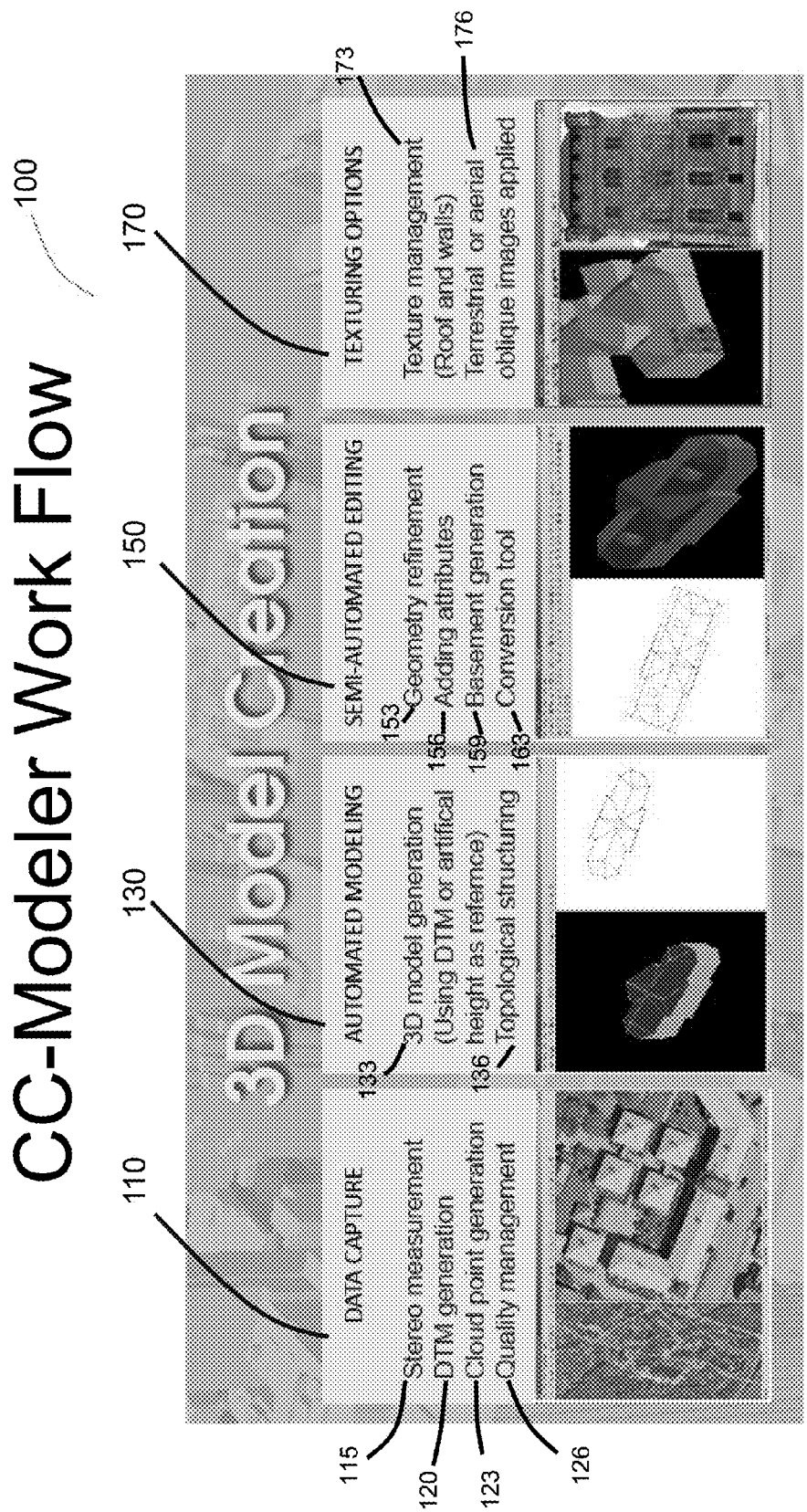
FIG. 1B illustrates a sub-task summary of the computer-implemented system and method for three dimensional model processing and generation system and method of FIG. 1A according to one embodiment of the invention.

In some embodiments, one or more of the processes defined by the process modules 20, 35, 50, 65, 80 of the system and method 10 can include or comprise one or more sub-tasks capable of creating one or more three dimensional models. The sub-tasks can comprise one or more actions by the user 195, and/or one or more actions by the system and method (e.g., following processing by the system architecture 180). For example, in some embodiments, the system and method 10 can include sub-tasks comprising data capture 110, automated modeling 130, semi-automated modeling sub-tasks 150, and texturing options 170 (e.g., see FIG. 1B illustrating a sub-task summary 100 for the computer-implemented three dimensional model processing and generation system and method 10 of FIG. 1A according to one embodiment of the invention).

In some embodiments, the data capture 110 sub-tasks can include stereo measurement 115 (e.g., stereo image capture and processing), digital terrain model (hereinafter "DTM") 120, point cloud generation 123, and quality management 126. Photogrammetry enables the determination of geometric parameters of objects from photographic images. In some embodiments, one or more components of the computer system and method 10 can use automated photogrammetric techniques in combination with stereo aerial images, including aerial satellite imagery and/or multiple remote-sensing sources, including, but not limited to satellite images, aerial images, oblique and LiDAR imagery. In some embodiments, one or more components of the computer system and method 10 can use automated photogrammetric techniques in combination with stereo aerial images 210, 220 with a minimum of 30% overlap including aerial satellite imagery. In some embodiments, stereo images 210, 220 with 30% or more overlap can be processed from multiple remote-sensing sources, including, but not limited to, satellite images, aerial images, oblique and LiDAR imagery. Some embodiments perform analysis of imagery using point cloud generation. In some embodiments, one or more DTM's can be generated from one or more images.

In some embodiments, the automated modeling 130 sub-tasks can include three dimensional model generation 133, and/or topological structuring 136 In some embodiments, DTM or an artificial height reference can be used to generate a three dimensional model. In some embodiments, the automated modeling 130 sub-tasks can utilized topological structuring to generate at least one three dimensional image.

In some further embodiments, the semi-automated editing sub-tasks 150 can include one or more sub-tasks for editing three dimensional models created using sub-tasks 110, 130. In some embodiments, one or more of the semi-automated editing sub-tasks 150 can include tools for geometric refinement, geometric module attribute tagging, basement generation and other conversion tools. For example, in some embodiments, the semi-automated editing sub-tasks 150 can include geometry refinement 153, adding attributes 156, basement generation 159, and a conversion tool 163.

In some embodiments, three dimensional models can be rendered using one or more texturing options using the texturing options sub-task 170. In some embodiments, one or more modules of the computer-implemented system and method 10 can include extensive texturing options, including texture management of various model surfaces. For example, in some embodiments, the texturing options 170 can include a texture management 173 and terrestrial or aerial oblique images applied 176. In some embodiments, one or more textures can be applied to roofs, walls, or other surfaces of a model, and in some further embodiments, terrestrial or aerial oblique images can be used as the basis of a texture and applied to one or more surfaces.

Figure 1C:
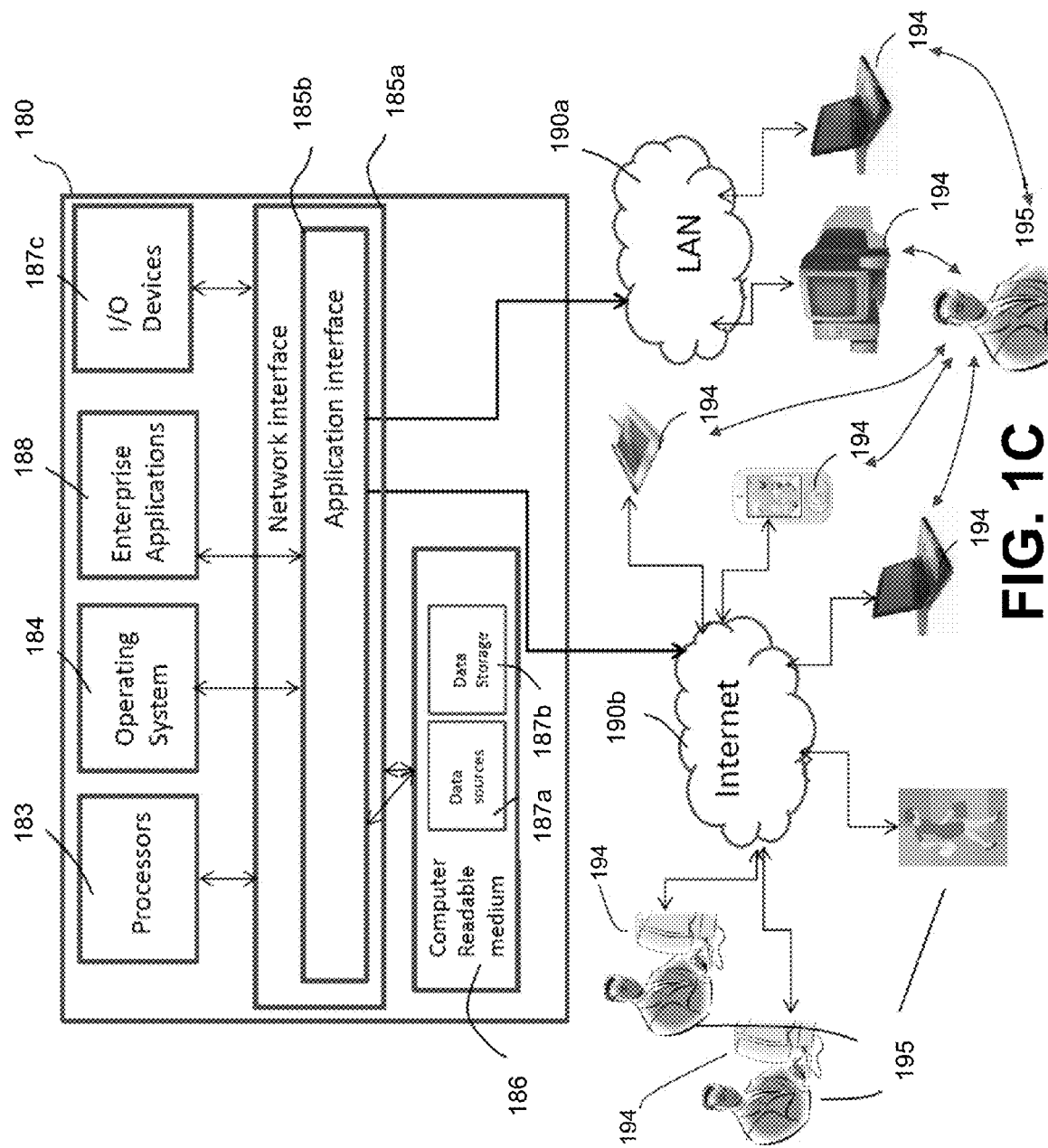
FIG. 1C shows one example of a system architecture implementation useful for performing one or more of the computer-implemented methods described herein according to at least one embodiment of the invention.

Some embodiments of the invention also relate to a device or an apparatus for performing the computer-implemented methods described herein. The apparatus can be specially constructed for the required purpose, such as a special purpose computer. FIG. 1C shows one example of a system architecture 180 implementation useful for performing one or more of the computer-implemented methods according to at least one embodiment of the invention. As shown, the system 180 can include at least one computing device, including at least one or more processors 182. Some processors 182 can include processors 182 residing in one or more conventional server platforms. In some embodiments, the system architecture 180 can include a network interface 185a, and an application interface 185b coupled to at least one processor 182 capable of running at least one operating system 184. Further, the system architecture 180 can include a network interface 185a, and an application interface 185b coupled to at least one processor 182 capable of running one or more of the software modules (e.g., enterprise applications 188). In some embodiments, the software modules 188 can include a server-based software platform that can include numerous other software modules suitable for hosting at least one account and at least one client account, as well as transferring data between one or more accounts. When defined as a special purpose computer, the computer can also perform other processing, program execution or routines that are not part of the special purpose, while still being capable of operating for the special purpose. Alternatively, the operations can be processed by a general purpose computer selectively activated or configured by one or more computer programs stored in the computer memory, cache, or obtained over a network. When data are obtained over a network the data can be processed by other computers on the network, e.g. a cloud of computing resources.

With the above embodiments in mind, it should be understood that the invention can employ various computer-implemented operations involving data stored in computer systems. Moreover, the above-described databases and models throughout the system 10 can store analytical models and other data on computer-readable storage media 186. In addition, the above-described applications of the monitoring system 10 can be stored on computer-readable storage media 186. These operations are those requiring physical manipulation of physical quantities. Usually, though not necessarily, these quantities take the form of electrical, electromagnetic, or magnetic signals, optical or magneto-optical form capable of being stored, transferred, combined, compared and otherwise manipulated.

In some embodiments, the system architecture 180 can include at least one computer readable medium 186 coupled to at least one data storage device 187b, at least one data source 187a, and at least one input/output device 187c. In some embodiments, the invention can also be embodied as computer readable code on a computer readable medium 186. The computer readable medium 186 can be any data storage device that can store data, which can thereafter be read by a computer system. Examples of the computer readable medium 186 can include hard drives, network attached storage (NAS), read-only memory, random-access memory, FLASH based memory, CD-ROMs, CD-Rs, CD-RWs, DVDs, magnetic tapes, other optical and non-optical data storage devices, or any other physical or material medium which can be used to tangibly store the desired information or data or instructions and which can be accessed by a computer or processor.

In some embodiments, the computer readable medium 186 can be distributed over a conventional computer network via the network interface 185a so that the computer readable code can be stored and executed in a distributed fashion. For example, in some embodiments, one or more components of the system architecture 180 can be tethered to send and/or receive data through a local area network ("LAN") 190a. In some further embodiments, one or more components of the system architecture 180 can be tethered to send or receive data through an internet 190b (e.g., a wireless internet). In some embodiments, at least one software application 188 running on at least one processor 182 can be configured to be coupled for communication over a network 190a, 190b.

In some embodiments, one or more components of the network 190a, 190b can include one or more resources for data storage, including any other form of computer readable media beyond the media 36 for storing information and including any form of computer readable media for communicating information from one electronic device to another electronic device. Also, in some embodiments, the network 190a, 190b can include wide area networks ("WAN"), direct connections (e.g., through a universal serial bus port) or other forms of computer-readable media 186, or any combination thereof. Also, various other forms of computer-readable media 186 can transmit or carry instructions to a client device 194, including a router, private or public network, or other transmission device or channel, both wired and wireless. The software modules 188 can be configured to send and receive data from a database (e.g., from a computer readable medium 186 including data sources 187a and data storage 187b that can comprise a database), and data can be received by the software modules 188 from at least one other source. In some embodiments, at least one of the software modules 188 can be configured within the system to output data to a user via at least one digital display (e.g., to at least one client device 194 comprising a digital display).

In some embodiments, one or more components of the network 190*a*, 190*b* can include a number of client devices 194 which can be personal computers including for example desktop computers, laptop computers, digital assistants, personal digital assistants, cellular phones, mobile phones, smart phones, pagers, digital tablets, internet appliances, and other processor-based devices. In general, a client device can be any type of external or internal devices such as a mouse, a CD-ROM, DVD, a keyboard, a display, or other input or output devices 187*c*.

In some embodiments, the system architecture 180 as described can enable one or more users 195 to receive, analyze, input, modify, create and send data to and from the system architecture 180, including to and from one or more enterprise applications 188 running on the system architecture 180. Some embodiments include at least one user 195 accessing one or more modules 10, including at least one enterprise applications 188 via a stationary I/O device 187*c* through a LAN 190*a*. In some other embodiments, the system architecture 30 can enable at least one user 195 accessing enterprise applications 188 via a stationary or mobile I/O device 187*c* through an internet 190*a*. Moreover, in some embodiments, one or more users 195 can access, interact, and view data calculated by the system and method 10 using one or more client devices 194 (e.g., as depicted by the two-way arrows shown in FIG. 1B).

Figure 2:
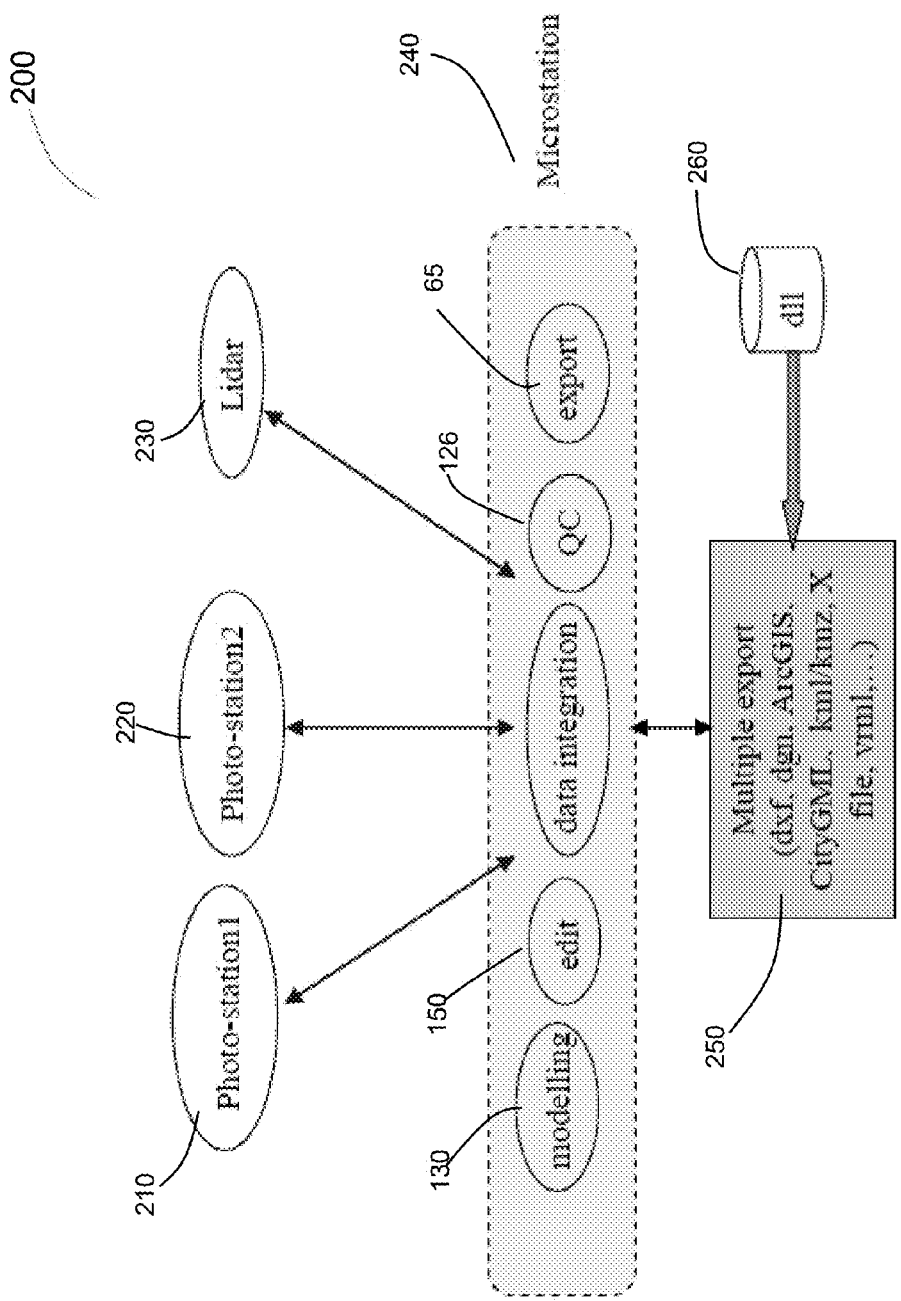
FIG. 2 is a system overview depicting the relationship between data input, processing and output across various functional units of the computer-implemented system and method according to one embodiment of the invention.

FIG. 2 is a system overview 200 depicting the relationship between data input, processing and output across various functional units of the computer-implemented system and method 10 according to one embodiment of the invention. As described above, in some embodiments of the invention, the system and method 10 can use and process images, including stereo aerial images, aerial satellite imagery, oblique and LiDAR imagery. In some embodiments, one or more images can be processed by one or more of the process modules 20, 35, 50, 65, 80, including any one or more of the sub-tasks 110, 130,150, 170. In some embodiments, this can follow data capture in a photogrammetry station including a first aerial image 210 and a second aerial image 220. Some embodiments can use LiDAR software 230 for data capture. In some embodiments, one or more modules 20, 35, 50, 65, 80 can be dedicated to quality control and linked to a dedicated export module 250. Some embodiments of the export module 250 can export one or more data files, including, but not limited to dxf format, dgn format, ArcGIS format, CityGML format, kml/kmz format, X-file format, a vrml format, and an IMX format.

In some embodiments, the seamless flow of data across one or more of the modules as described can be supported in a Microstation® platform 240. Microstation® is a trademark of Bentley Systems, Incorporated. In some embodiments, capture data (e.g. roof features) can be entered into Microstation® platform 240 as line springs or polygons. Using these methods, the system and method 10 can directly process captured images from virtually any photogrammetric system or data source.

Figure 3A:
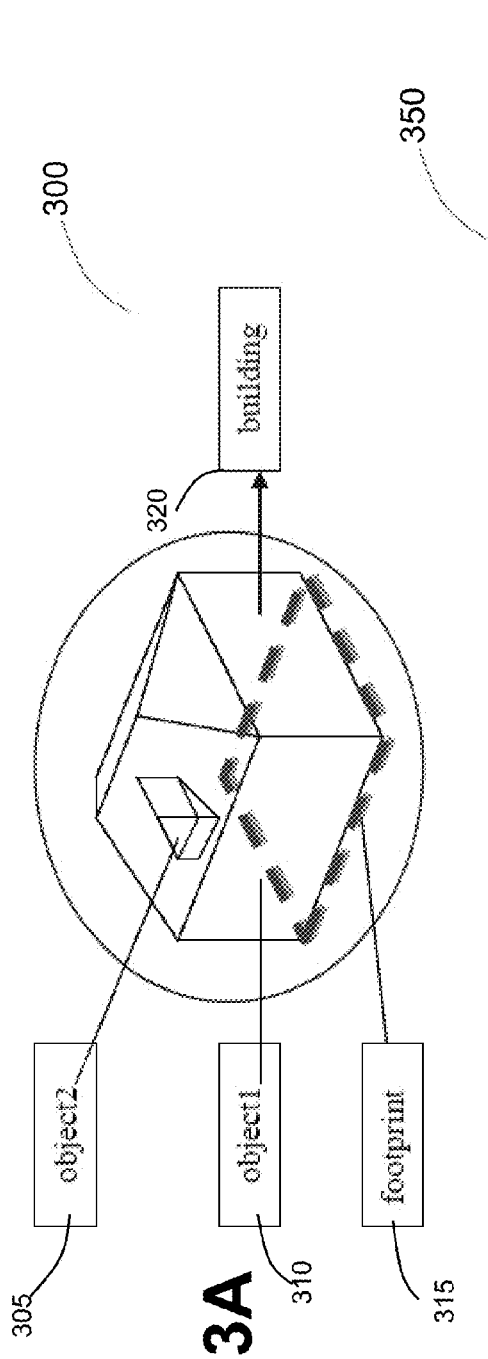
FIG. 3A illustrates of an example of a building object layout according to one embodiment of the invention.
Figure 3B:
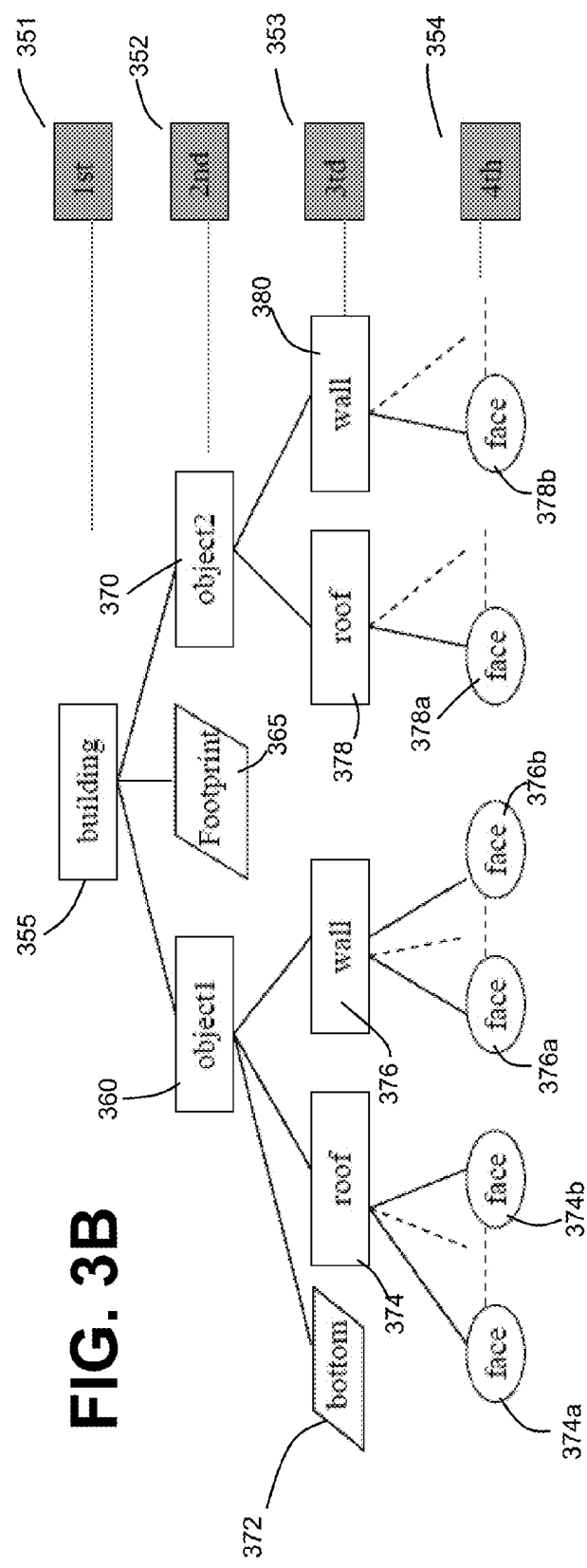
FIG. 3B illustrates an overview of an object layer hierarchy according to one embodiment of the invention.
Figure 3C:
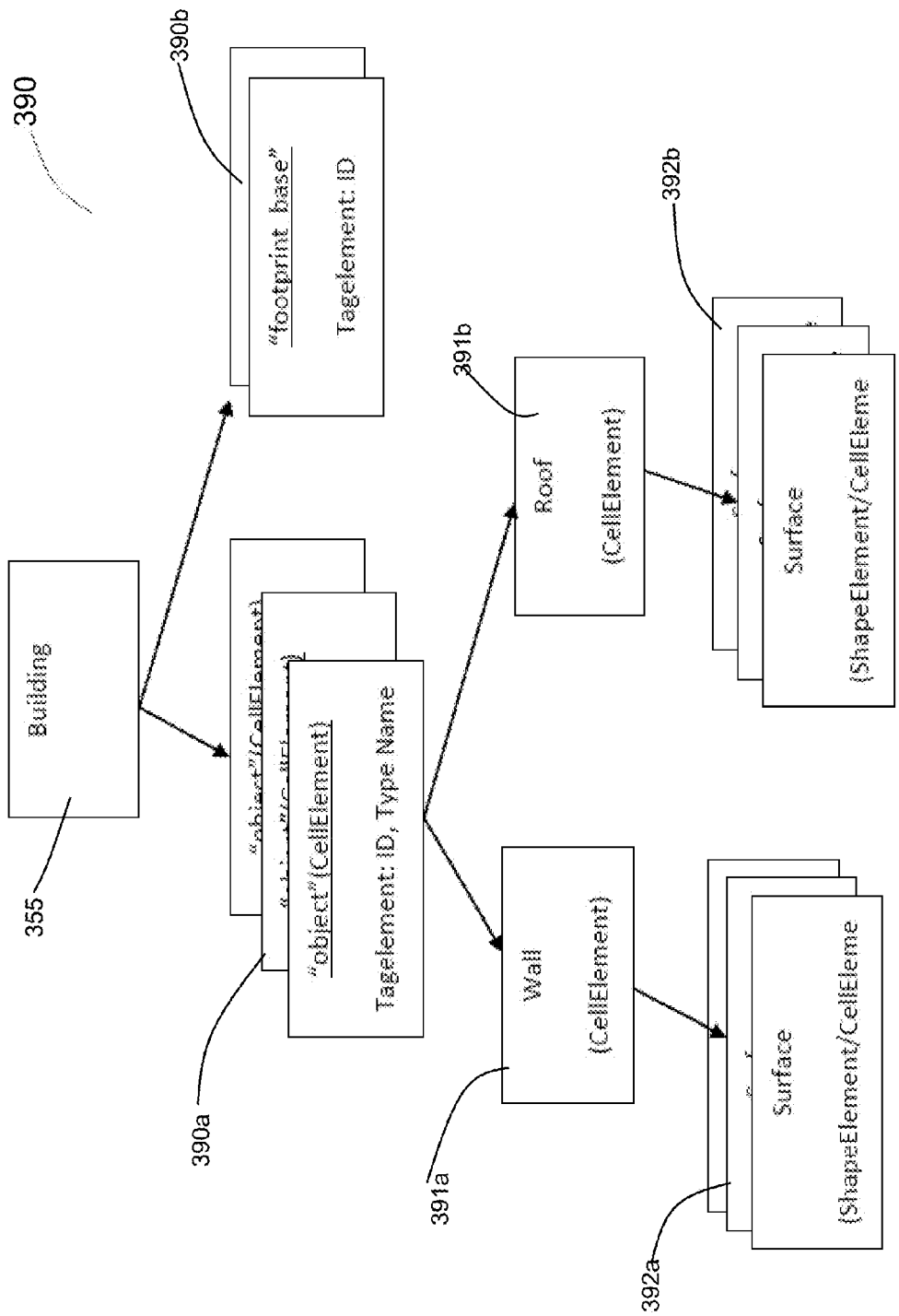
FIG. 3C illustrates a logical structure layout of a building according to one embodiment of the computer-implemented system and method implemented in Microstation®.

In some embodiments, the system and method 10 can be configured by a user 195 to build and render at least one three dimensional building or structure comprising at least one object. For example, FIG. 3A illustrates an example of a building object layout 300 according to one embodiment of the invention. In some embodiments, the method and system 10 includes a data structure, where an entity such as a building structure 320 (such as a building, a bridge, a church, hospital, a factory, an apartment complex, or other structure) can comprise a plurality of geometric objects. In some embodiments, one or more of the geometric objects 305, 310 can be assigned a tag set that includes one or more attributes such as the same ID number, footprint 315, object name, roof type, etc. In some embodiments, each object 305, 310, 315 can comprise one or more cells. In some embodiments, the cells can include a roof cell, a wall cell, a bottom cell, etc. Some other embodiments can include different cells types depending on the architectural features of the building. In some embodiments, each geometric cell is composed of faces. For example, FIG. 3B illustrates an overview of an object layer hierarchy 350 of the building and object layout 300 as depicted in FIG. 3A, according to one embodiment of the invention. As shown, the hierarchy 350 is illustrated in a series of layers 351, 352, 353, 354, the first layer 351 being the building 355, which comprises two objects 360, 370 and a footprint 365 shown in the second layer 352 of the hierarchy. The third layer 35 is the surface (e.g. the roof cell 374, 378, wall cell 376, 380 and bottom cell 372), and the fourth layer 354 comprises faces of the cells of the objects, which in this example shows faces 374*a*, 374*b* of the roof 374 of object 360, and faces 376*a*, 376*b* of the wall 376 of object 360. The fourth layer 354 also shows face 378*a* of roof 378 of object 370, as well as face 378*b* of wall 380 of object 370. Further, in some embodiments, the system and method 10 can generate a three dimensional model based on a data object layer hierarchy of a building or structure. For example, FIG. 3C illustrates a logical structure layout 390 of a building 355 according to one embodiment of the computer-implemented system and method 10 (implemented for example in a Microstation® platform 240). In some embodiments, the logical structure layout 390 comprising a building 355 can include a hierarchical structure can comprise at least one object 390*a*, and footprint 390*b*. In some embodiments, the object 390*a* can comprise a layer hierarchy with at least one wall 391*a*, and at least one roof 391*b*. Further, the at least one wall 391*a* can include a hierarchy with at least one surface 392*a*, and a hierarchy with at least one roof 391*b* that can include a hierarchy with at least one surface 392*b*.

Figure 4:
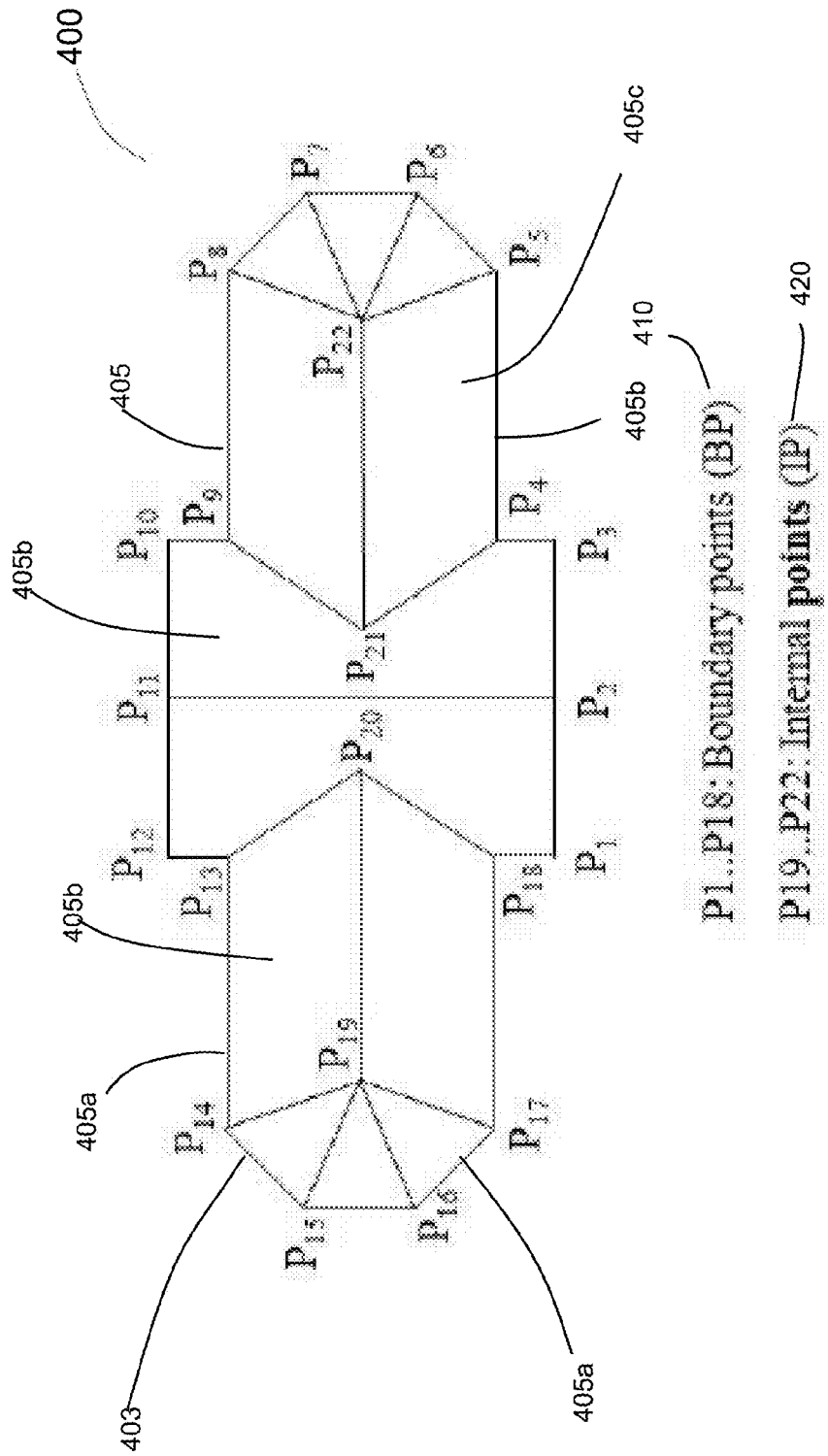
FIG. 4 illustrates an example of a point cloud geometry generated by the computer-implemented system and method according to one embodiment of the invention.

As discussed earlier, in some embodiments, the system and method 10 can include process module 35 including a data capture 110 sub-task that can include point cloud generation 123. In some embodiments, the system and method 10 can process stereo aerial photographs (e.g., using the process module 20) to generate a point-cloud field, and some embodiments of the computer-implemented system and method 10 can process the point-cloud field to generate a three dimensional rooftop model. For example, FIG. 4 illustrates an example of a point-cloud field 400 generated by the computer-implemented system and method 10 according to one embodiment of the invention. In some embodiments, a point cloud geometric object 405 can be defined using a series of polylines 403 forming at least one polygonal chain (where at least one is labeled 405*a* in FIG. 4), and polygons formed by a closed polygonal chain 405*b* (where at least one is labeled 405*c* in FIG. 4) derived from the point-cloud field 400, and defined with a set of internal points 420 and boundary points 410.

Figure 5:
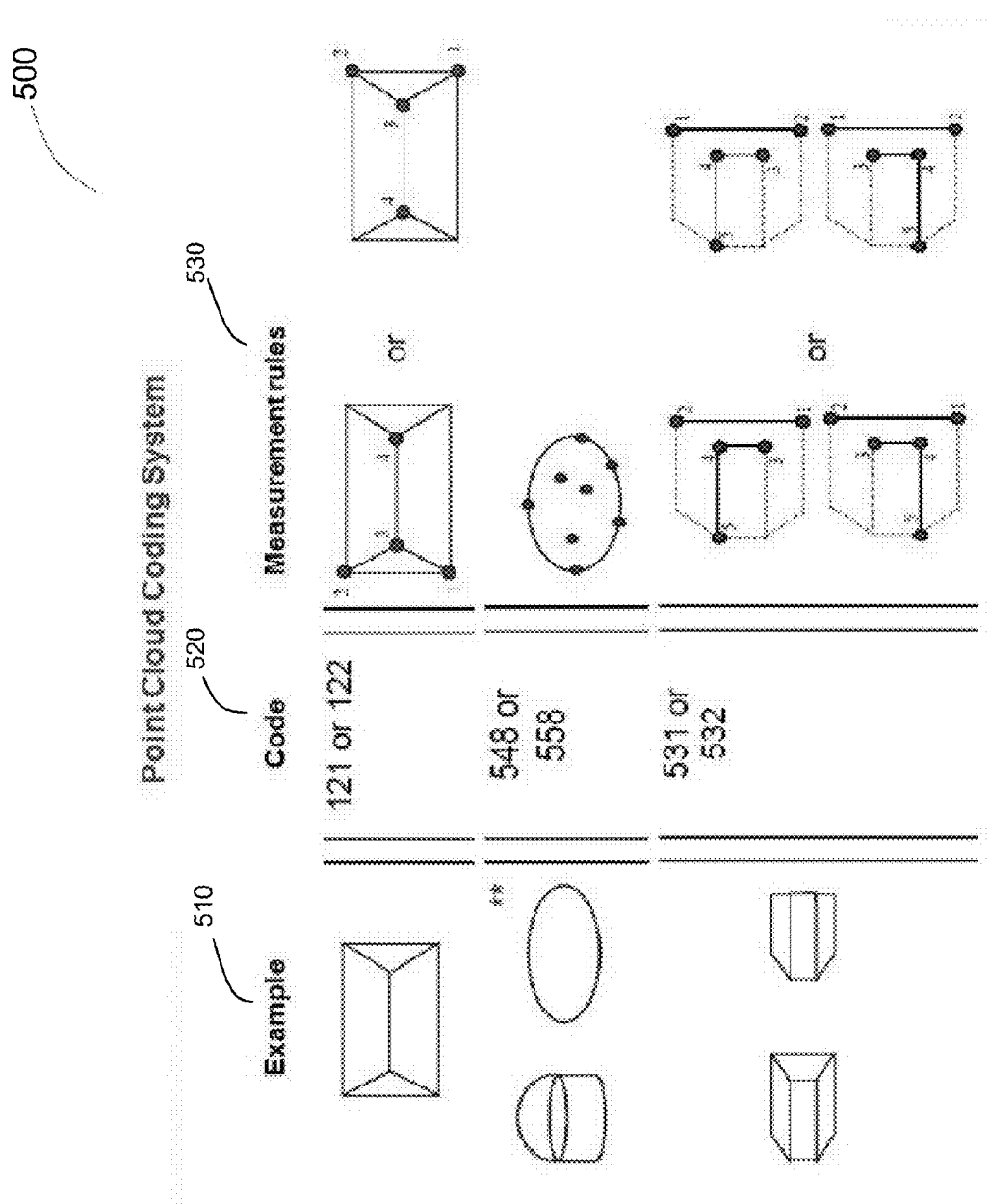
FIG. 5 illustrates a point cloud geometry coding system generated by the computer-implemented system and method according to one embodiment of the invention.

Some embodiments of the system and method 10 enable conversion of the point cloud geometric object 405 to one or more three dimensional polygon faces. In some embodiments, various structural and/or architectural features can be defined and differentiated. For example, in some embodiments, various roof objects such as dormers and chimneys can be defined and coded. Furthermore, in some embodiments, walls and other features between objects can be generated automatically. FIG. 5 illustrates a point cloud geometry coding system 500 generated by the computer-implemented system and method according to one embodiment of the invention. In some embodiments, various structural and/or architectural features can be defined and differentiated. For example, in some embodiments, various roof objects such as dormers and chimneys 510 can be defined and assigned a code 520. In some embodiments, the coding system can include assignment of one or more measurement rules 530.

Figure 6:
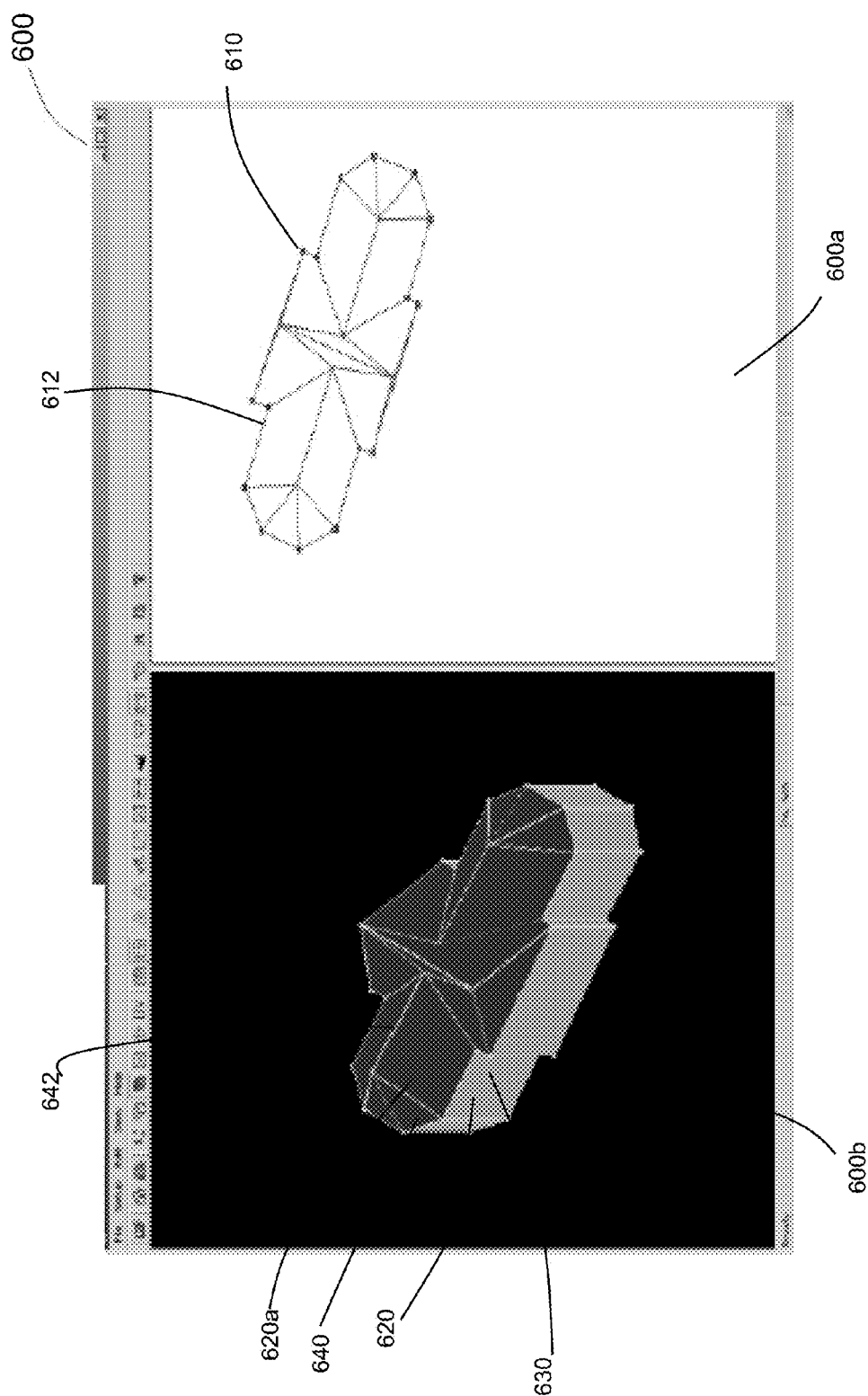
FIG. 6 depicts a GUI showing a point cloud to three dimensional polygon conversion using the computer-implemented system and method according to one embodiment of the invention.

In some embodiments, the system and method 10 can display information using at least one graphical user interface (hereinafter referred to as "GUI"). The GUI can comprise one or more windows capable of displaying image data in textural or graphical format, and may include one or more icons enabling a user 195 to control one or more functions of the system and method 10. FIG. 6 for example depicts a GUI 600 showing a representation of a point cloud 610 in a window portion 600a with a conversion to a three dimensional polygon 620 using one embodiment of the computer-implemented system and method 10. As illustrated, some embodiments convert one or more point clouds 610 comprising one or more polygonal chains 612 to one or more three dimensional polygon faces of a three dimensional polygon 620 displayed in a window portion 600b. For example, as shown, the three dimensional polygon 620 can comprise a building 630 including a rooftop 640 comprising one or more closed polygonal lines 642 forming at least one rooftop portion 620a of the rooftop 640.

In some embodiments, one or modules of the method and system 10 can include one or more editing features. For example, as described earlier, the system and method 10 can include a process module 65 which can include the semi-automated editing sub-tasks 150 comprising one or more sub-tasks for editing three dimensional models created using sub-tasks 110, 130. For example, in some embodiments, gaps and overlays between one or more vertices of a geometric object can be corrected. FIGS. 7A-7B illustrates a building geometry refinement and editing procedure generated by the computer-implemented system and method 10 according to one embodiment of the invention. As shown, a grid function can assist in the correction or refinement of rectangularity, connectivity, planarity and parallelism providing an overall improvement in the geometry of an object. Specifically, FIG. 7A shows a building structure overlay 700, showing improvement in geometry achievable using a grid function to check for rectangularity, paralleling lines, and connectivity, and FIG. 7B shows a transformation 750 from the original structure 755, through an intermediate grid overlay 760, to a refined geometry structure 765.

Figure 8:
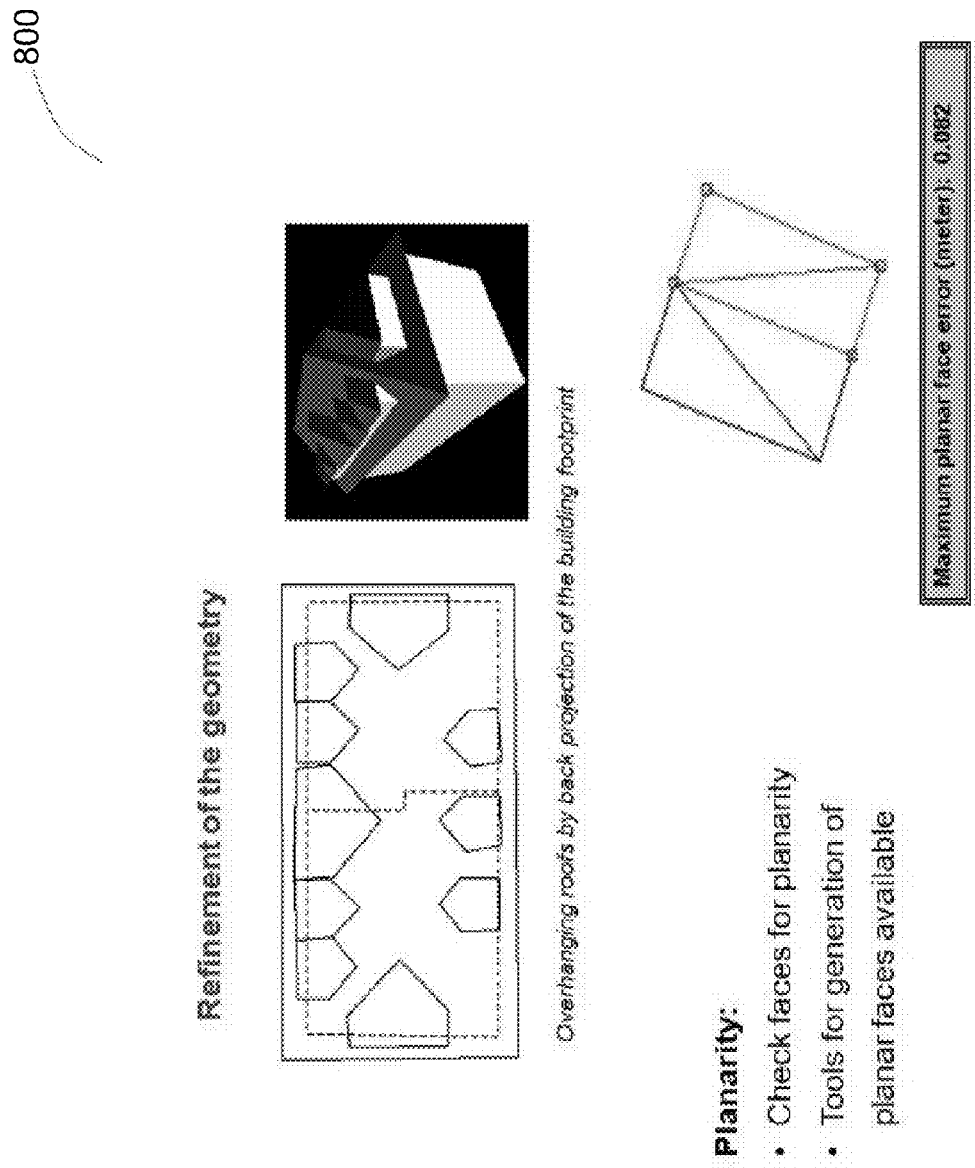
FIG. 8 illustrates a building geometry refinement and editing procedure generated by the computer-implemented system and method according to one embodiment of the invention.

Some embodiments can include editing and refinement of complex roof-lines, and polygon face refinement. For example, FIG. 8 illustrates a building geometry refinement and editing procedure 800 generated by the computer-implemented system and method 10 according to one embodiment of the invention. In some embodiments, the editing procedure 800 can include a refinement of geometry of overhanging roofs by back projection of the building footprint. Some embodiments also can include checking faces for planarity (e.g., faces 374a, 374b of the roof 374 of object 360, and faces 376a, 376b), and calculation of maximum planar face error.

Figure 9:
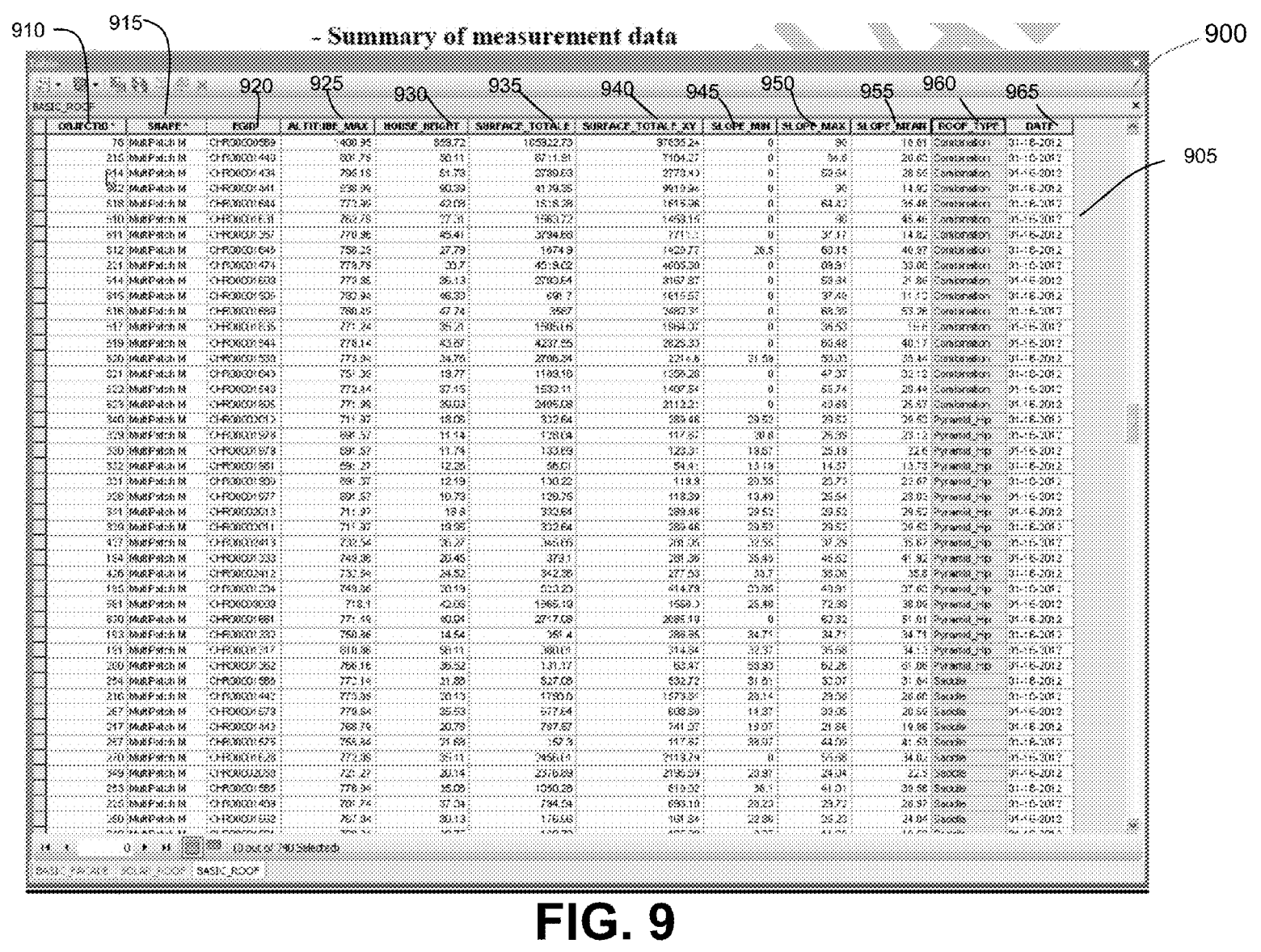

FIG. 9 illustrates a GUI 900 summary of building geometry measurement data generated by the computer-implemented system and method 10 according to one embodiment of the invention. In some embodiments, one or more modules of the system and method 10 can export measurement data in one or more spreadsheets 905 for review, analysis, and/or manual editing. For example, as illustrated in FIG. 2, the system and method 10 can include a process module 65 capable of exporting three dimensional modeling data in a format suitable for display in one or more spreadsheets 905. As illustrated in the example embodiment shown in FIG. 2, in some embodiments, the system and method 10 can generate one or more spreadsheets 905 including parameters related to at least one roof including an objectID value 910, a shape value 915, an EGID value 920, an altitude max value 925, a house height 930, a surface total 935, a surface total xy 940, a slope min 945, a slope max 950, a slope mean 955, a roof type 960, and a date 965.

Figure 10:
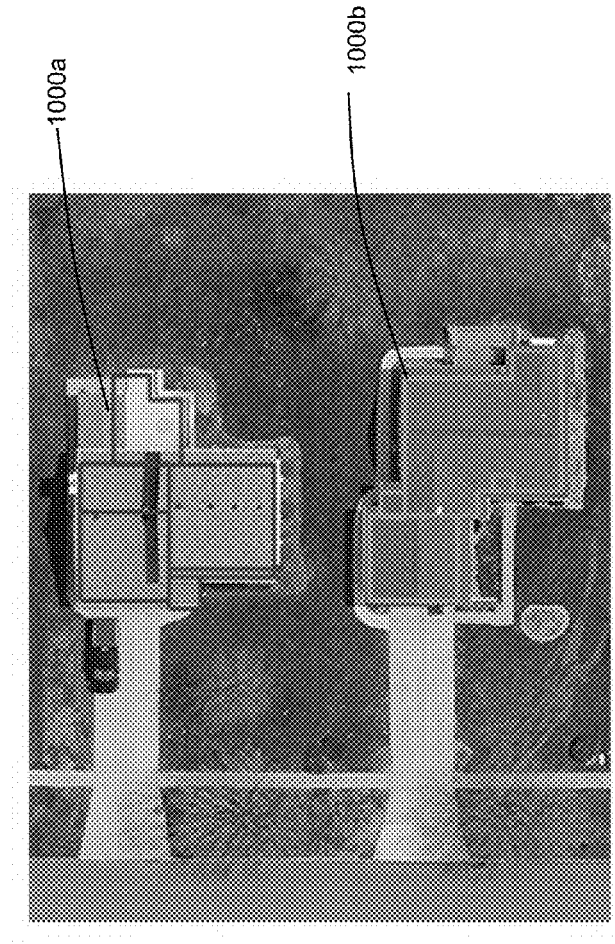
FIG. 10 depicts prior art calculation of two-dimensional roof area using two-dimensional geometric techniques.
Figure 11:
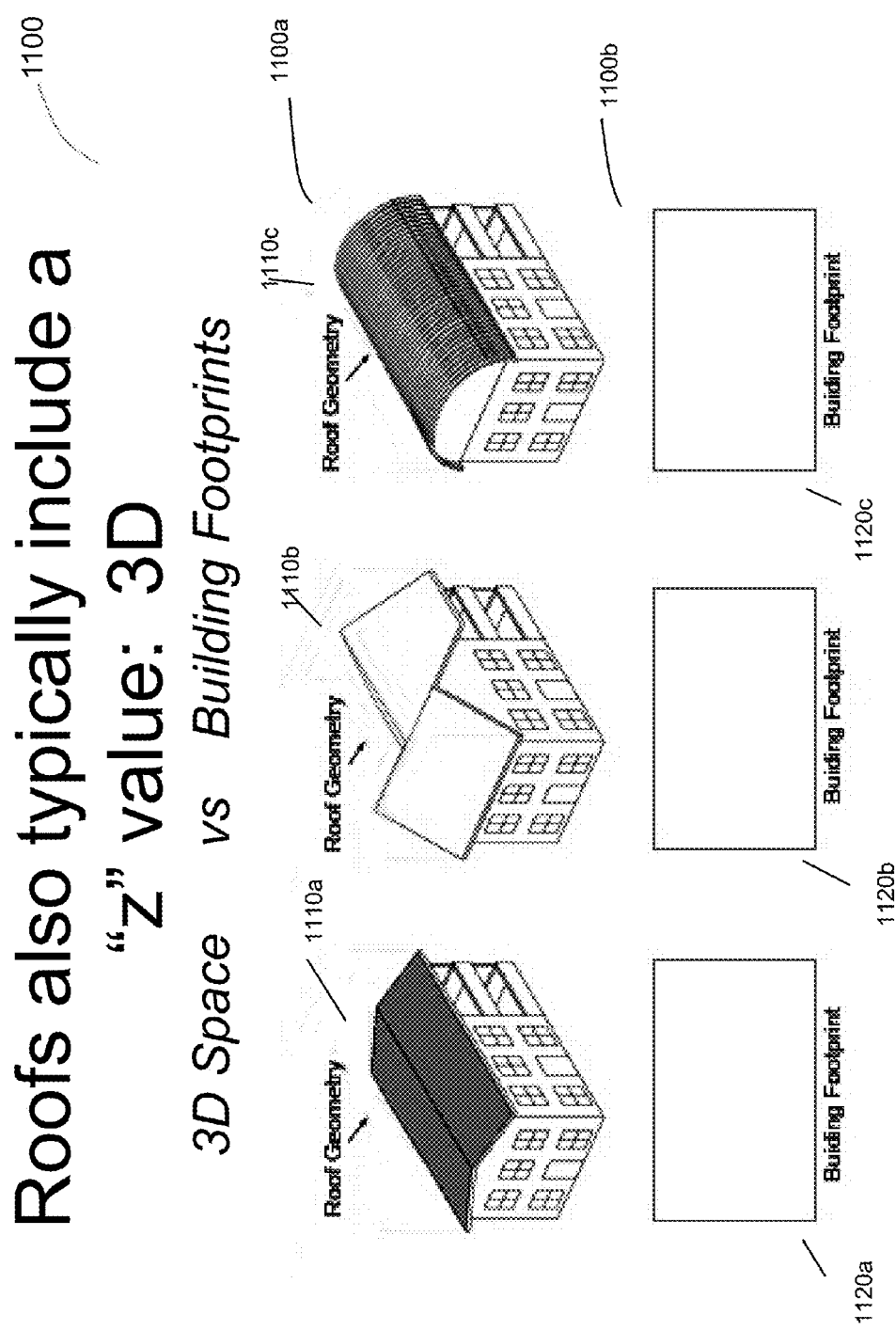
FIG. 11 illustrates a comparison of building footprints and various three dimensional roof geometries.
Figure 12:
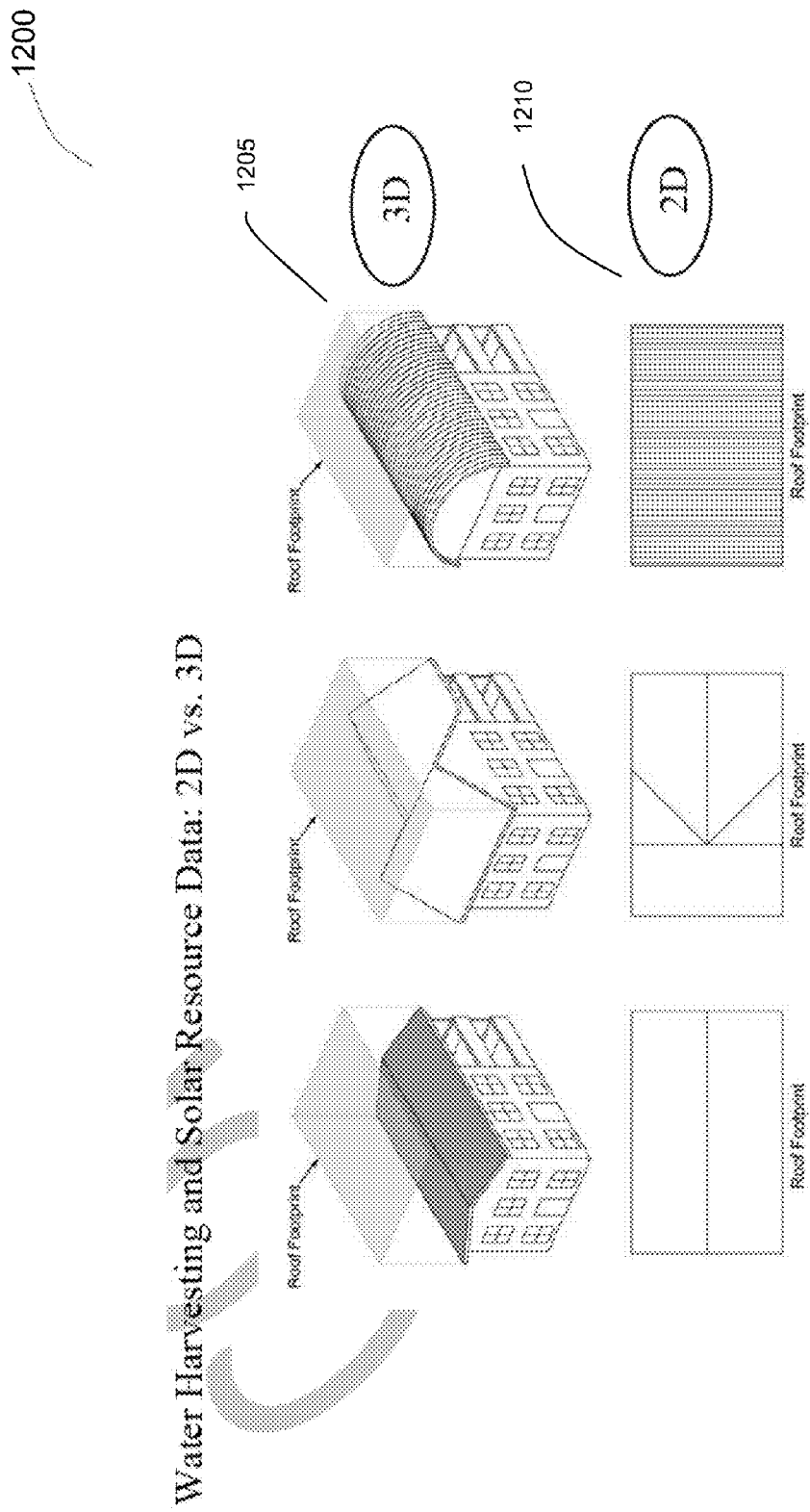
FIG. 12 illustrates a comparison of two dimensional roof footprints and various three dimensional roof geometries for water resourcing and solar capture.

Conventional roof area calculation methodologies are typically based on a two dimensional footprint of the building or structure. For example, FIG. 10 depicts a prior art calculation 1000 of two-dimensional roof area using conventional two-dimensional geometric techniques. As shown, some conventional methods estimate an impervious roof area or solar roof area based on a two dimensional footprint of the building (shown as areas 1000a, 1000b). As illustrated in FIG. 11, which shows a comparison 1100 of building footprints 1100b (footprints 1120a, 1120b, 1120c) and various three dimensional roof geometries 1100a (geometries 1110a, 1110b, 1110c), conventional methods typically do not account for variations in roof z-axis values as all three geometries 1110a, 1110b, 1110c vary from each other. However the footprints 1120a, 1120b, 1120c are substantially equal in geometry. The problem can become further magnified with complex roof geometries. For example, FIG. 12 illustrates a comparison 1200 of two dimensional roof footprints 1210 and various three dimensional roof geometries 1205 for water resourcing and solar capture. As shown in FIGS. 11 and 12, a roof area calculation based solely on a total building footprint can significantly underestimate the actual roof area of a structure. In some other instances, the building footprint approach can over-estimate the actual roof area of a structure. Although not shown in FIG. 11, the actual roof area will vary between each building structure, but the footprint measured using conventional methods will be substantially identical. This is further illustrated in FIG. 12, which shows a comparison of the total building footprint overlaid on the three dimensional geometry 1205 of the building including the roof.

Figure 13:
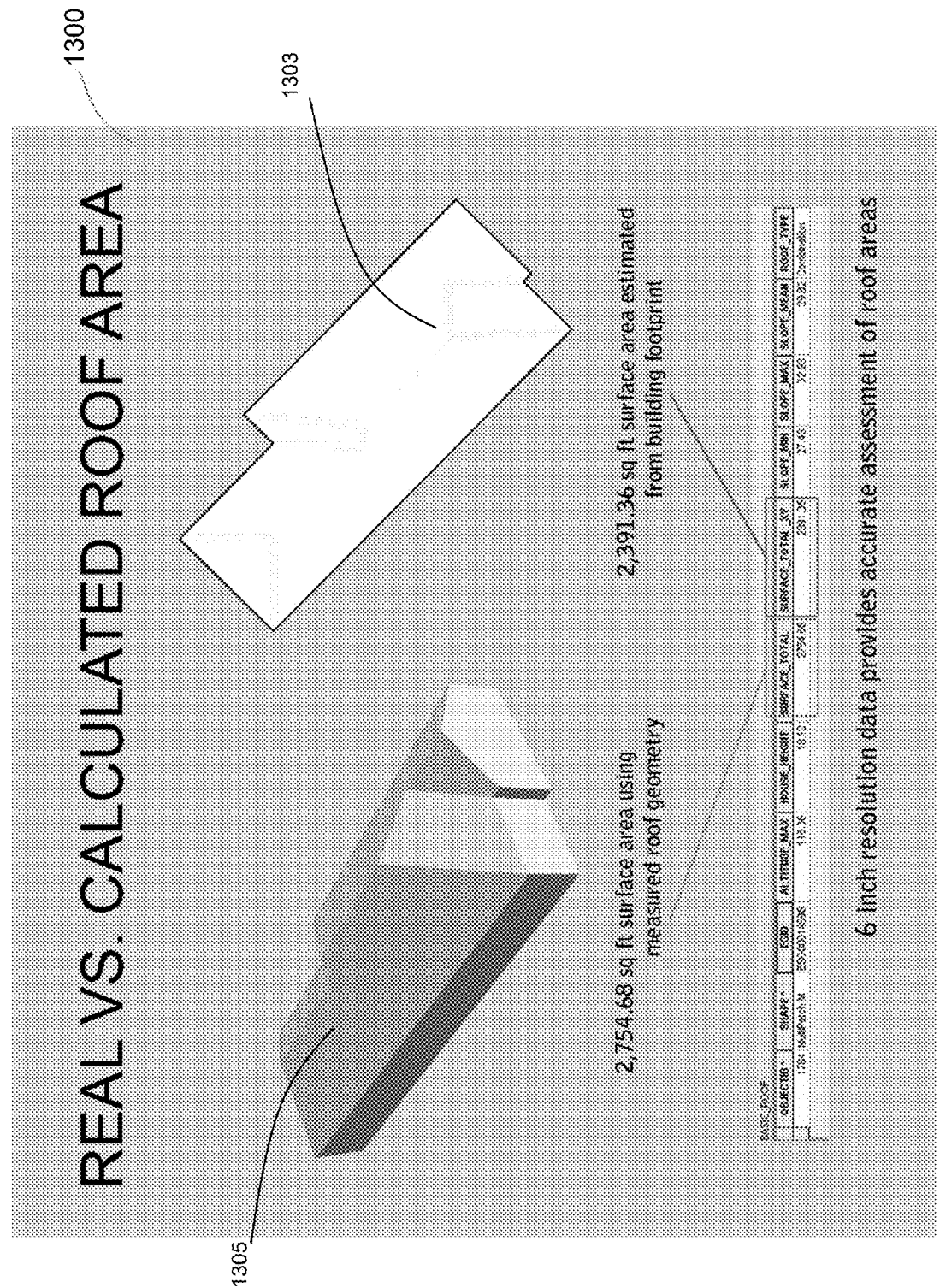
FIG. 13 illustrates a comparison of roof area measured using the computer-implemented system and method of one embodiment of the invention with a building footprint measurement.

FIG. 13 illustrates a comparison 1300 of roof area measured using the computer-implemented system and method 10 of the invention with a building footprint measurement. Some embodiments of the invention provide a computer-implemented method 10 for generating a three-dimensional rooftop model. As described earlier, a point cloud collection module 35 can image upload 29 for point cloud analysis (e.g., a stereo images 210, 220 with 30% overlap or more), and the system and method 10 can proceed to generate three dimensional measurement and three dimensional model process module 50. Some embodiments of the computer-implemented method 10 can process a point-cloud field (e.g., similar to that depicted as point-cloud field 400 in FIG. 4) to generate three-dimensional rooftop models using polylines and polygons to produce a rooftop area calculated from the three-dimensional rooftop model. As shown in FIG. 13, method and system 10 can produce a measured roof geometry 1305 that accounts for the three dimensional geometry of the roof of the structure using the methods as described. In the example illustrated in FIG. 13, the calculation of a roof surface area estimated from the building footprint 1303 results in a surface area of 2,391.36 sq. ft.

Using the same building geometry 1305, the computer-implemented system and method 10 can calculate an estimated roof surface area of 2,754.68 sq. ft.

Some embodiments of the invention can include providing to a user 195 a plurality of parameters generated by one or more process modules (e.g., process modules 20, 35, 50, 65, 80). In some embodiments, the computer-implemented system and method 10 can generate and display a listing of the data which can be used as parameters to assess solar energy potential, or can be used for stormwater runoff analysis. For example, FIG. 14 illustrates a data listing 1400 according to one embodiment which includes a data field 1450, and an associated description field 1490. In some embodiments, the data field 1450 and the associated description field 1490 can be provided for a solar roof potential assessment. In other embodiments, the data field 1450 and associated description field 1490 can be provided for a stormwater run-off calculation. The data listing 1400 can include a data field 1450 comprising at least one of a "EGID" 1455 describing a building ID number, an "absolute height" 1457 describing data for building height relative to sea level, a "relative height" 1459 describing data for building height relative to DTM, and a "surface area total" 1461 describing data for total three dimensional area. The data listing 1400 can also include a data field 1450 comprising at least one of a "surface area x, y" 1463 describing data for 2D polygon total area, a "slope min" 1465 describing data for slope of roof polygon minimum, a "slope max" 1467 describing data for a slope of polygon maximum, and a "roof pitch angle" 1469, describing data for a solar roof slope in degrees. Further, the data listing 1400 can also include a data field 1450 comprising at least one of a "roof type" 1471 describing data for a roof description (e.g., flat, saddle, etc.), a "solar azimuth" 1473, describing data for roof orientation relative to North, a "solar surface area" 1475, describing a solar roof surface area, a "2D solar area" 1477, describing a 2D polygon area measurement, an "Sp façade" 1479, describing a superstructure façade area, and an "Sp roof" 1481, describing a superstructure roof area. In some embodiments, the computer-implemented system and method 10 can generate at least one of the data 1455, 1457, 1459, 1461, 1463, 1465, 1467, 1469, 1471, 1473, 1475, 1477, 1479, and 1481 for use in calculating at least one solar energy potential variable of a roof and/or at least one variable for use in a stormwater runoff analysis.

Figure 15:
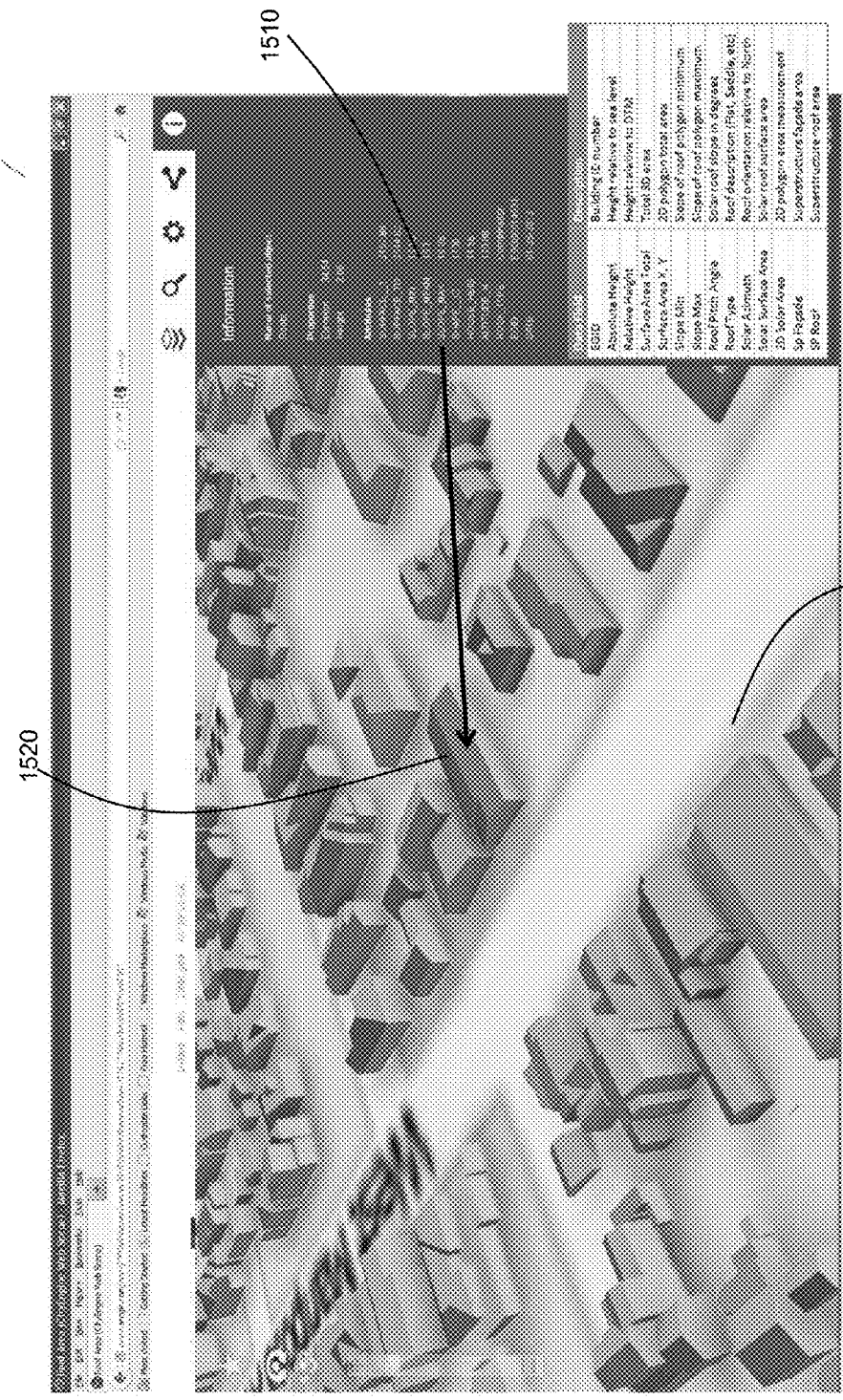
FIG. 15 illustrates a GUI of a three dimensional visualization of roof area measured using the computer-implemented system and method according to one embodiment of the invention.

In addition to, or in place of providing data to a user 195 comprising building geometry measurement data in the form of text, such as data listing 1400 or spreadsheets 905, the computer-implemented system and method 10 can also provide a user 195 the option of displaying the data 1400, 905 in the form of at least one graphical rendering of a building or structure geometric model. In some embodiments, the at least one graphical rendering can include a three dimensional rendering of one or more roof data features. For example, as shown in FIG. 15, illustrating a GUI 1500, a three dimensional visualization of roof areas 1505 can be rendered using the computer-implemented system and method 10. In some embodiments, a listing of the data measurement 1510 produced using the computer-implemented system and method 10 can be provided to a user 195 by selecting any one roof area 1520 within the display 1500. In other embodiments, a user 195 can toggle between a three dimensional visualization of the roof data features (1520) and a listing of the data measurement 1510.

Figure 16:
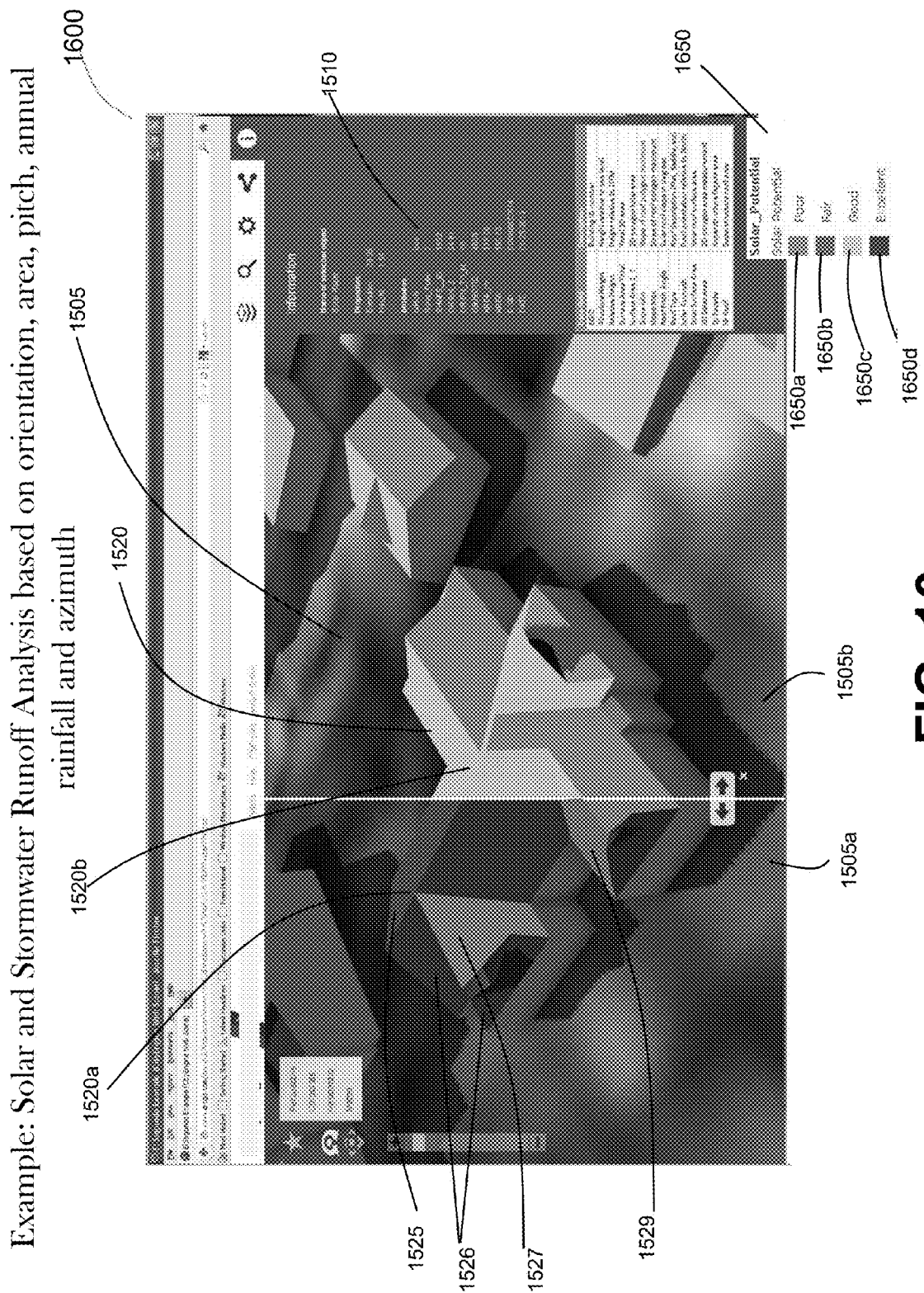
FIG. 16 shows a GUI illustrating a three dimensional visualization of roof area depicting solar and stormwater runoff analysis measured using the computer-implemented system and method according to one embodiment of the invention.

In some embodiments, a user 195 can access the at least one graphical rendering illustrated in FIG. 15 with a three dimensional rendering of one or more roof data features that are differentially visually coded. For example, FIG. 16 illustrates a GUI 1600 of a three dimensional visualization of roof area depicting solar and stormwater runoff analysis measured using the computer-implemented system and method 10 according to one embodiment of the invention. Similar to the GUI display 1500, a three dimensional visualization of roofs 1505 can be rendered using the computer-implemented system and method 10. A listing of the data measurement 1510 produced using the computer-implemented system and method 10 can be provided to a user 195 by selecting any one portion of a roof 1520 within the display 1505. In this instance, the user 195 can also be presented with a dual display showing the three dimensional visualization display 1505b with roof portions 1520b, and a three dimensional visualization display 1505a, showing roof portions 1520a that can be differentially visually coded. For example, roof portions 1520a can include roof portions 1525, 1526, 1527, 1528, and 1529 that can be differentially coded by the system and method 10 to allow a user to visualize the potential of any one area of a roof of a structure or building to be used for solar energy generation (hereinafter referred to as the "solar potential"), and/or for stormwater runoff analysis. In some embodiments, one or more modules of the computer-implemented system and method 10 can be used to generate a three-dimensional rooftop model for energy scavenging applications. By processing a point-cloud field (i.e. using the technique of the example of a point-cloud field 400 in FIG. 4) of a building or structure to produce a rooftop area calculated from the three-dimensional rooftop model, the computer-implemented system and method 10 can be used to generate a three-dimensional rooftop analysis of solar energy potential. For example, in the case of solar potential shown in the example of FIG. 16, in some embodiments, the roof portion 1525 can be color-coded red to indicate an excellent potential 1650d, yellow or orange to indicate a good potential 1650c, green to indicate a fair potential 1650b, and blue to indicate a poor potential 1650a. In some embodiments, the same color scheme can be used to represent a stormwater runoff collection potential (i.e., the solar potentials 1650 shown in FIG. 16 can be representative of stormwater runoff potentials). In some embodiments, color coding potentials for a plurality of roof portions of any one roof (e.g., roof 1520) can be the same for a solar potential and a stormwater runoff collection potential, and can depend on at least one of the variables 1455, 1457, 1459, 1461, 1463, 1465, 1467, 1469, 1471, 1473, 1475, 1477, 1479, and 1481. In some other embodiments, depending on at least one of the variables 1455, 1457, 1459, 1461, 1463, 1465, 1467, 1469, 1471, 1473, 1475, 1477, 1479, and 1481 calculated by the computer-implemented system and method 10, the color coding potentials for a plurality of roof portions (e.g., roof portions 1525, 1526, 1527, 1528, and 1529) of any one roof (e.g., roof area 1520) can be different for a solar potential and a stormwater runoff collection potential.

Figure 17:
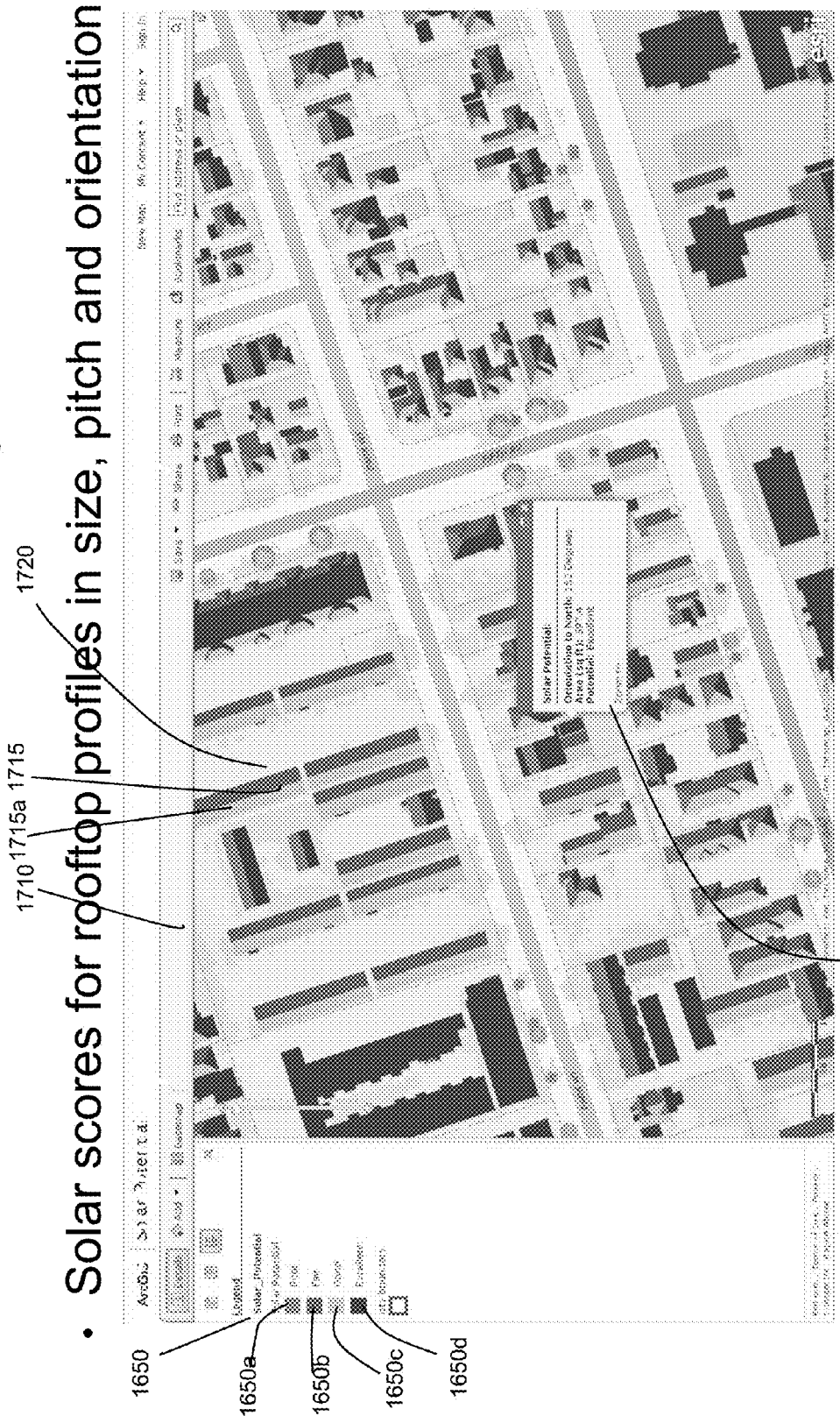
FIG. 17 illustrates a three dimensional solar potential rendering calculated using the computer-implemented system and method according to one embodiment of the invention.

In some embodiments, the computer-implemented system and method 10 can render one or more polygons of a plurality of buildings or structures including one or more roofs with a calculated solar potential. For example, as shown in the GUI 1700 of FIG. 17, and the GUI 2100 of FIG. 21, a three dimensional solar potential rendering can be calculated using the computer-implemented system and method 10 and displaying a plurality of buildings 1720 within a window 1710. As with the embodiment described above and illustrated in FIG. 16 showing a GUI 1600 of a three dimensional visualization of roof area depicting solar and stormwater runoff analysis, the GUI 1700 of FIG. 17 comprises one example of a three dimensional solar potential rendering calculated using the computer-implemented system and method 10 for a plurality of rooftops 1715 comprising at least one rooftop portion 1715a with a coding system. In this instance, a color-code of red is used to indicate an excellent potential 1650d, a yellow or orange is used to indicate a good potential 1650c, a green to indicate a fair potential 1650b, and a blue to indicate a poor potential 1650a. In some embodiments, the same color scheme can be used to represent a stormwater runoff collection potential of any one of the rooftops 1715 (from any one of the rooftop portions 1715a) as described earlier. Further, in some embodiments, a user 195 can access solar potential information by selecting one or more of the rooftops 1715 (and/or one or more rooftop portions 1715a) causing the system and method 10 to display at least one information box 1750. As shown in FIG. 17, in some embodiments, the information box 1750 can include one or more variables calculated by the system and method 10 including, but not limited to, the rooftop orientation to North, the rooftop area, and the potential (i.e., the solar potential in this instance).

Figure 18:
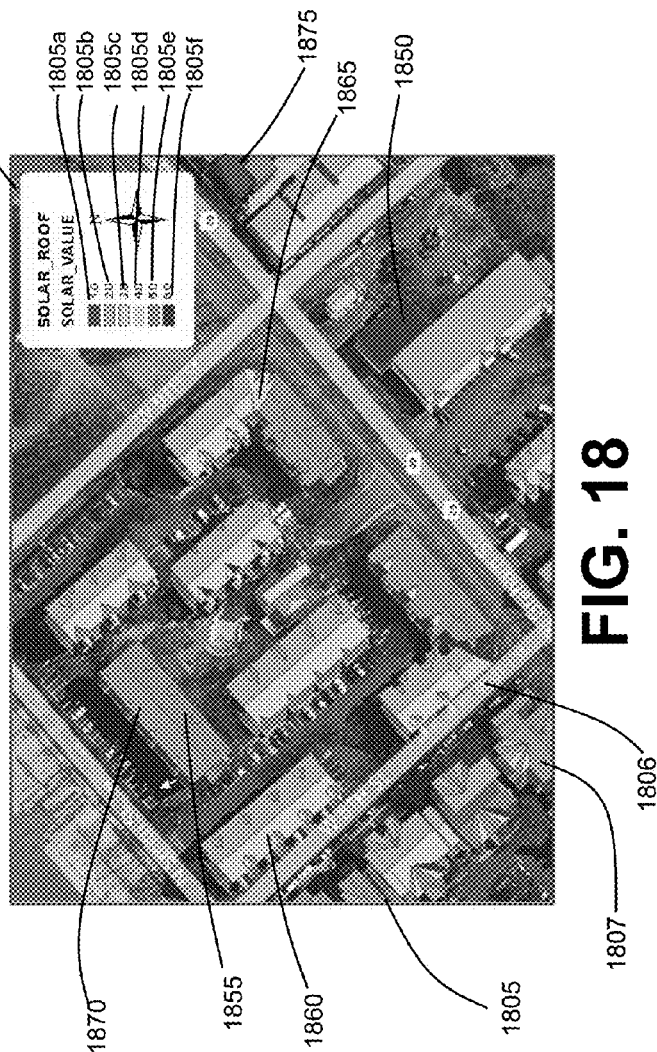
FIG. 18 illustrates a three dimensional solar potential rendering calculated using the computer-implemented system and method according to one embodiment of the invention.

In some embodiments, one or more roofs of a building or structure can be assigned as a solar resource, and a solar score can be calculated for at least one roof surface. In some embodiments, the system and method 10 can provide a solar energy potential map of a building surface or a plurality of building surfaces. Furthermore, in some embodiments, the solar potential can be referenced to a solar score for rooftop profiles depending on the size, pitch and orientation of the solar exposed roof surface. For example, FIG. 18 illustrates a three dimensional solar potential rendering 1800 calculated using the computer-implemented system and method 10 according to one embodiment of the invention. The rendering 1800 can comprise a solar energy potential map 1805 comprising at least one building or structures 1807. In some embodiments, the solar energy potential map 1805 can include a plurality of building or structures 1807 with including a plurality of rooftops 1806 that have been assigned a solar value based on one or more calculations of the system and method 10. For example, the plurality of building or structures 1807 can comprise rooftops 1806 that can include rooftop portions 1850, 1855, 1860, 1865, 1870 and/or 1875, each of which may be assigned a solar value. In some embodiments, as shown by the solar roof key 1805, the solar value can comprise a value between 1.0 and 6.0 in 1.0 increments. For example, the solar value can include a solar value of 1.0 (1805a), a solar value of 2.0 (1805b), a solar value of 3.0 (1805c), a solar value of 4.0 (1805d), a solar value of 5.0 (1805e), or a solar value of 6.0 (1805f). For instance, in the embodiment illustrated in FIG. 18, the solar energy potential map 1805 can include a rooftop portion 1850 with a solar value 1805f, a rooftop portion 1855 with a solar value 1805e, a rooftop portion 1860 with a solar value 1805d, a rooftop portion 1865 with a solar value 1805c, a rooftop portion 1870 with a solar value 1805b, and a rooftop portion 1875 with a solar value 1805a. Moreover, in some embodiments, one or more of the solar values 1805a, 1805b, 1805c, 1805d, 1805e, and 1805f can be assigned a color code so that any one of the rooftop 1806 and/or rooftop portions 1850, 1855, 1860, 1865, 1870, 1875 of the solar energy map 1805 can be rendered in a color code representing any one of the solar values 1805a, 1805b, 1805c, 1805d, 1805e, and 1805f. For example, in some embodiments, the solar energy potential map 1805 can include a rooftop portion 1850 with a solar value 1805f that is rendered in a red color, a rooftop portion 1855 with a solar value 1805e that is rendered in an orange color, rooftop portion 1860 with a solar value 1805d that is rendered in a yellow color, rooftop portion 1865 with a solar value 1805c that is rendered in a green color, rooftop portion 1870 with a solar value 1805b that is rendered in a turquoise color, and a rooftop portion 1875 with a solar value 1805a that is rendered in a blue color. In some embodiments, any one of the solar values 1805a, 1805b, 1805c, 1805d, 1805e, and 1805f can be represented by one or more other colors. In other embodiments, any one of the solar values 1805a, 1805b, 1805c, 1805d, 1805e, and 1805f can be represented by patterns or other conventional visual marks that can be recognized and distinguished by a user 195. In some embodiments, the solar roof key 1805 can include more or less solar values. Further, some embodiments can include more or less building or structures 1807 shown within a solar potential rendering 1800.

Figure 19:
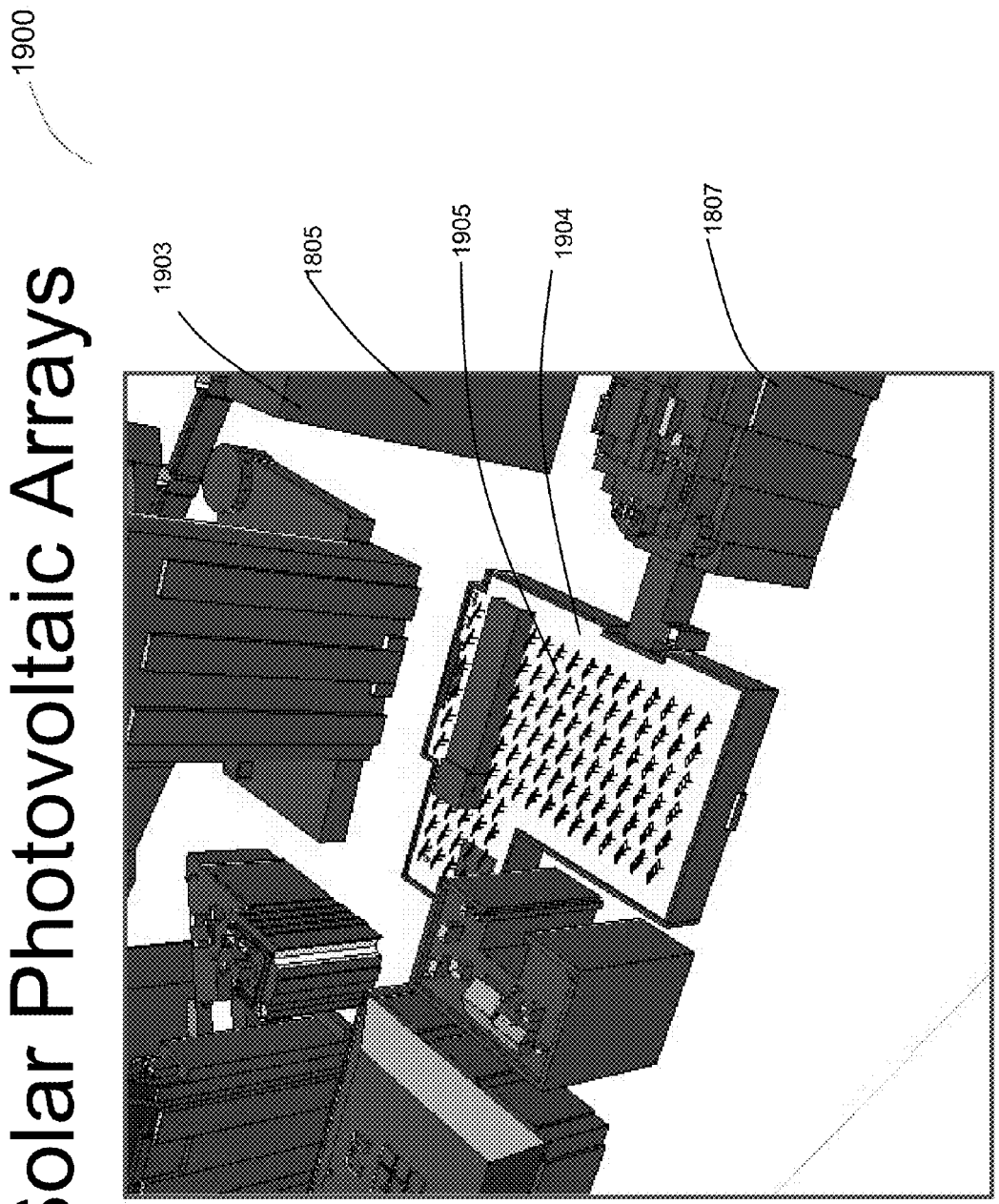
FIG. 19 illustrates an example of a rooftop solar array.

In some embodiments, the system and method 10 can render solar energy equipment positioned within a solar energy potential map 1805 comprising at least one building or structures 1807. For example, FIG. 19 illustrates a GUI 1900 of a rooftop solar array 1905 rendered as a three dimensional solar potential rendering 1903, calculated and combined with a pre-existing or future solar array roof 1904. In some embodiments, a solar collection efficiency of a current or planned solar array 1905 can be modeled for a particular roof polygon.

Figure 20:
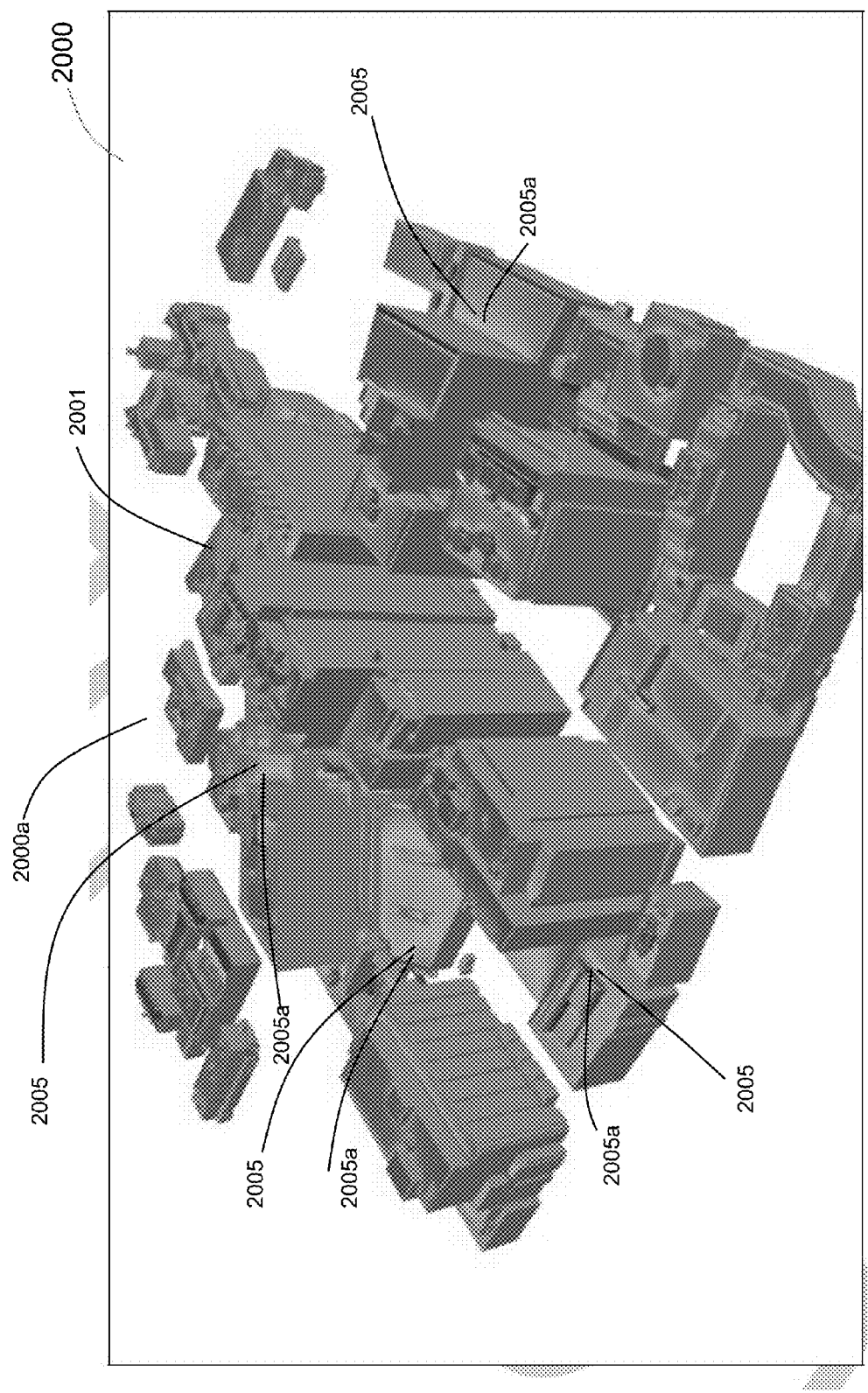
FIG. 20 illustrates a three dimensional solar potential rendering calculated using the computer-implemented system and method according to one embodiment of the invention.

FIG. 20 illustrates a three dimensional solar potential rendering 2000 calculated using the computer-implemented system and method 10 comprising a plurality of buildings 2000a with a plurality of rooftops 2001. In some embodiments, a three dimensional solar potential rendering 2000 can be calculated, and a solar energy potential or score (e.g., a solar value of 1.0 (1805a), a solar value of 2.0 (1805b), a solar value of 3.0 (1805c), a solar value of 4.0 (1805d), a solar value of 5.0 (1805e), or a solar value of 6.0 (1805f) as depicted in FIG. 18) can be assigned a color code to enable the visualization of the solar energy potential of one or more rooftops 2001 of one or more buildings 2000a of the three dimensional rooftop model shown in the solar potential rendering 2000. Moreover, in some embodiments, one or more of the solar values 1805a, 1805b, 1805c, 1805d, 1805e, and 1805f can be assigned a color code so that any one of the rooftops 2001 of the solar energy map 1805 can be rendered in a color code as described earlier with respect to the embodiments shown in FIG. 18. In some embodiments, any one of the rooftops 2001 of any one of the buildings 2000a of the three dimensional solar potential rendering 2000 can be rendered with a color assigned to any one of the solar values 1805a, 1805b, 1805c, 1805d, 1805e, and 1805f. Further, in some embodiments, any one of the rooftops 2001 of any one of the buildings 2000a of the three dimensional solar potential rendering 2000 can include an assignment of more than one solar potential and/or a solar value calculated by the system and method 10. Therefore, in some embodiments, any one of the rooftops 2001 of any one of the buildings 2000a of the three dimensional solar potential rendering 2000 can include an assignment of more than one solar potential and/or a solar value, and can be rendered with more than one solar color (e.g., using one or more of the solar values 1805a, 1805b, 1805c, 1805d, 1805e, and 1805f).

In some embodiments, some portions of the rooftops 2001 comprise more than one solar potential and/or a solar value can be rendered with abrupt boundaries from one solar potential and/or a solar value assigned color to another solar potential and/or a solar value assigned color. Some embodiments include more than one solar energy potential and/or solar value to be calculated by the system and method 10 for any one rooftop 2001. For example, in some embodiments, a three dimensional solar potential rendering 2000 can display a plurality of building roofs 2001 with roof top polygon with a variable solar energy potential represented by a graduated color region 2005 across a roof top surface. As shown in FIG. 20, some areas of roofs 2001 including regions 2005 can comprise more than one solar potential and/or a solar value can be rendered with at least one graduated transition boundary 2005a (representing a transition from one solar potential and/or a solar value assigned color to another solar potential and/or a solar value assigned color). For example, the roof areas close to a building wall or a higher section of a building (i.e. roof areas that can be shadowed during some period of a day) can be colored in a lighter color to represent regions of the roof surface with slightly lower solar potential.

Figure 21:
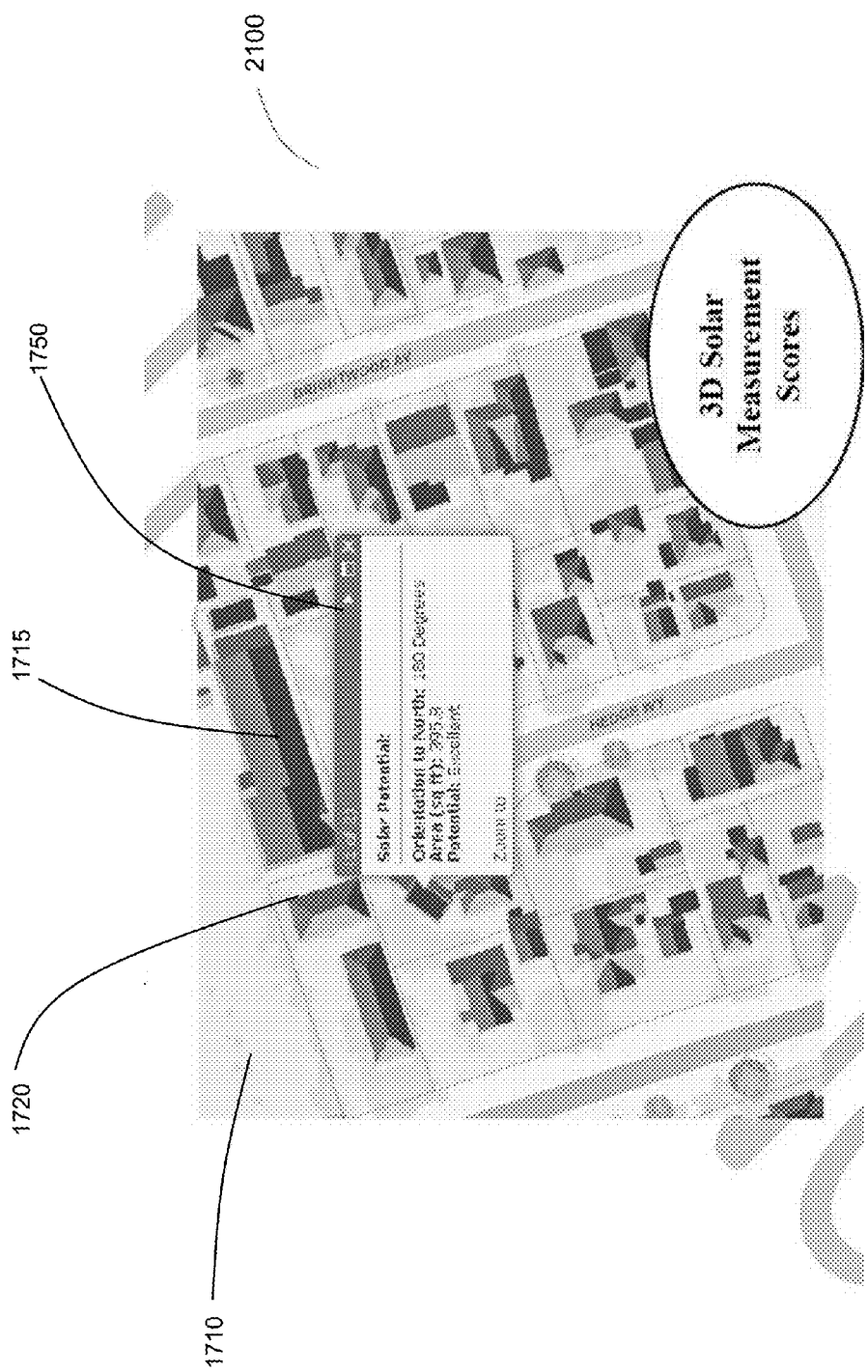
FIG. 21 illustrates a three dimensional solar potential rendering calculated using the computer-implemented system and method according to one embodiment of the invention.
Figure 22:
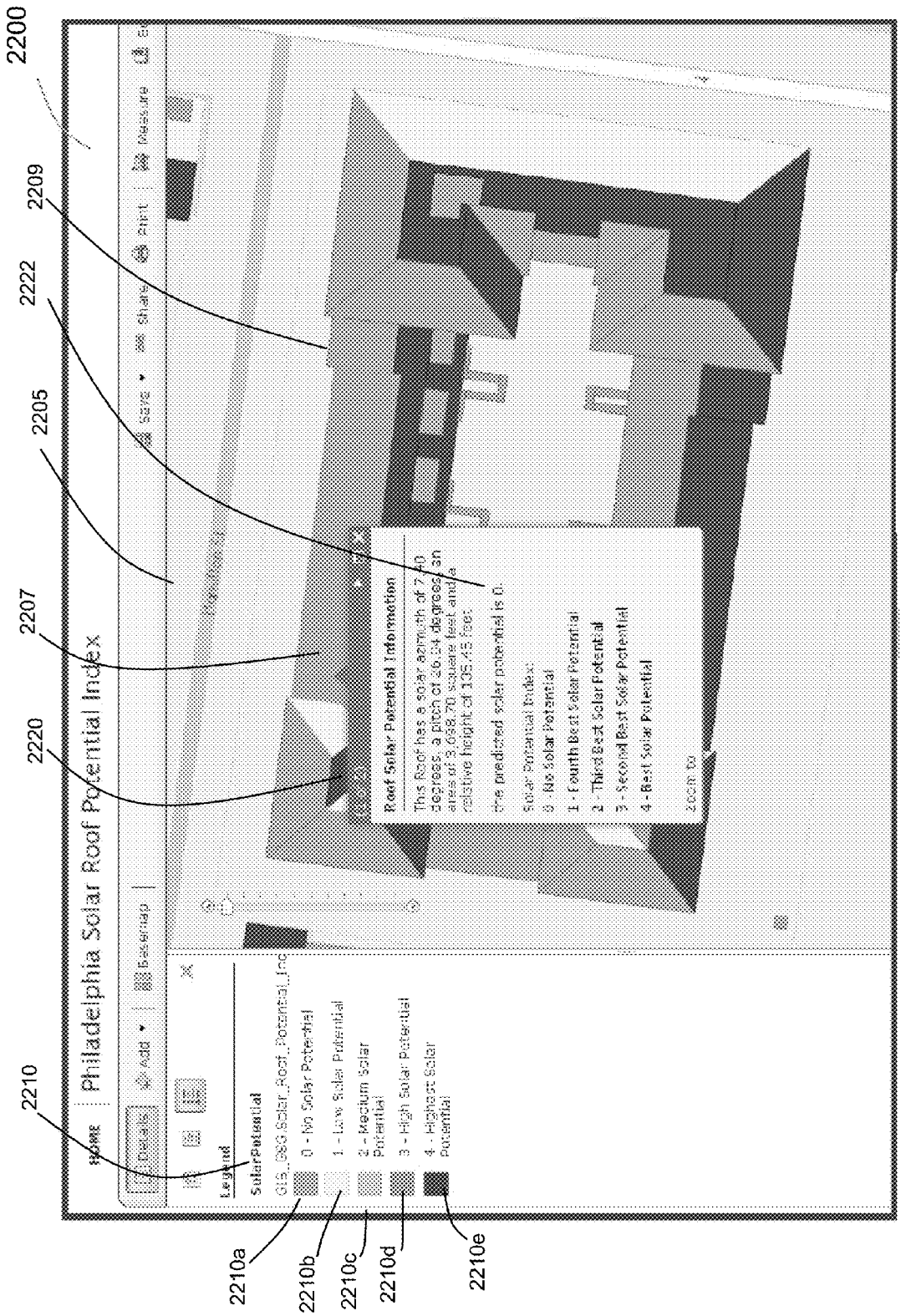
FIG. 22 illustrates a three dimensional solar potential rendering calculated using the computer-implemented system and method according to one embodiment of the invention.

Some embodiments can enable a user 195 to visualize a three dimensional map of one or more buildings or structures with a solar roof potential index. For example, in some embodiments, the system and method 10 can enable a user 195 to be presented with a three dimensional solar potential rendering with solar scores assigned to at least one rooftop 1715 (e.g., such as shown in FIG. 21 illustrating a three dimensional solar potential rendering 2100 calculated using the computer-implemented system and method 10 according to one embodiment of the invention), and then assign a solar roof potential index to one or more rooftops 1715 (e.g., also as shown in FIG. 22 illustrating a GUI 2200 showing a three dimensional solar potential rendering 2205 calculated using the computer-implemented system and method 10 according to one embodiment of the invention). In this instance, one or more rooftop 2207 areas of a building 2209 can be assigned as a solar potential. Furthermore, as depicted in FIG. 22, in some embodiments, the solar potential can be referenced to a solar score for rooftop 2207 profiles depending on the size, pitch and orientation of the solar exposed rooftop 2207 surface. For example, in the embodiments shown in the GUI 2200, a solar potential key 2210 can be displayed including a solar score 0 representing no solar potential 2210a, a solar score 1 representing low solar potential 2210b, a solar score 2 representing medium solar potential 2210c, and a solar score 3 representing a high solar potential, and a solar score 4 representing the highest solar potential 2210e.

In some embodiments, any one of the solar potential 2210a, 2210b, 2210c, 2210d, and 2210e can be assigned a color code. For example, in some embodiments, the solar score 0 representing no solar potential 2210a can be assigned a purple color code. The solar score 1 representing low solar potential 2210b can be assigned a yellow color code. The solar score 2 representing medium solar potential 2210c can be assigned a yellow-orange color code. The solar score 3 representing a high solar potential can be assigned an orange color code, and the solar score 4 representing the highest solar potential 2210e can be assigned a red color code. In some embodiments, the system and method 10 can compute a solar potential of any one of the rooftops 2207 (e.g., any one of the rooftops 2207 of the building 2209 shown in FIG. 22), and render one or more of the rooftops 2207 with a color representing any one of the solar potential 2210a, 2210b, 2210c, 2210d, and 2210e as described above. In some embodiments, any one of the solar potential 2210a, 2210b, 2210c, 2210d, and 2210e can be represented by one or more other colors. In other embodiments, any one of the solar potential 2210a, 2210b, 2210c, 2210d, and 2210e can be represented by patterns or other conventional visual marks that can be recognized and distinguished by a user 195.

In some embodiments, a user can select any rooftop 2207 surface (e.g., any roof polygon or portion) to enable the system and method 10 to display detailed solar potential information within a pop-up information window 2220. In some embodiments, the system and method 10 can display detailed solar potential information within the pop-up window 2220 that includes a predicted solar potential 2222 of any single rooftop 2207 portion. In other embodiments, the system and method 10 can display detailed solar potential information within the pop-up window 2220 that includes a predicted solar potential 2222 calculated for the entire rooftop 2207 surface of a building 2209. For example, in some embodiments, one or more rooftops 2207 surfaces of a single structure (i.e. building 2209) can include solar potential (i.e., one or more rooftop 2207 portions can be assigned a solar score 1 and rendered in a yellow color code, or a solar score 2 and rendered in a yellow-orange color code, or a solar score 3 and rendered in an orange color code, or a solar score 4 and rendered in a red color code. However the system and method can calculate that the building 2209 has no solar potential, and assigns a solar score of zero.

In some embodiments of the invention, one or more parameters generated by one or more modules of the computer-implemented system and method 10 can be used for managing water resources and water conservation and environmental conservation. Embodiments of the invention that can be used for runoff analysis can use known environmental parameters, such as annual rainfall statistics, including, but not limited to, the annual rainfall total and historic intensity. For example, in some embodiments, one or more parameters generated by one or more modules of the computer-implemented system and method 10 can be used for stormwater roof surveying and assessments. Some embodiments provide for one or more modules of the computer-implemented system and method 10 can be used for flood modeling, including storm surge risk assessment.

Roof designs can sometimes cause unintended consequences when rainwater is present. The roof geometry and drainage characteristics of a roof can determine how water flows off of a roof, and the amount of water affecting an area depends on how much rain falls off of a roof. To determine the amount of water, the size of the roof surface, the pitch angle of the roof, and the relationship of a particular roof's orientation to the horizon, each roof segment and/or surface polygon can be calculated in some embodiments. The elevation of the roof relative to the ground and sea level can be determined and therefore the height of the building can also be determined. These parameters, along with the annual rainfall and its historic intensity can facilitate calculating the total rainfall runoff from a particular roof polygon.

Some embodiments of the system and method 10 can calculate the flow of water per unit width of roof surface using the following expression:

$$q = \frac{iL}{\sqrt{1+S_0^2}}$$

Assuming a rainfall of intensity i falling on a roof of longitudinal slope $S_0$ and length down the slope L, and the roof is very wide perpendicular to the direction of flow, then q provides a measure of flow per unit width going down the roof. If the impact of the rain on the roof makes the flow turbulent, then Manning's equation can be used to determine the time for a water droplet to travel from the top to the bottom of the slope by calculating the velocity V:

$$V = \frac{1.49}{n} y^{2/3} S_0^{1/2}$$

where n is the roughness coefficient n, and the depth of flow is y.

In some embodiments, one or more parameters generated by one or more modules of the computer-implemented system and method 10 can be used to enable cities and municipalities to determine responsibility for stormwater run-off that travels into municipality streets, and ultimately into rivers, bays and/or coastal waters. In some embodiments, urban drainage design models can be created from building data and roof area assessments using at least one embodiment of the system and method 10. The models can be used to more equitably and effectively implement regulations and urban drainage design for municipal districts, cities, and counties.

Figure 23:
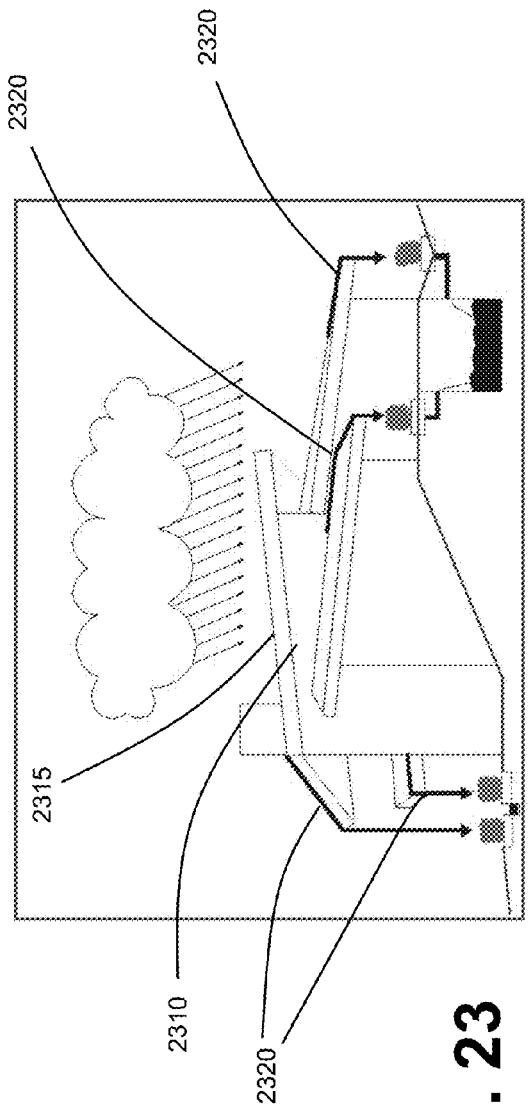
FIG. 23 provides an illustration of stormwater drainage and management and recovery for a building.
Figure 24:
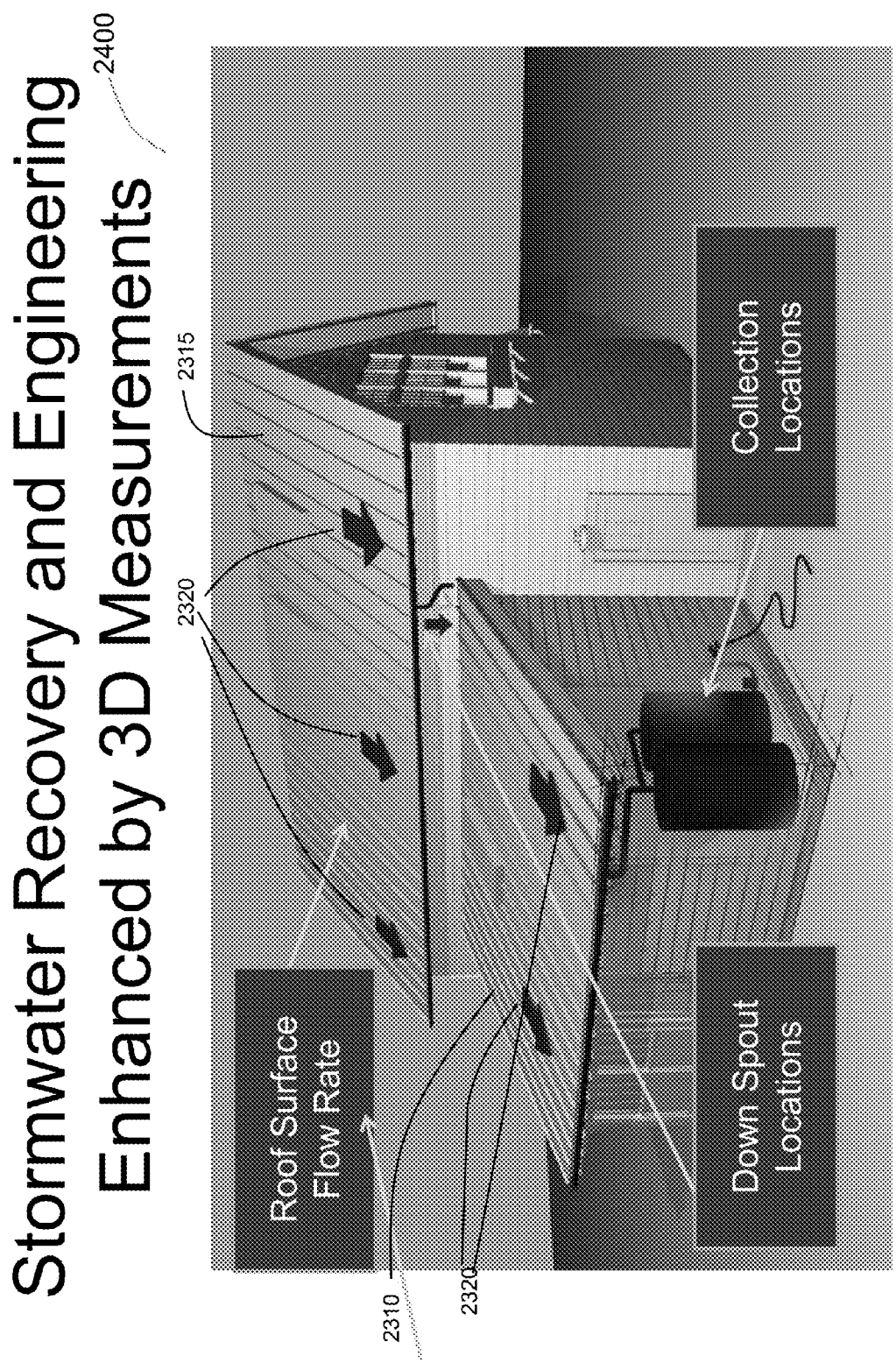
FIG. 24 provides an illustration of stormwater drainage and management for a building.

Other factors that can be implemented in stormwater run-off models calculated by the system and method 10 include water management and drainage. For example, measurements of a flow of rainwater 2320 from a roof surface can be influenced by water capture and collection infrastructure. FIGS. 23 and 24 provide illustrations 2300, 2400 of stormwater drainage and management and recovery for a building 2310. In some embodiments, measurements of one or more flows 2320 of rainwater from a roof surface 2315 can be influenced by water capture and collection infrastructure such as guttering, piping and water collection reservoirs.

Figure 25:
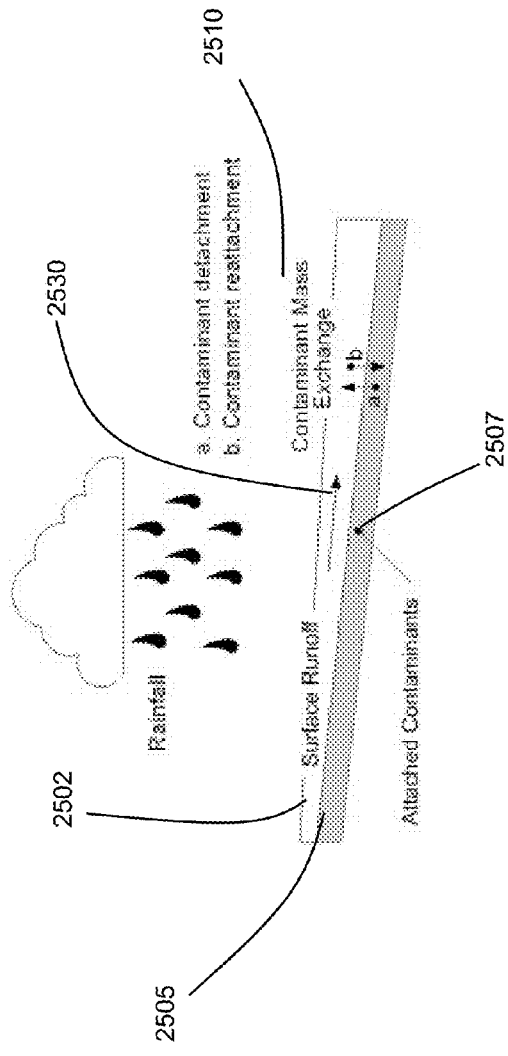
FIG. 25 illustrates a stormwater run-off calculation methodology.

In some other embodiments, other environmental parameters can be used by the system and method 10 to calculate a runoff flow 2320. For example, FIG. 25 illustrates a stormwater run-off calculation methodology 2500 used in some embodiments of the system and method 10. In some embodiments, a surface contaminant detachment and reattachment parameter 2510 can be used in the system and method 10. In some embodiments, roof surface contamination can alter the water flow rate and direction across a roof surface (e.g., roof surface 2505 shown in the illustration of FIG. 25). In some embodiments, roof surface contamination 2507 can become detached from the roof surface and be transported within a flow of water across some distance of a roof surface 2505. In some embodiments, at least some suspended contamination 2507 can be deposited and/or reattached to at least a portion of the roof surface 2505. In some embodiments, the presence of a contamination 2507 fixed to at least a portion of the roof surface 2505 can alter a flow rate 2530 or direction of water 2502 across at least a portion of the roof surface 2505. In some other embodiments, the presence of a contamination 2507 suspended in a flow of water 2502 can alter a flow rate 2530 or direction of the water 2502 across at least a portion of the roof surface 2505.

Figure 26:
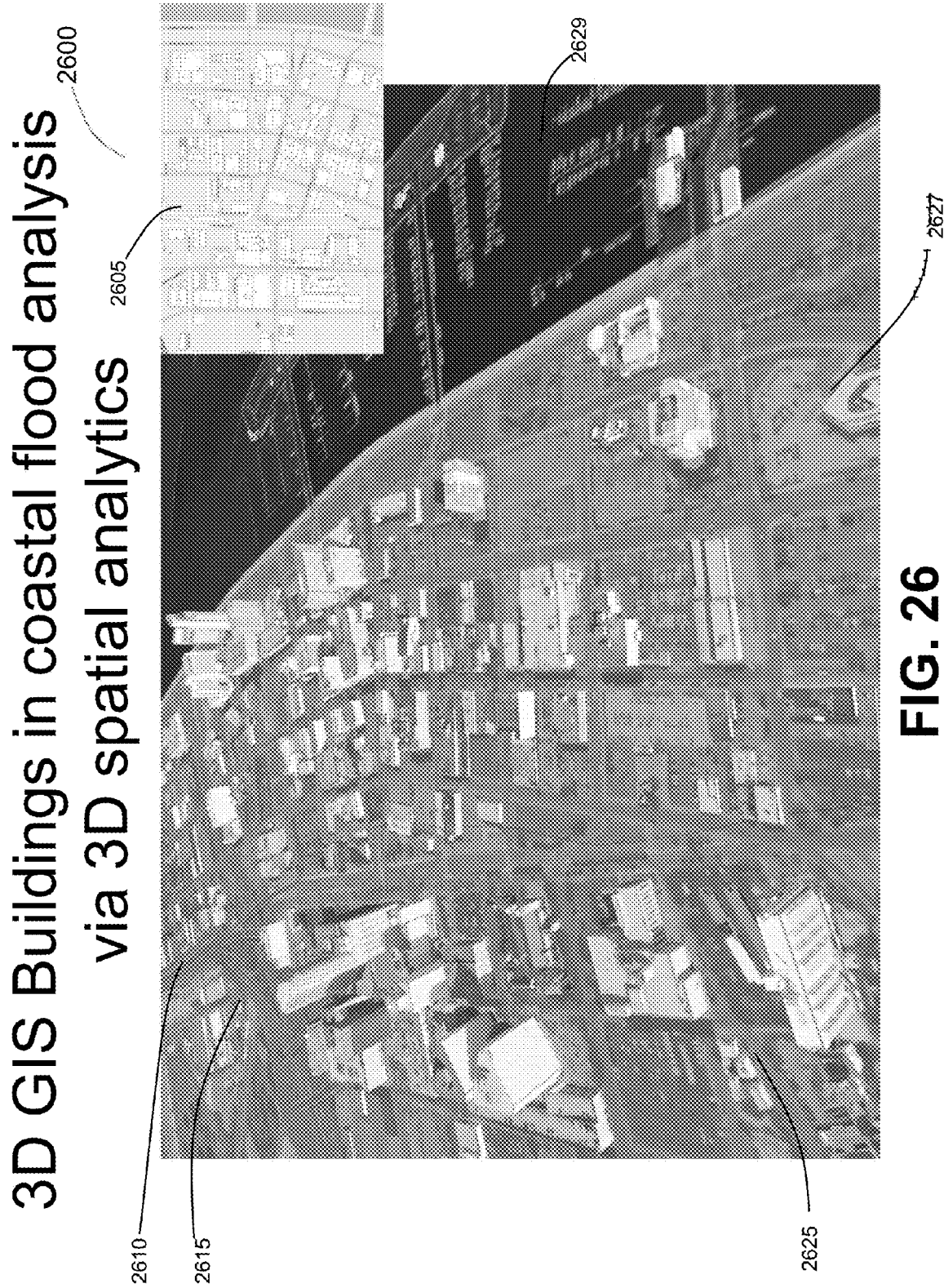
FIG. 26 illustrates a coastal flood analysis produced with spatial analytics using the computer-implemented system and method according to one embodiment of the invention.

Some embodiments of the invention are useful in a variety of alternative applications. For example, FIG. 26 illustrates a GUI 2600 illustrating a coastal flood analysis 2610 produced with spatial analytics using the computer-implemented system and method 10 according to one embodiment of the invention. In some embodiments, the coastal flood vulnerability of one or more building structures of a community 2615 can be calculated and displayed by the system and method 10. As illustrated in FIG. 26, in some embodiments, the GUI 2600 can include a building or community 2615 rendered in three dimensions including a coastal flood analysis of a region defined by a two dimensional map 2605. For example, in some embodiments, any region of a building or community 2615 can be rendered using one or more color codes representing a level of coastal flood risk. In some embodiments, an inland region 2625 can include at least some portion rendered in a green color. A coastal region 2627 can include at least some portions rendered in a yellow color, and bay area 2629 can include at least some portions rendered in a red color. In some embodiments, any one of the regions 2625, 2627, 2629 can be rendered in one or more other colors. In some further embodiments, any one of the regions 2625, 2627, 2629 can be rendered with patterns or other conventional visual graphical marks that can be readily distinguished by a user 195.

Figure 27A:
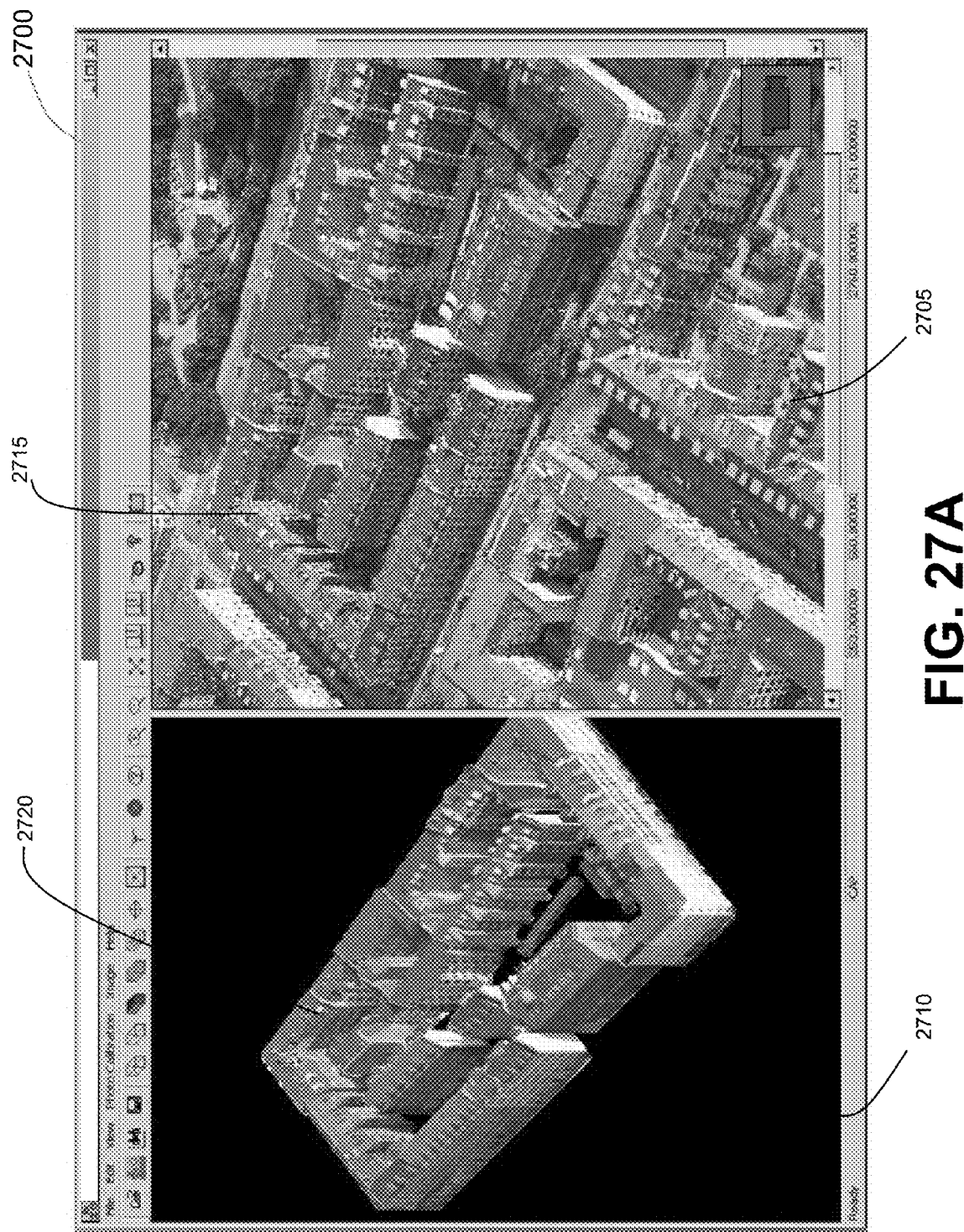
FIG. 27A illustrates a GUI showing a dual display of an aerial photograph and a texturing model calculated using the computer-implemented system and method according to one embodiment of the invention.

In some embodiments, the system and method 10 can render at least one texture on any portion of a displayed polygon of a building or structure. For example, as discussed earlier, in some embodiments, the system and method 10 can include sub-tasks comprising data capture 110, automated modeling 130, semi-automated editing sub-tasks 150, and texturing options 170 (see FIG. 1B illustrating a sub-task summary 100). In some embodiments, three dimensional models can be rendered using one or more texturing options using the texturing options sub-task 170, including texture management of various model surfaces. For example, in some embodiments, the texturing options 170 can include a texture management 173, and terrestrial or aerial oblique images applied 176. For example, in some embodiments, one or more textures can be applied to roofs, walls, or other surfaces of a building or structure model. Moreover, in some further embodiments, terrestrial or aerial oblique images can be used as the basis of a texture (i.e., as texture bitmaps) and applied to one or more surfaces of a building or structure. For example, FIG. 27A illustrates a GUI 2700 showing a dual display comprising a window 2705 displaying an aerial photograph of a group of buildings 2715 alongside a window 2710 displaying a at least one texturing model 2720. In some embodiments, any polygon forming any portion of the texturing model 2720 can be textured. In some embodiments, any portion of the texturing model 2720 including at least one textured polygon can be displayed in the window 2705 displaying an aerial photograph of a group of buildings 2715.

Figure 27B:
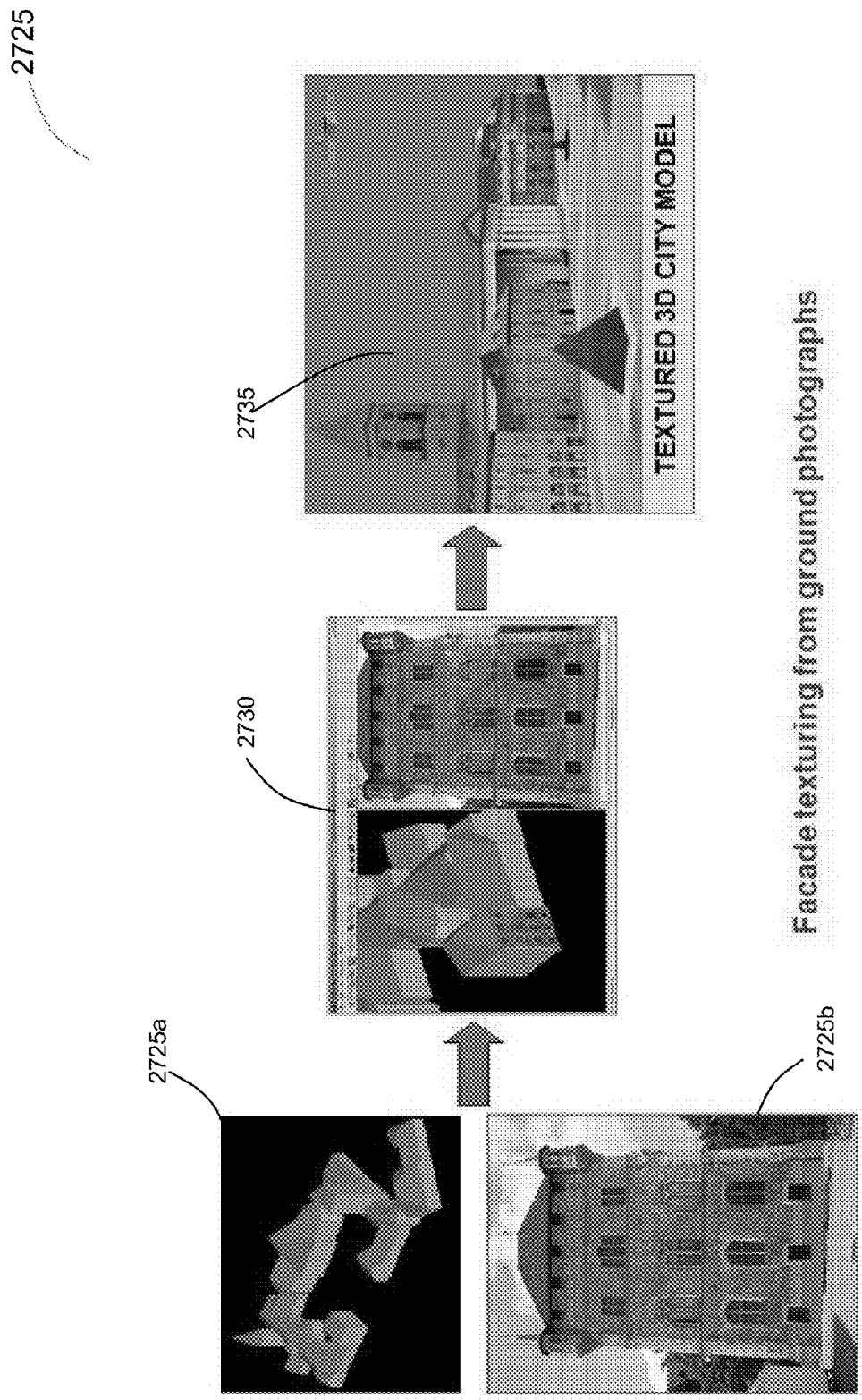
FIG. 27B illustrates a GUI showing a rendering of a façade texturing tool according to one embodiment of the computer-implemented system and method.

Some embodiments of the invention can provide at least one texturing process to a user 195. For example, FIG. 27B illustrates a process flow 2725 according to one embodiment of the computer-implemented system and method 10. In some embodiments, one or more modules of the system and method 10 can map one or more textures 2725b from a photographic image to one or more objects 2725a and processed using the system and method 10 into a textured three dimensional city model 2735. For example, in some embodiments, one or more textures 2725b can be applied to one or more object surfaces (i.e., three dimensional polygon surfaces). In some embodiments, a façade texturing 2725b can be used from actual ground photographs, whereas in other embodiments, textures can be obtained from oblique images.

Some embodiments can utilize additional types of imagery and information to texture a surface of a building or structure. For example, thermal bridging, air leakage and air infiltration are all ways in which heat is lost or energy is wasted from a building or structure. In some embodiments, thermal imagery can be used solely for evaluation purposes, or can be used in conjunction with the other methods previously described. For example, in some embodiments, the occupancy of a building can be evaluated based on thermal imagery taken in the winter months. Using these methods, vacant or deserted structures can be identified. Furthermore, in some embodiments, the thermal imagery can be used to provide heat release information to law enforcement, or other local, state or federal agencies.

Figure 27C:
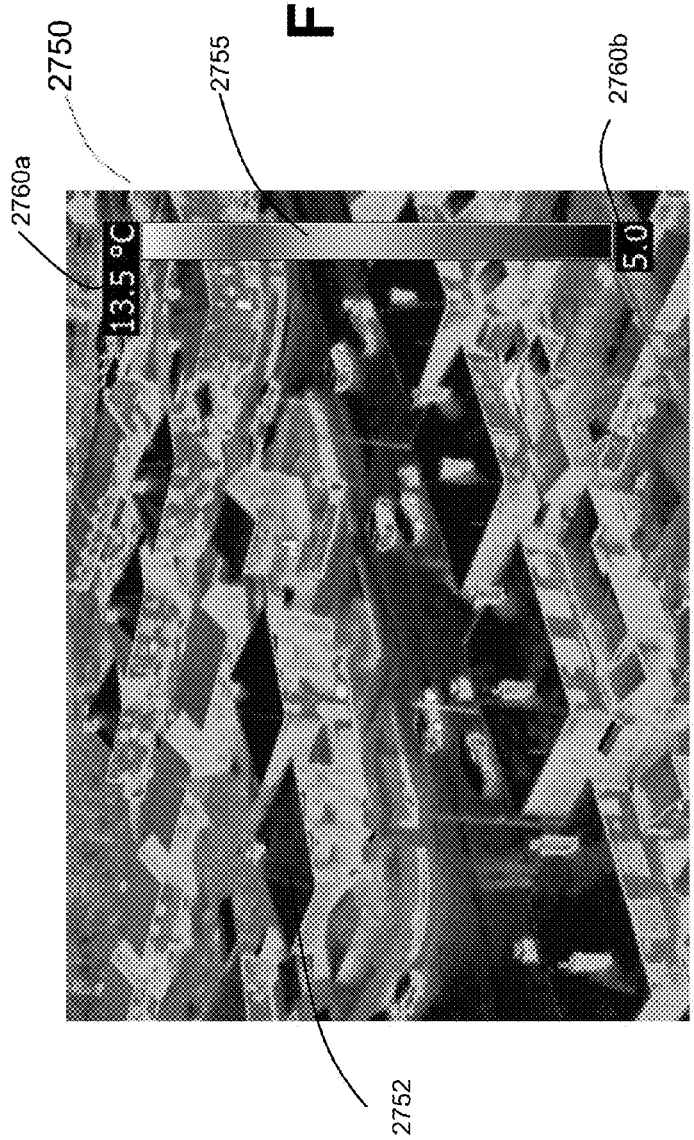
FIG. 27C illustrates an example of a thermal image of a residential area according to one embodiment of the invention.
Figure 27D:
FIG. 27D illustrates an example of a thermal image of a building according to one embodiment of the invention.

In some embodiments of the invention, energy insulation efficiencies can be assessed based on heat released from one or more walls or edges of a building structure and used to render a texture map onto one or more buildings or structures. For example, using substantially the same texturing method 2725 as has been previously described, thermal heat aerial imagery can be mapped onto the roof and façade of one or more objects. For example, as shown in FIG. 27C which illustrates an example of a thermal image 2750 of a residential area 2752 include a color code 2755 according to one embodiment of the invention, and FIG. 27D, which illustrates an example of a thermal image 2775 of one building of the residential area 2752, in some embodiments, thermal imagery can be used to provide a thermal map 2750 of a community and/or a thermal map of an individual building or structure 2775. In this instance, one or more buildings or structures can be rendered by texturing one or more surfaces of one or more buildings 2777 using at least one or more thermal images comprising a one or more colors defined by a color code 2755 comprising a range of colors representing any temperature between an upper temperature 2760a and a lower temperature 2760b. In some further embodiments, any one of the thermal maps 2750, 2775 can be rendered with patterns or other conventional visual graphical marks that can be readily distinguished by a user 195, and correlated to at least one temperature or temperature range.

In some embodiments of the system and method 10, a variety of tools can be implemented to enable manipulation and modification of at least one three dimensional geometric model of a building or structure. In some embodiments, the system and method 10 can be implemented into or with one or more commercially available computer-aided design software packages. For example, in some embodiments, the system and method 10 can be implemented with a Microstation® platform (i.e., platform 240 depicted in FIG. 2), an architectural and engineering software package for two and three dimensional design and drafting, developed and sold by Bentley Systems, Incorporated. In some embodiments, the Microstation® platform 240 supported system and method 10 can capture data (e.g. roof features), and directly process captured images from virtually any photogrammetric system or data source. Some embodiments provide for direct export of a three dimensional model in a Microstation® platform 240 into an Esri® geodatabase (i.e. supporting MDB-type files). In this geodatabase, the main building and the super-structure are put into different feature classes with geometry attributes and theme attributes, such as area, volume, etc. In some embodiments, a solar surface (roof face) can be put into a special feature class with area/slope as attributes. Esri® is a registered trademark of Environmental Systems Research Institute, Inc.

In some embodiments, various tool modules can be implemented into the system and method 10 for use with one or more software platforms, including, but not limited to the Microstation® platform 240 as described above. For example, as discussed earlier, the system and method 10 can include sub-tasks comprising data capture 110, automated modeling 130, semi-automated editing sub-tasks 150 (see FIG. 1B illustrating a sub-task summary 100 for the computer-implemented three dimensional model processing and generation system and method 10 of FIG. 1A according to one embodiment of the invention). In some embodiments, one or more editing sub-tasks 150 can include tools for geometric refinement, geometric module attribute tagging, basement generation and other conversion tools. Some embodiments can implement seamless flow of data across one or more of the modules. FIG. 28A through 28L and FIG. 29A through 29D illustrate examples of the tool modules for modeling, editing, data integration, quality control, and batch processing according to one embodiment of the computer-implemented system and method 10. In some embodiments, using one or more tools as described and illustrated in FIGS. 28A-K and 29A-C, a user 195 can manipulate and refine a three dimensional geometric model in the system and method 10 implemented in a Microstation® platform 240.

Figure 28A:
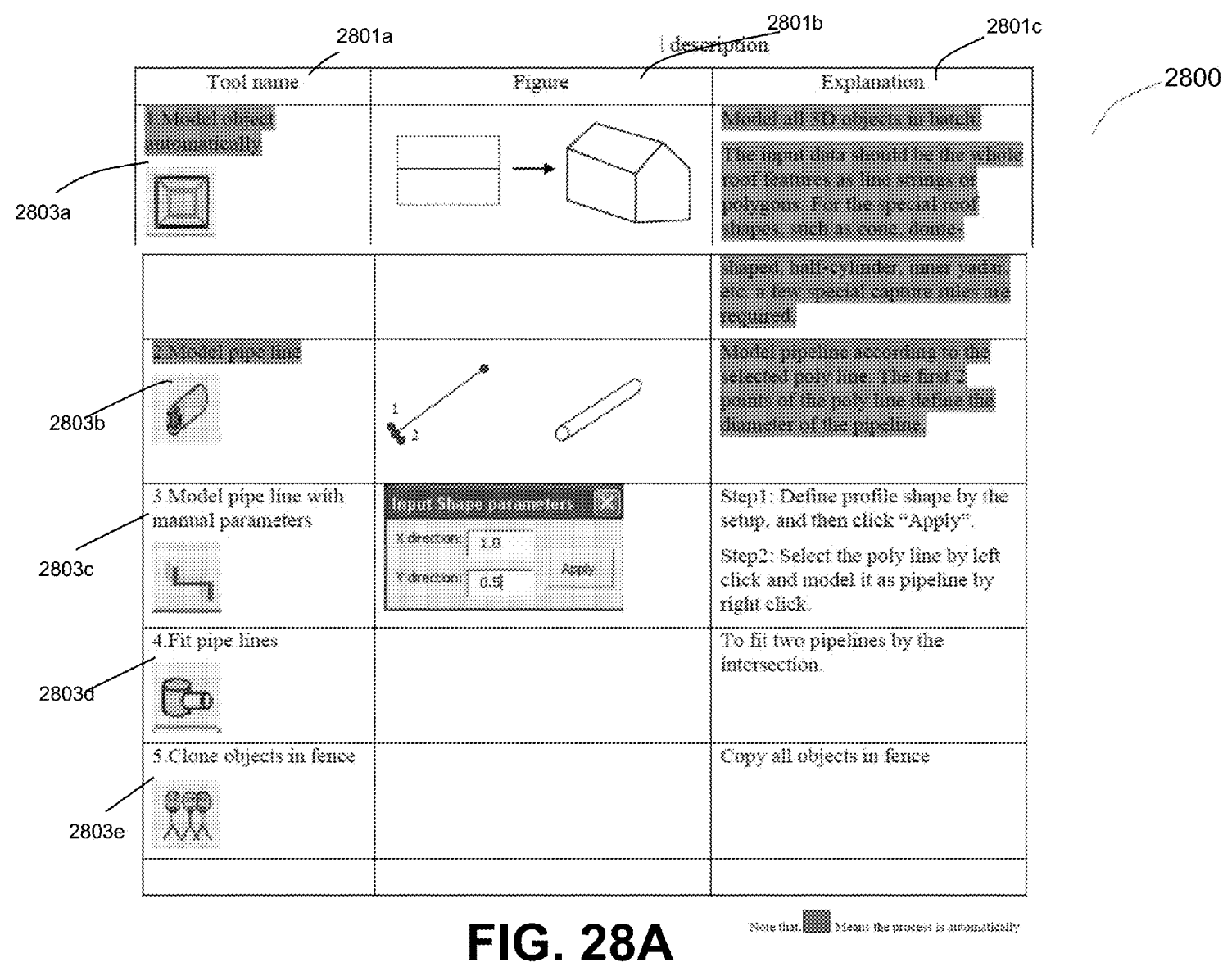

FIG. 28A is an example of the three-dimensional modeling tools 2800 of one embodiment of the computer-implemented system and method. Using one or more tool modules of the system and method 10, three-dimensional geometric models can be created. For example, modeling tools 2800 includes a plurality of columns comprising a tool name 2801a, representative FIG. 2801b, and an explanation or summary 2801c. In some embodiments, the tool name 2801a can comprise one or more icons that can be displayed to a user 195 and to enable a user 195 to select one or more of the tool name 2801a icons to at least partially control the system and method 10. For example, to perform one or more edit functions of the system and method 10, the user 195 can select one or more tool name 2801a icons to perform one or more manual editing options, or to initiate one or more automatic or semi-automatic editing options. For example, in some embodiments, the tools 2800 can include a "Model object automatically" icon 2803a. In this instance, a user 195 can model all three dimensional objects in a batch using input data that can include whole roof features such as line strings or polygons. In some instances (e.g., including at least with shapes such as cones, dome-shaped objects, half-cylinders, inner yadar) some special capture rules are required. In some embodiments, the tools 2800 can include a "Model pipe line" icon 2803b. In this instance, a pipeline can be modeled according to a selected polyline, and the first two points of the polyline can define the diameter of the pipeline. Some embodiments include a "Model pipe line with parameters" icon 2803c. In this instance, a user 195 can define a profile shape by the setup, followed by clicking "Apply", and then select a poly line by a left click, instructing the system and method 10 to model it as a pipeline by a right click action by the user 195. In some further embodiments, the tools 2800 include a "Fit pipe lines" icon 2803d that can enable a user to fit two pipelines by the intersection. Some embodiments include a "Clone objects in fence" icon 2803e from which a user 195 can use to copy all objects in a fence.

FIGS. 28B-E show examples of the three-dimensional editing tools 2805, 2810, 2815, 2820 of one embodiment of the computer-implemented system and method 10. In some embodiments, a user can select from a large library of editing tools to build, modify, manipulate, and refine a three dimensional geometric model. For example, the tools 2805 shown in FIG. 28B can include a "Move point (2D)" icon 2807a and a "Move Point (3D)" icon 2807b. In some embodiments, the "Move point (2D)" icon 2807a can enable a user 195 to move one vertex of an object to a new position or snap to another vertex in to dimensions. Further, in some embodiments, the "Move Point (3D)" icon 2807b can enable a user 195 to move one vertex to a new position, or snap to another vertex in three dimensions.

In some embodiments, the tools 2810 shown in FIG. 28C can include a "Move point to line" icon 2813a that can enable a user 195 to snap a selected vertex to a line in an xy plane. In some embodiments, the tools 2810 can also include at least one of a "Set point height to average" icon 2813b, a "Set point height to" icon 2813c, a "Change Point Height" icon 2813d, a "Set lines parallel" icon 2813e, a "Rotate line endpoint to parallel baseline" icon 2813f, a "Set Z on two-line face" icon 2813g, a "Set Z on face" icon 2813h, a "Set Z on two-line face along pointed line" icon 2813i, and a "Set Z on the face along pointed line" icon 2813j. In some embodiments, the "Set point height to average" icon 2813b can enable a user 195 to calculate the average height of selected vertices and set it as the Z of each vertex. In some embodiments, the "Set point height to" icon 2813c can enable a user 195 to select a vertex as a base point, and set its height to another selected vertex. In some further embodiments, the "Change Point Height" icon 2813d can allow a user 195 to change the selected point height. Some embodiments include a "Set lines parallel" icon 2813e that can enable a user 195 to set all selected lines parallel to the ideal line. In some embodiments, the "Rotate line endpoint to parallel baseline" icon 2813f can enable a user 195 to rotate one endpoint to parallel the baseline. Further, some embodiments include a "Set Z on two-line face" icon 2813g that can enable a user 195 to set the point height on the face that is defined by two lines. In some embodiments, the "Set Z on face" icon 2813h can enable a user 195 to set a point height on the ideal face. In some embodiments, the "Set Z on two-line face along pointed line" icon 2813i can allow a user to set a point on a face along the pointed line, and the face is defined by the selected two lines. In some embodiments, the "Set Z on the face along pointed line" icon 2813j can enable a user to set a point on the selected face along the pointed line.

Figure 28D:

Some embodiments include tools 2815 as shown in FIG. 28D. In some embodiments, the tools 2815 can include at least one of a "Move Object" icon 2818a, a "Rotate Object" icon 2818b, a "Clone object" icon 2818c, a "Set Object on Roof" icon 2818d, a "Cut object" icon 2818e, an "Align objects on two-line face" icon 2818f, an "Align objects on face" icon 2818g, an "Align objects along base line" icon 2818h, an "Align Objects in row" icon 2818i, a "Object touch" icon 2818j, or an "Auto-Shape" icon 2818k. In some embodiments, the "Move Object" icon 2818a can enable a user 195 to shift a selected object. In other embodiments, the tools 2815 can include other functions. For example, the "Rotate Object" icon 2818b can enable a user 195 to rotate a selected object. The "Clone object" icon 2818c can enable a user 195 to clone a selected object. The "Set Object on Roof" icon 2818d can enable a user 195 to automatically set one object feet on the roof faces of another object in a batch. The "Cut object" icon 2818e can enable a user 195 to cut out an object by another selected object. The "Align objects on two-line face" icon 2818f can enable a user to make group objects aligned to a face that is defined by two base lines. The "Align objects on face" icon 2818g can enable a user 195 to make a group of objects aligned to a face. The "Align objects along base line" icon 2818h can enable a user 195 to make a group of objects align along (touching) a base line. The "Align Objects in row" icon 2818i can enable a user to make a group objects align in a row. The "Object touch" icon 2818j can enable a user 195 to make objects touch each other.

Figure 28E:
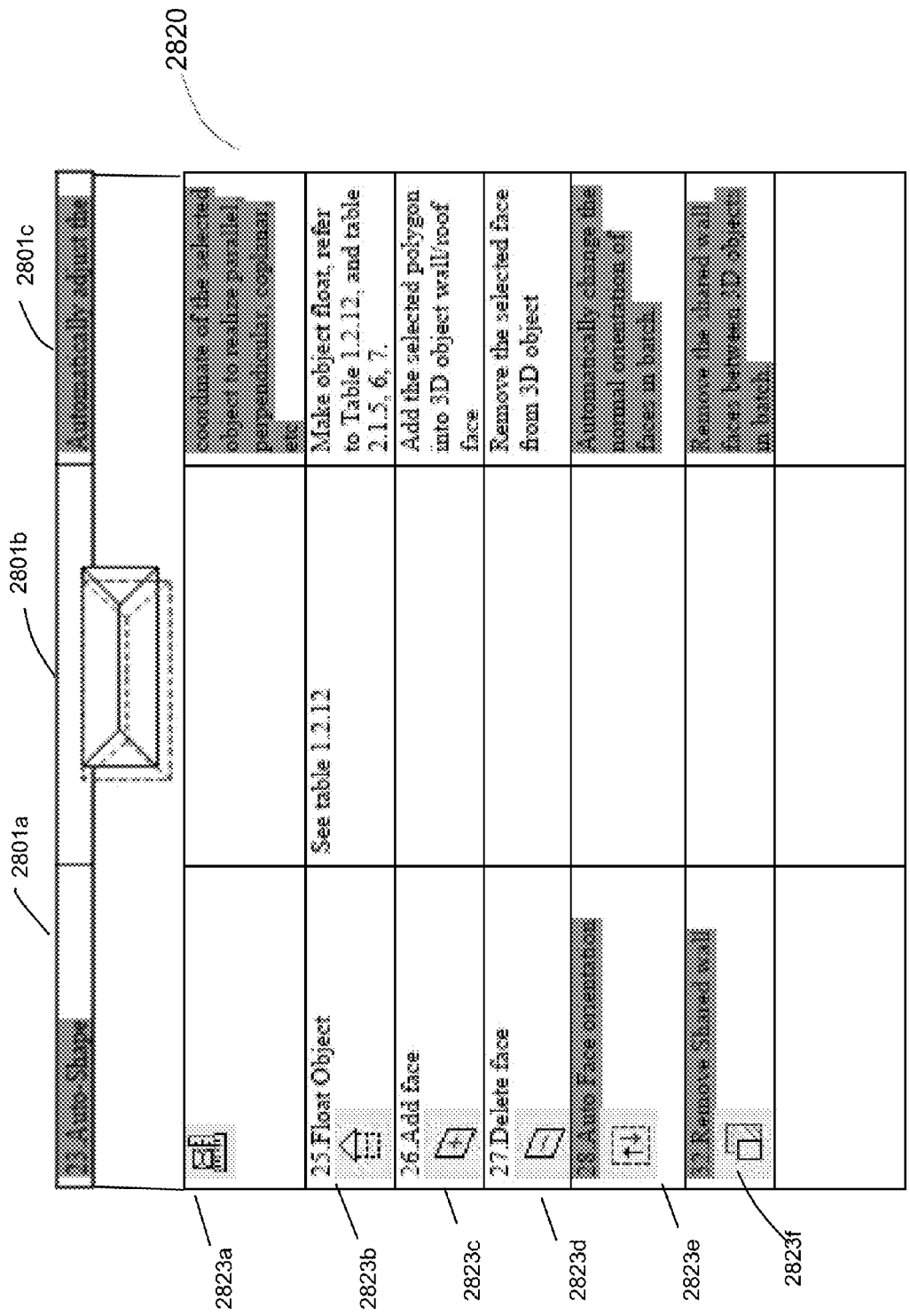

Some embodiments include FIG. 28E tools 2820. For example, in some embodiments, tools 2820 can include at least one of an "Auto-Shape" icon 2823a, a "Float Object" icon 2823b, an "Add face" icon 2823c, a "Delete face" icon 2823d, an "Auto Face orientation" icon 2823e, or a "Remove Shared wall" icon 2823f. In some embodiments, the Icon 2823a can enable a user 195 to automatically adjust the coordinate of the selected object to realize parallel, perpendicular, coplanar, etc. The "Float Object" icon 2823b can enable a user 195 to make an object float. The "Add face" icon 2823c can enable a user 195 to add the selected polygon into a three dimensional object wall or roof face. The "Delete face" icon 2823d can enable a user 195 to remove the selected face from a three dimensional object. The "Auto Face orientation" icon 2823e can enable a user to automatically change the normal orientation of faces in a batch. In some embodiments, the "Remove Shared wall" icon 2823f can enable a user 195 to remove the shared wall faces between three dimensional objects in a batch.

Figure 28F:
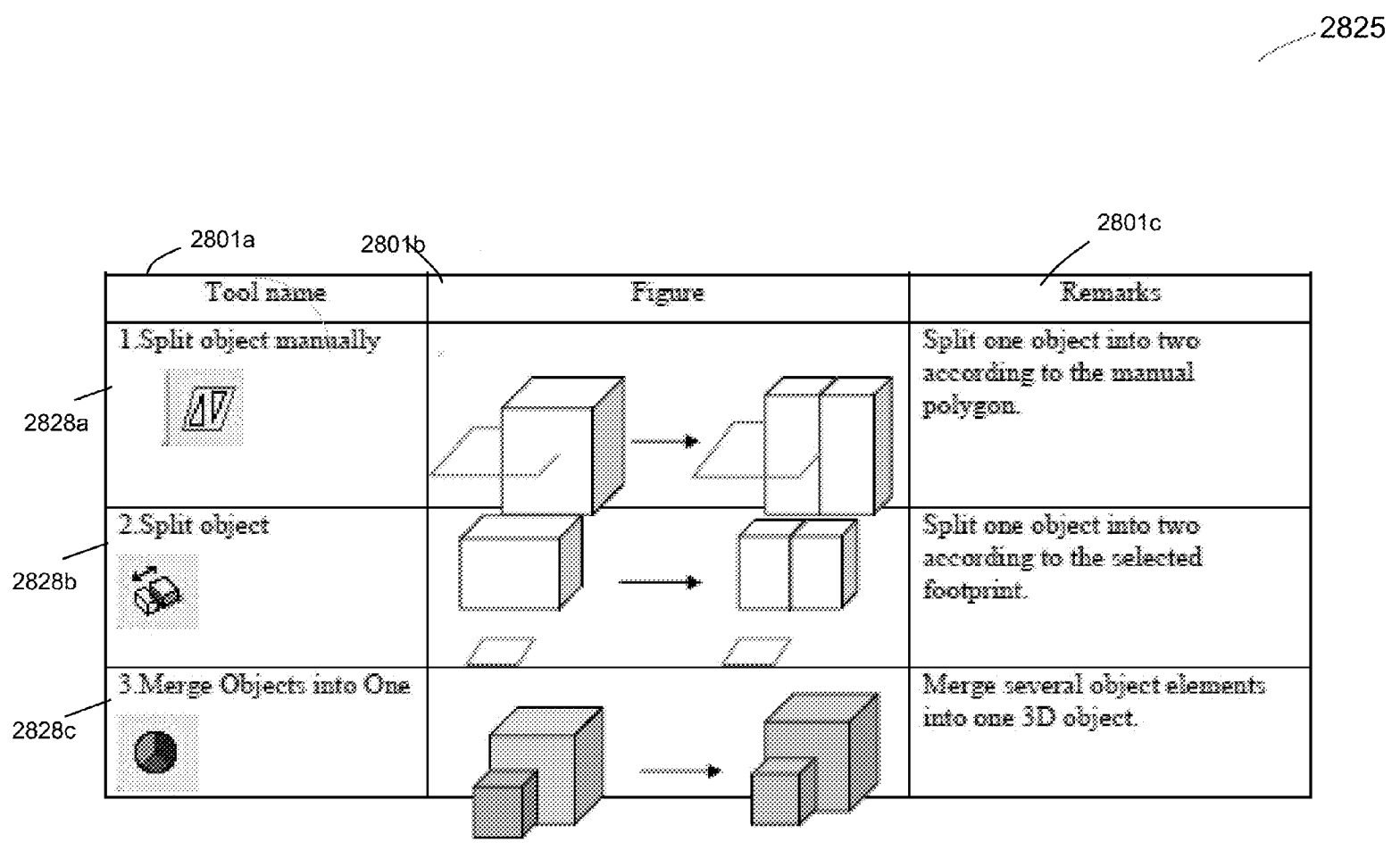

Some embodiments can include data integration tools. As described earlier, some embodiments of the invention include a system and method 10 comprising automated modeling 130 (FIG. 1B). Digital terrain models can be generated from one or more images, and DTM or an artificial height reference can be used to generate a three dimensional model (e.g., using a sub-task 133). For example, FIG. 28F-H is an example of the three-dimensional integration tools 2825, 2830, 2835 of one embodiment of the computer-implemented system and method 10. In some embodiments, the data integration tools 2825, 2830, 2835 can enable data processing from various data sources, including editing and merging of a plurality of three dimensional models. As shown in some embodiments FIG. 28F, tools 2825 can include a "Split object manually" icon 2828a, a "Split object" icon 2828b and a "Merge Objects into One" icon 2828c. In some embodiments, the "Split object manually" icon 2828a can enable a user 195 to split one object into two according to the manual polygon. The "Split object" icon 2828b can enable a user 195 to split one object into two according to the selected footprint. The "Merge Objects into One" icon 2828c can enable a user 195 to merge several object elements into one three dimensional object.

As depicted in FIG. 28G, tools 2830 can include at least one of "Create Object Base" icon 2833a, a "Create Overhang Roof" icon 2833b, a "Snap Wall to Inner wall" icon 2833c, an "Artificial Overhang Roof" icon 2833d, a "Group Object" icon 2833e, a "Label objects in Fence" icon 2833f, or a "Classify objects in Fence" icon 2833g. In some embodiments, the "Create Object Base" icon 2833a can enable a user 195 to create an object base. The "Create Overhang Roof" icon 2833b can enable a user 195 to create an overhang roof by integrating the selected three dimensional object and the referenced footprint. The "Snap Wall to Inner wall" icon 2833c can enable a user 195 to snap a wall to another inner wall. The "Artificial Overhang Roof" icon 2833d can enable a user 195 to create an overhang wall for all houses within a fence. The "Group Object" icon 2833e can enable a user 195 to group three dimensional objects within a fence into a building, label three dimensional objects in one building with the same "EGID" code, derive the "FootBase" for each building and put it in level "MAP-POLYGON". The "Label objects in Fence" icon 2833f can enable a user 195 to group three dimensional objects in fence into one building by the reference footprint, and to label the three dimensional objects in one building with the same "EGID" code. The "Classify objects in Fence" icon 2833g can enable a user 195 to classify the three dimensional object type.

FIG. 28H shows tools 2825 including "Pack building in fence" icon 2838a, a "Cut Roof" icon 2838b, and a "Set Object in Fence on DTM" icon 2838c. In some embodiments, the "Pack building in fence" icon 2838a can enable a user 195 to remove all the shared inner walls of three dimensional objects inside of one building. The "Cut Roof" icon 2838b can enable a user 195 to remove all the shared inner roof faces of three dimensional objects inside of one building. The "Set Object in Fence on DTM" icon 2838c can enable a user 195 to set the ground foot of each building on the DTM.

Figure 28I:
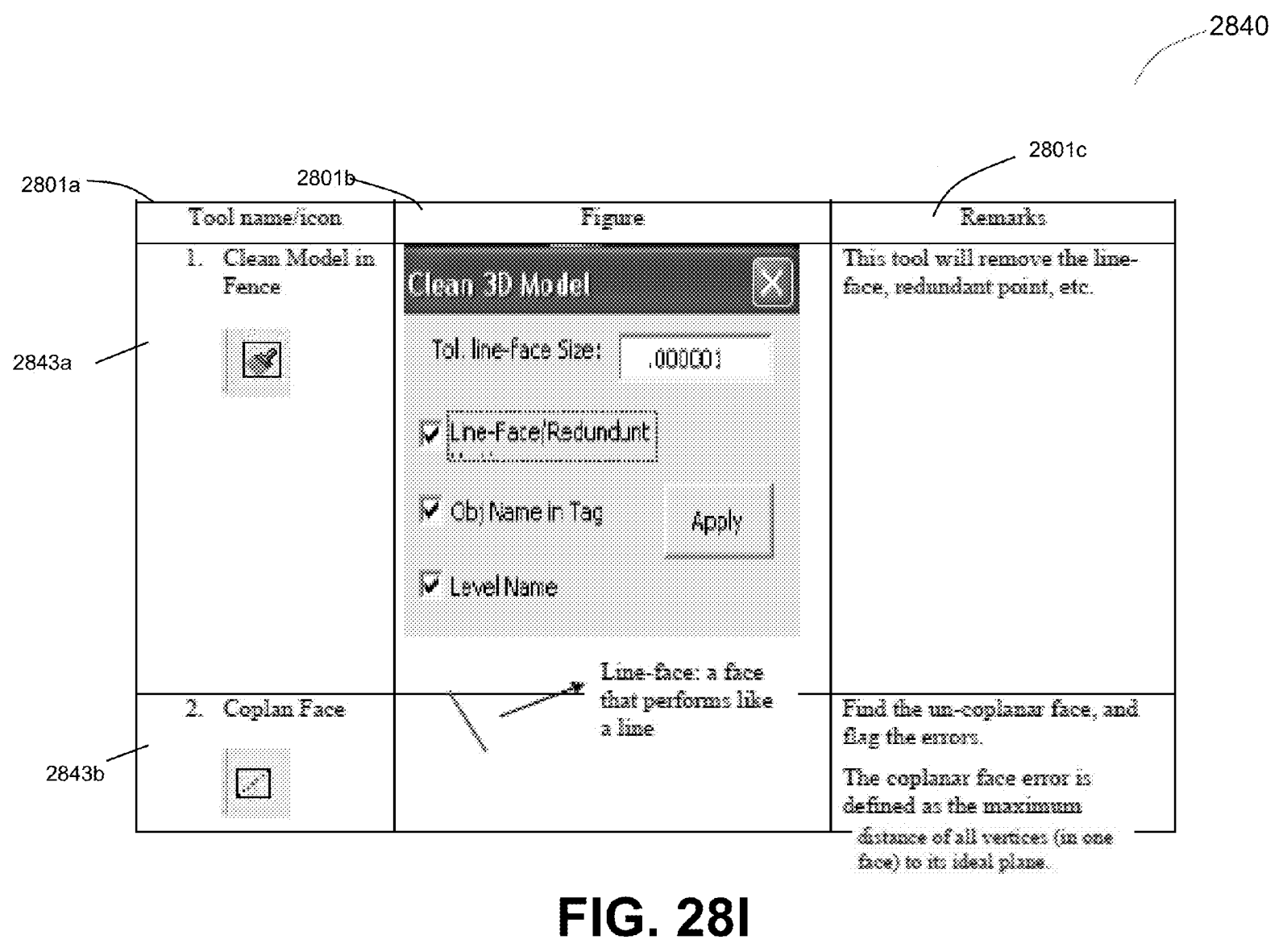

Some embodiments of the system and method 10 can include alternative functions, including, but not limited to quality control tools. For example, as illustrated in FIGS. 28I-K, three-dimensional geometric models can be refined using one or more of the tools 2840, 2845, 2850. In some embodiments, one or more features of a three dimensional geometric model can be modified to correct or alter one or more geometric defects. In some embodiments, one or more features can be added to the three dimensional geometric model. Since almost all photogrammetric systems support "Snap", "Parallel", and "Perpendicular" functions in data capture, the "Auto Shape" feature of the system and method 10 reduces the manual work time to edit coplanar, parallel, perpendicular etc. For example, FIG. 28I can include tools 2840 comprising "Clean Model in Fence" icon 2843a, and "Coplan Face" icon 2843b. In some embodiments, the "Clean Model in Fence" icon 2843a can enable a user 195 to remove the line face and redundant points. The "Coplan Face" icon 2843b can enable a user 195 to find the un-coplanar face and flag the errors.

FIG. 28J illustrates one embodiment of the invention including tools 2845. As shown, the tools 2845 can include at least one of a "Object splitting" icon 2848a, a "Duplicated Object" icon 2848b, a "Vertix Snap" icon 2848c, a "Wall fits Roof" icon 2848d, a "Reorder Object Structure" icon 2848e, an "Object Border (Face)" icon 2848f, an "Object Touching" icon 2848g, or a "Building Touching" icon 2848h. In some embodiments, the "Object splitting" icon 2848a can enable a user 195 to check if all objects are split by the referenced footprint, and flag the errors. The "Duplicated Object" icon 2848b can enable a user 195 to find the duplicated three dimensional object, and remove/flag the errors. The "Vertix Snap" icon 2848c can enable a user 195 to check if vertices inside snap-box are snapped, and flag the error. The "Wall fits Roof" icon 2848d can enable a user 195 to check if the top wall fits the roof and flag the error. The "Reorder Object Structure" icon 2848e can enable a user 195 to check and correct the three dimensional object cell structure. The "Object Border (Face)" icon 2848f can enable a user 195 to check if all objects are missing a face and flag the errors. The "Object Border (Face)" icon 2848g can enable a user 195 to check if all objects inside one building touch each other, and flag the error. The "Object Touching" icon 2848h can enable a user 195 to check if buildings touch each other along the footprint.

FIG. 28K illustrates tools 2850 that can comprise a "SP on Roof" icon 2853a, an "Object Classification" icon 2835b, a "Missing Tag" icon 2853c, a "Check/correct Face Orien" icon 2853d, a "Debug QA Error Marks" icon 2853e, or a "QA in Batch" icon 2853f. In some embodiments, the "SP on Roof" icon 2853a can enable a user 195 to check if "SP(SS)" sets on roof faces of basic building structure (using the referenced footprint). The "Object Classification" icon 2835b can enable a user 195 to check the object type code "(BB=1, FBB=2, SP(SS)=0)", and flag the errors. The "Missing Tag" icon 2853c can enable a user 195 to find the three dimensional object missing the tag elements, flag the errors, or create the missing tag. The "Check/correct Face Orien" icon 2853d can enable a user 195 to check and flag the face orientation. The "Debug QA Error Marks" icon 2853e can enable a user 195 to check error marks individually. The "QA in Batch" icon 2853f can enable a user 195 to quality check by batch and create quality assurance report.

Figure 28L:
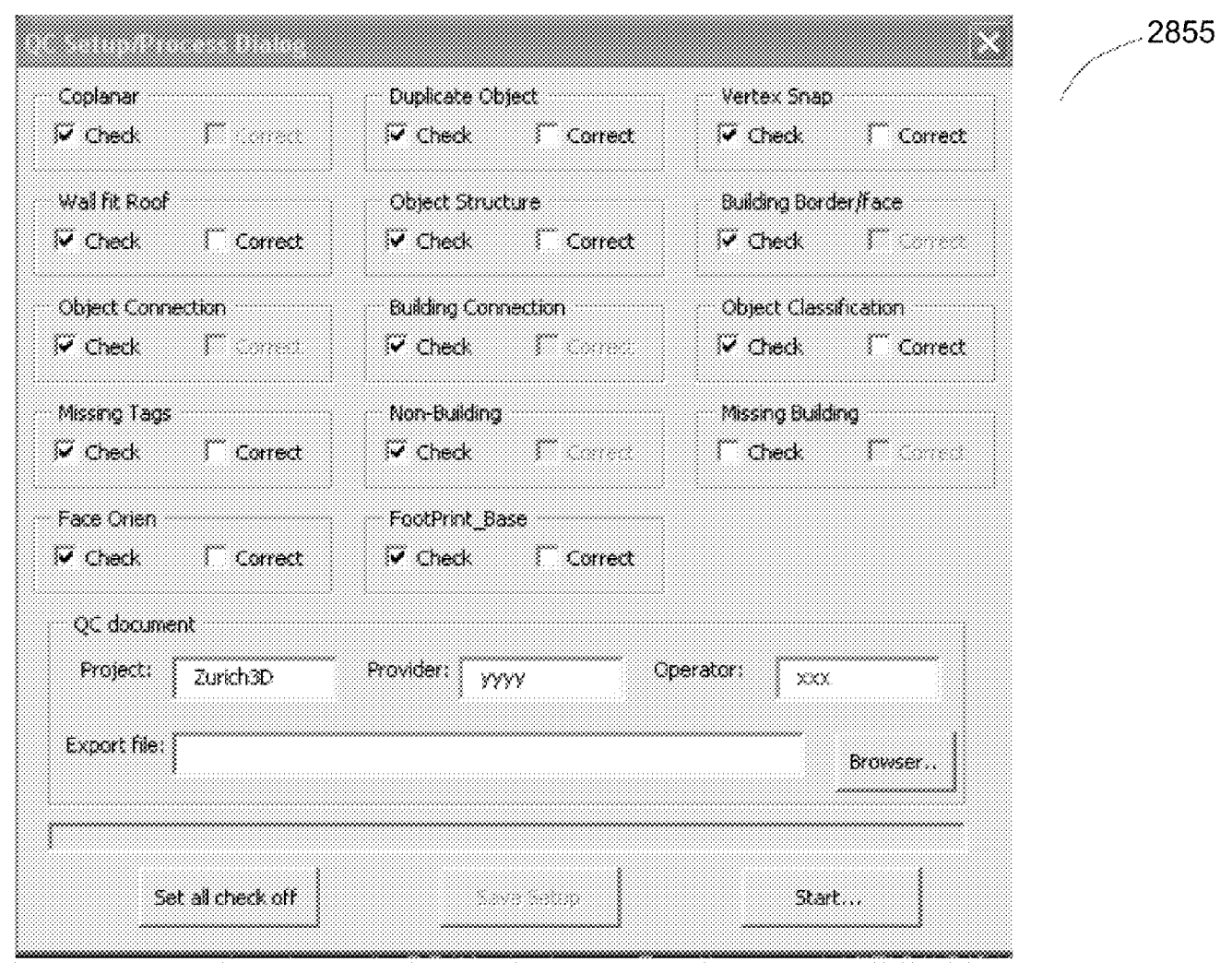

As discussed earlier, the system and method 10 includes various automated or semi-automated modules. In this instance, the system and method 10 can process a plurality of data files following a single set of instructions. The plurality of data files can be automatically processed in sequence, or in parallel. In some embodiments, a specific geometric modeling procedure can be performed in a batch mode by the system and method 10. Furthermore, one or more components or modules of the computer system and method 10 can be integrated to perform any or all analyses and actions automatically. Moreover, data inputs from others systems, can be automatically integrated into the system and method 10 rather than batch uploaded. These fully integrated solutions can be programmed to adjust in real-time to any new data input. For example, the user can select one or more data sources and one or more projects, and instruct the system and method 10 to process one or more data sources and/or one or more projects. In some embodiments, the one or more data sources and/or one or more projects can be run in parallel. In other embodiments, the one or more data sources and/or one or more projects can be run in series. In some embodiments, the one or more data sources and/or one or more projects can run sequentially and in parallel at different times. For example, FIG. 28L illustrates a GUI 2855 as an example of the batch processing tools 2801a of one embodiment of the computer-implemented system and method 10.

Figures 29A, 29B:
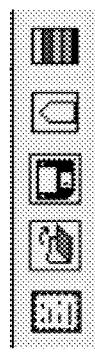
FIG. 29A provides an illustration of a tool icons GUI according to one embodiment of the computer-implemented system and method implemented in a Microstation® platform.
FIG. 29B provides an illustration of a control parameters tool icons GUI according to one embodiment of the computer-implemented system and method implemented in a Microstation® platform.
Figure 29C:
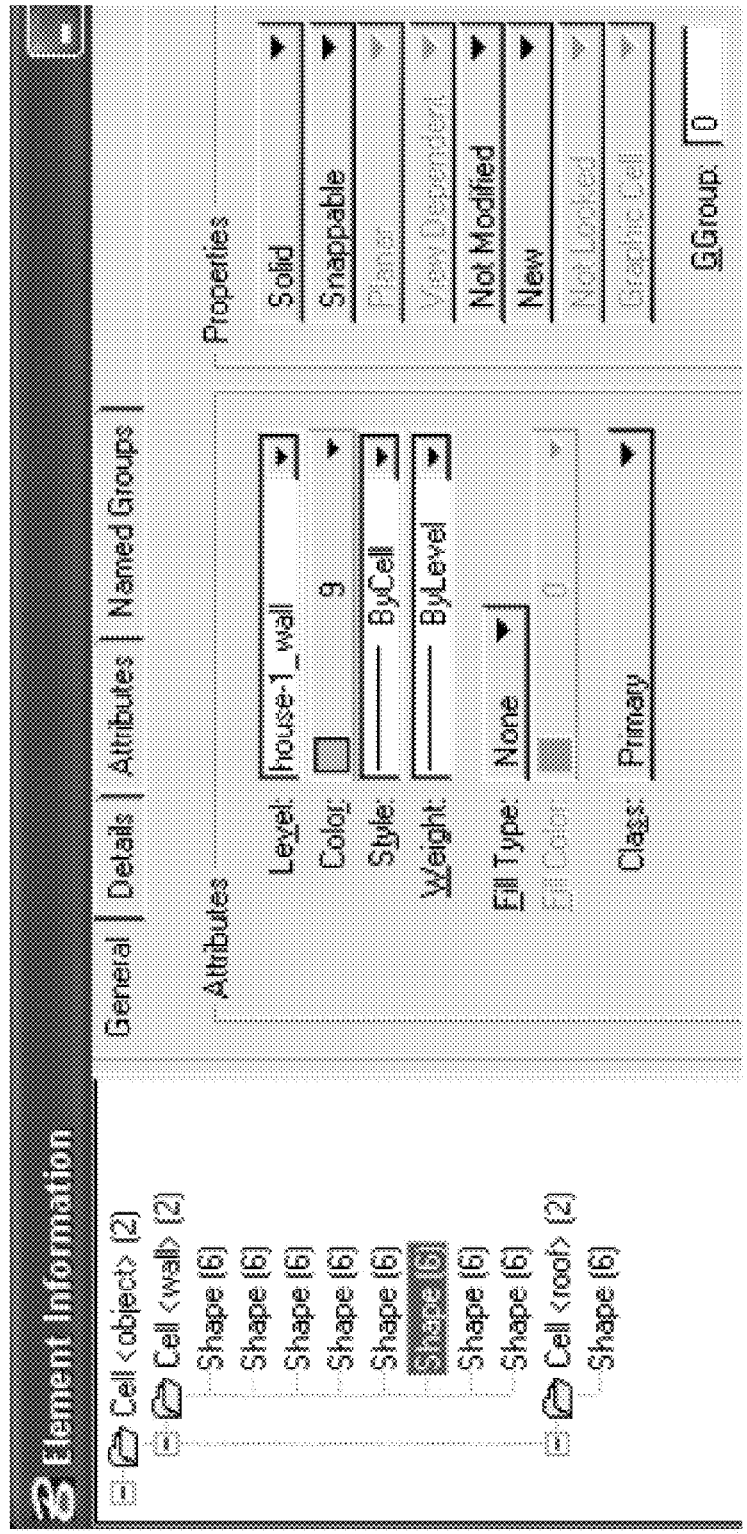
FIG. 29C illustrates a geometry structure window according to one embodiment of the computer-implemented system and method implemented in a Microstation® platform.
Figure 29D:
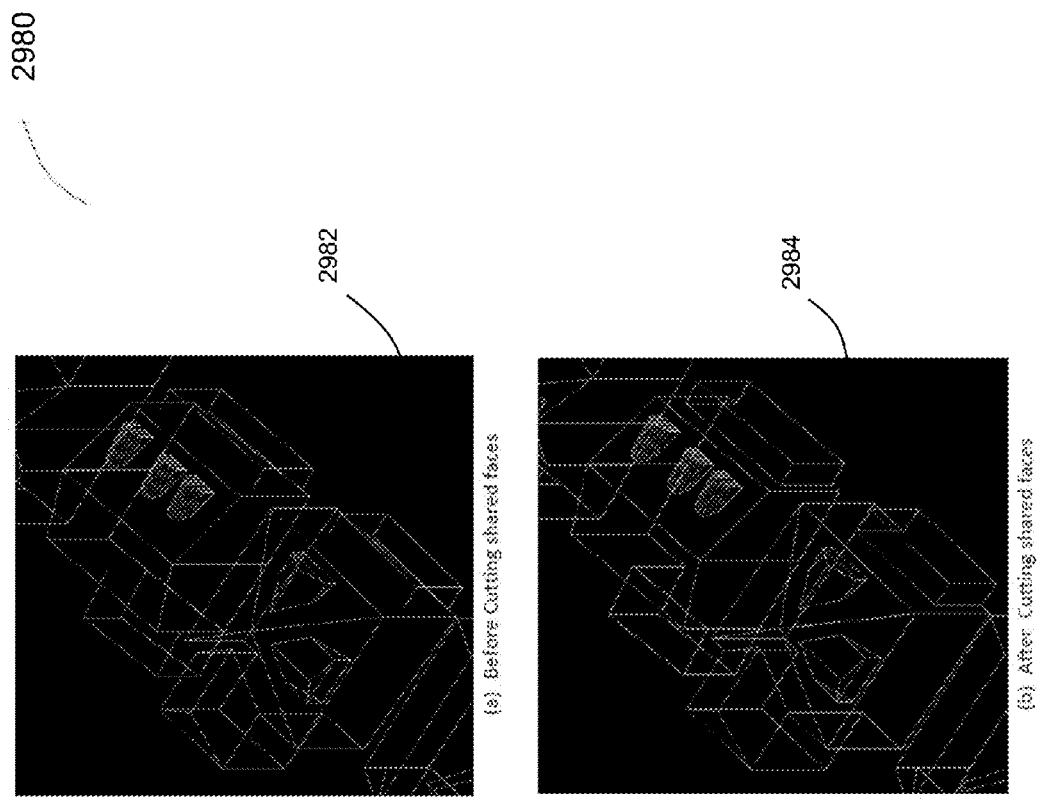
FIG. 29D illustrates a geometry face cut operation according to one embodiment of the computer-implemented system and method implemented in a Microstation® platform.
Figure 30:
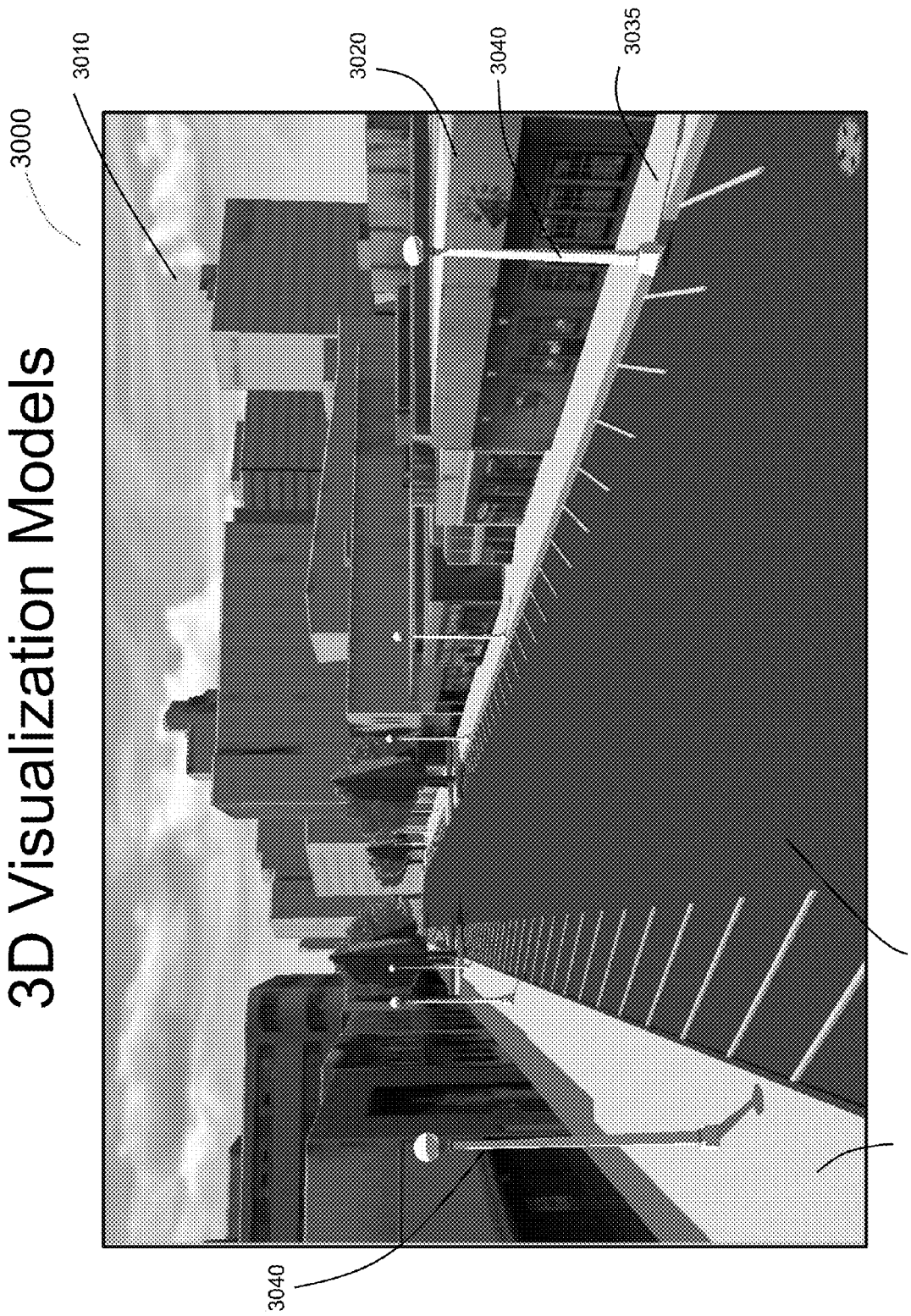
FIG. 30 illustrates an example of a rendering showing a three dimensional visualization modeling according to one embodiment of the computer-implemented system and method.

Some embodiments of the invention include one or more graphical user interfaces can enable a user 195 to access various tools and functions of the computer-implemented system and method 10. For example, FIG. 29A provides an illustration of a tool icons GUI 2900 according to one embodiment of the computer-implemented system and method 10 implemented in a Microstation® platform 240. Further, FIG. 29B provides an illustration of a control parameters tool icons GUI 2920 according to one embodiment of the computer-implemented system and method 10 implemented in a Microstation® platform 240, and FIG. 29C illustrates a geometry structure window 2940 according to one embodiment of the computer-implemented system and method 10 implemented in a Microstation® platform 240. FIG. 29D illustrates a geometry face cut operation 2980 according to one embodiment of the computer-implemented system and method 10 implemented in Microstation® platform 240. In this instance, the system and method 10 can generate a building structure window 2982 including a rendering of a building or structure before cutting shared faces, and a building structure window 2984 including a rendering of a building or structure after cutting shared faces.

Some embodiments of the system and method 10 can include various functions and tools for data visualization. For example, in some embodiments, one or more modules of the system and method 10 can build and render a street of a municipality comprising at least one building. In the example embodiments rendered in the GUI 3000 of FIG. 30, a three dimensional visualization model of a street scene 3010 includes a plurality of buildings 3020, on a street 3030. As shown, the street can also include one or more sidewalks 3035, and street furniture such as lamp-posts 3040.

Figure 31:
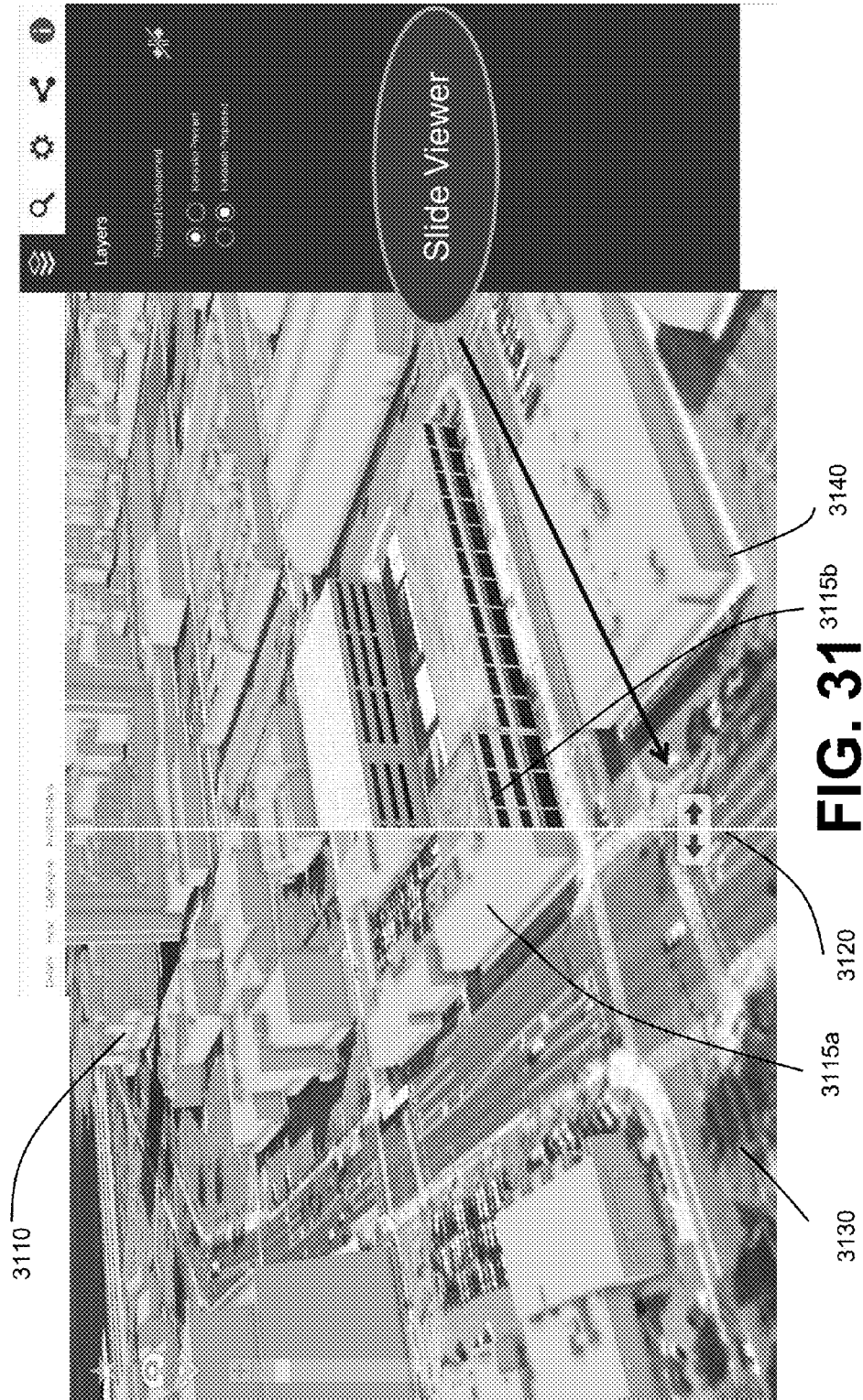
FIG. 31 illustrates an example of a rendering showing a municipality plan comparison according to one embodiment of the computer-implemented system and method.

Some embodiments of the system and method 10 can include alternative functions, including, but not limited to data visualization for architectural planning. For example, FIG. 31 illustrates an example GUI 3100 illustrating a rendering of a municipality plan comparison 3110 according to one embodiment of the computer-implemented system and method 10. In some embodiments, a slide viewer function 3120 can be used to control renderings within a first window 3130 and a second window 3140 of the municipality plan comparison 3110. In some embodiments, a user 195 can move the slide viewer function 3120 to the left or right to enlarge or reduce either the first window 3130 or the second window 3140 and to change a displayed design of one or more buildings or structures within the municipality plan comparison 3110. For example, in some embodiments, a user can review a plan design of a building 3115a shown in the first window 3130 by sliding the slide viewer function 3120 to the left to render a version 3115b of the building 3115a showing more architectural detail.

Figure 32:
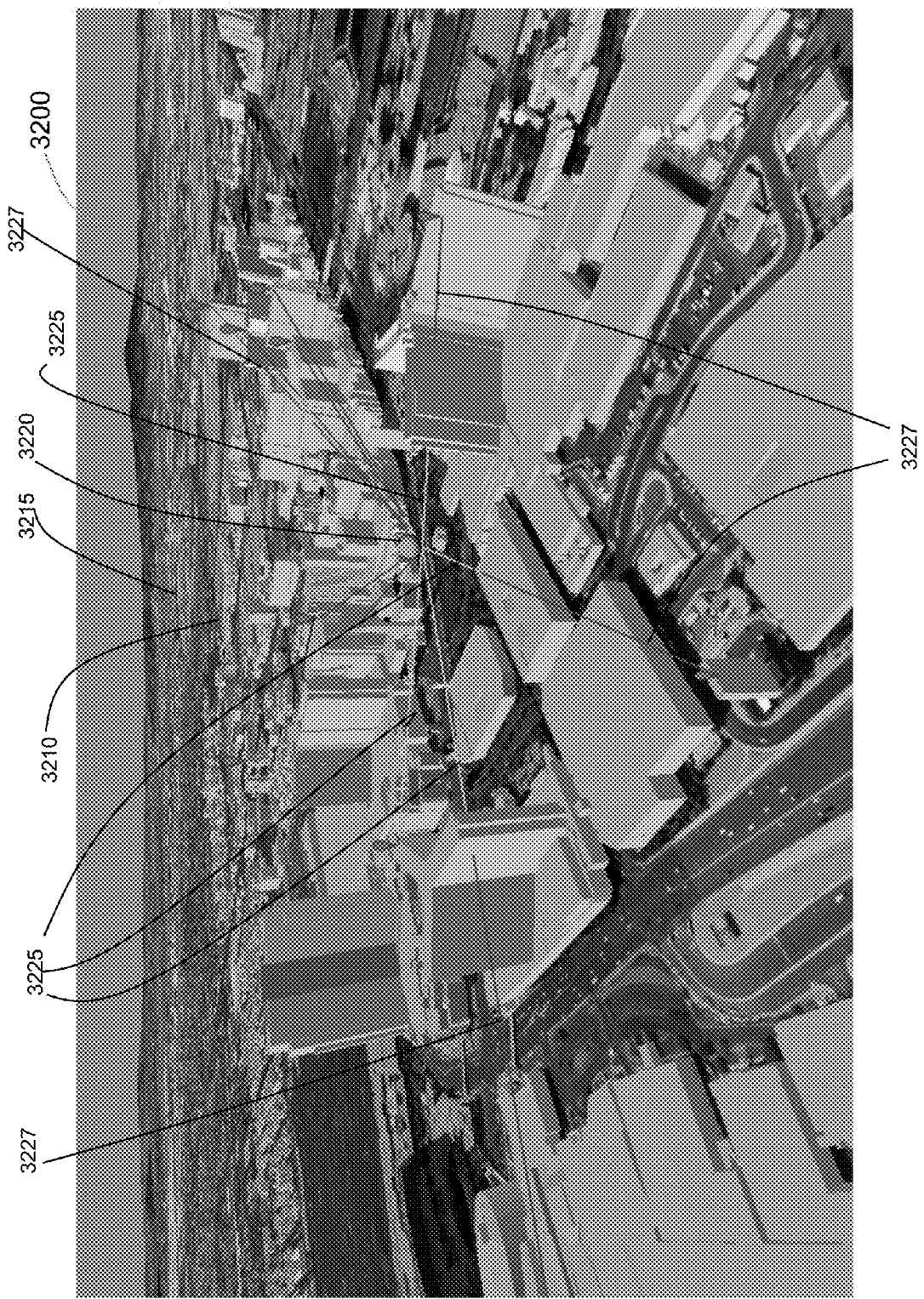
FIG. 32 illustrates a rendering with a line of site tool according to one embodiment of the computer-implemented system and method.

Some embodiments of the system and method 10 can include data visualization and line of site analysis. For example, FIG. 32 illustrates a rendering 3200 of a city view 3210 including a plurality of buildings or structures 3215, and a rendered line of site tool 3220 according to one embodiment of the computer-implemented system and method 10. In some embodiments, the line of sight tool 3220 can calculate an inter-visibility between pairs of points (i.e., what is visible along the lines between these points) given the position of the points in three dimensional space relative to a surface or features of at least one structure within the city view 3210. For example, as illustrated in FIG. 32, in some embodiments one or more lines 3225 can extend from a rendered line of sight tool 3220. In some embodiments, one or more of the lines 3225 can be made to appear to pass into one or more of the buildings or structures 3215 and pass outward from the one or more of the buildings or structures 3215 as one or more lines 3227. Lines 3225 can comprise a line of sight extending from a position of the line of sight tool 3220 that would be visible to a user 195 when viewing from a position of the line of sight tool 3220, and lines 3227 can comprise a line of sight that would not be visible to a user 195 when viewing from a position of the line of sight tool 3220. In some embodiments, lines 3225 and lines 3227 can be rendered differently to enable a user to visually distinguish at least one of the lines 3225 over at least one of the lines 3227. For example, in some embodiments, one or more of the lines 3227 can be rendered in a red color, and one or more of the lines 3225 can be rendered in a green color. In some other embodiments, the lines 3225, 3227 can be rendered in other colors. In some further embodiments, lines 3225, 3227 can be rendered in one or more graphical patterns (e.g., such as a dotted or dashed line). In this instance for example, one or more of the lines 3225 can be rendered in a solid line and one or more of the lines 3227 can be rendered as a dashed or dotted line.

Figure 33:
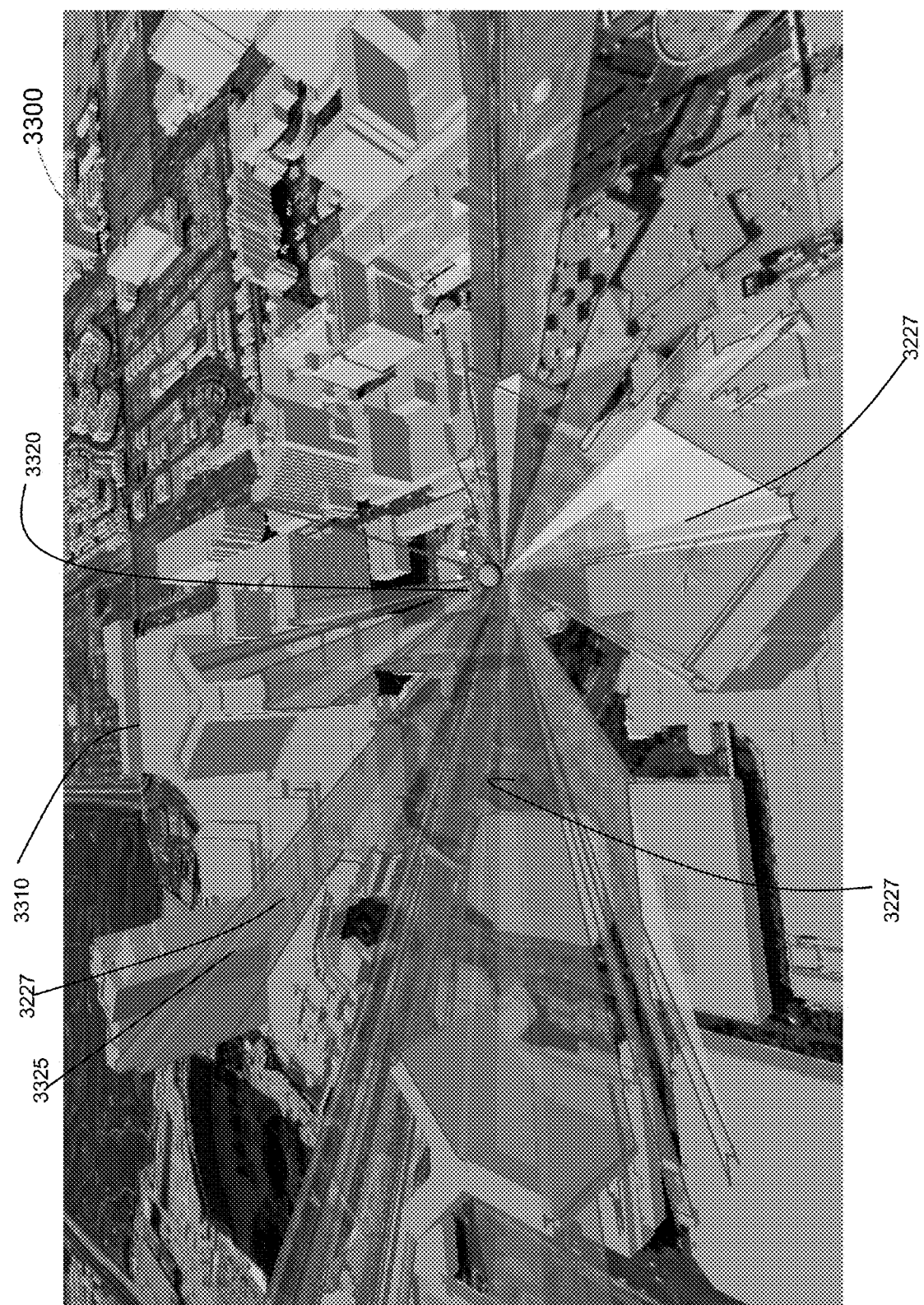
FIG. 33 illustrates a rendering with a skyline tool according to one embodiment of the computer-implemented system and method.

Some embodiments of the system and method 10 can include alternative functions, including, but not limited to skyline visualization for a municipality. For example, FIG. 33 illustrates a rendering 3300 of a city view 3310 with a skyline tool 3320 according to one embodiment of the computer-implemented system and method 10. In some embodiments, the skyline tool 3320 can generate at least one three dimensional polyline 3325 representing the line that divides the sky from the surface and/or features that touch the sky, based from the perspective of the observer location. In this instance, an observer point (such as a functional or virtual surface, a range of from and to azimuths, or other features that typically represent buildings) can be added as at least one input variable. As illustrated, a region of visibility can be rendered visible to a user 195 using a rendered region 3227. In this instance, the rendered region 3227 can comprise a region of visibility extending from a position of the skyline tool 3320 that would be visible to a user 195 when viewing from a position of the skyline tool 3320 within the city view 3310. In some embodiments, the rendered region 3227 can be rendered in a color (e.g., a grey color) defined anywhere within a boundary of the polyline 3325. In some other embodiments, the rendered region 3227 can be rendered in other colors or color combinations or colored patterns. In other embodiments, the rendered region 3227 rendered in one or more graphical patterns (e.g., such as a dotted, dashed, or other patterned fill). In some embodiments, the rendered region 3227 can be made to appear opaque within the city view 3310 so that a user 195 can retain a view of the city view 3310 regardless of the position and area of coverage of the rendered region 3327.

Figure 34:
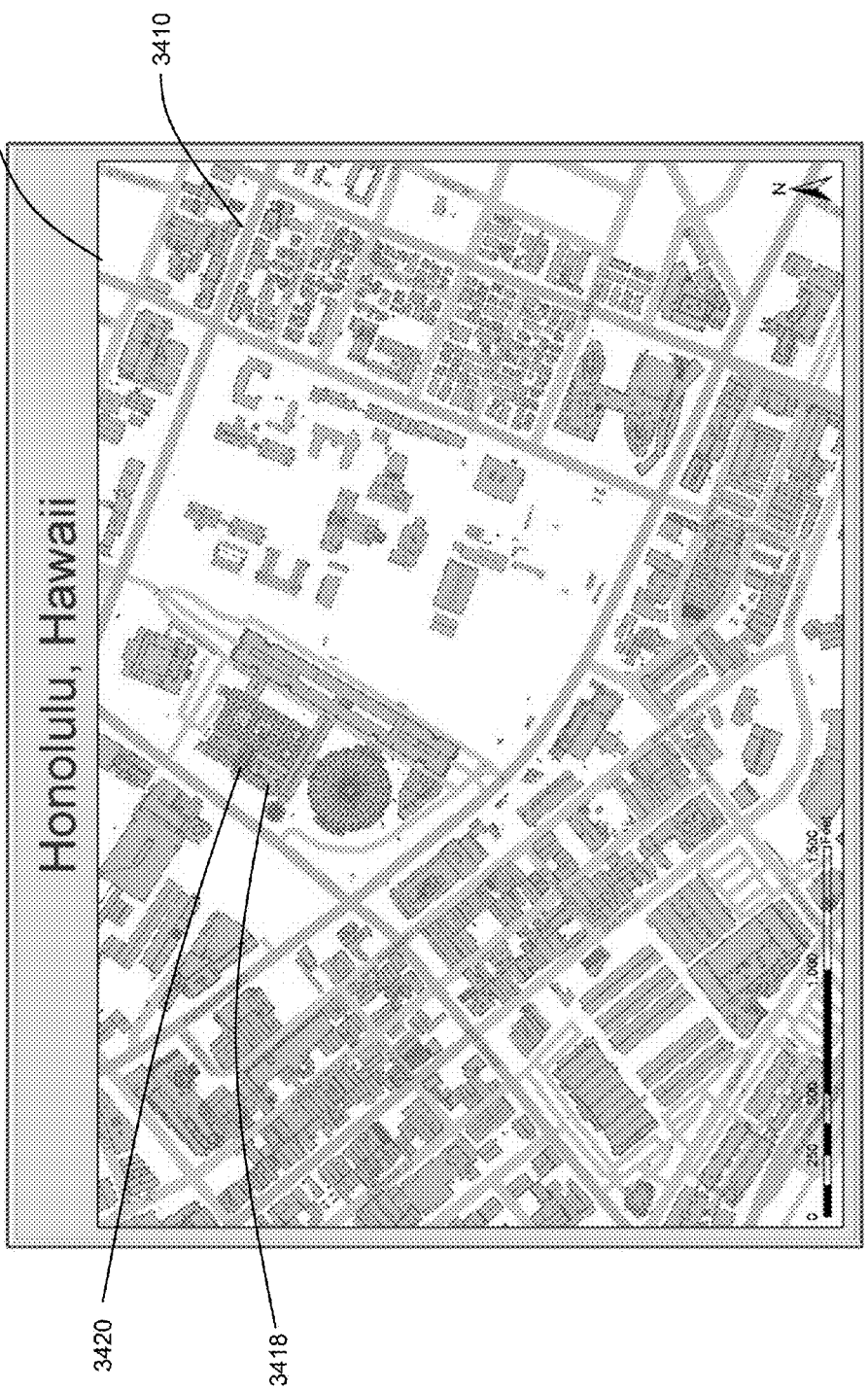
FIG. 34 illustrates a rendering of an architecture detail tool according to one embodiment of the computer-implemented system and method.
Figure 35A:
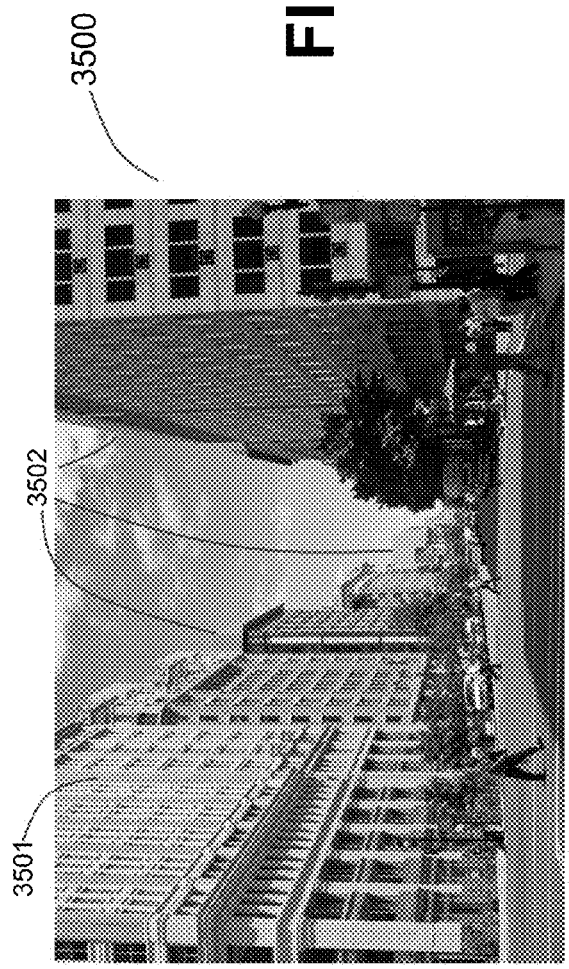
Figure 35B:
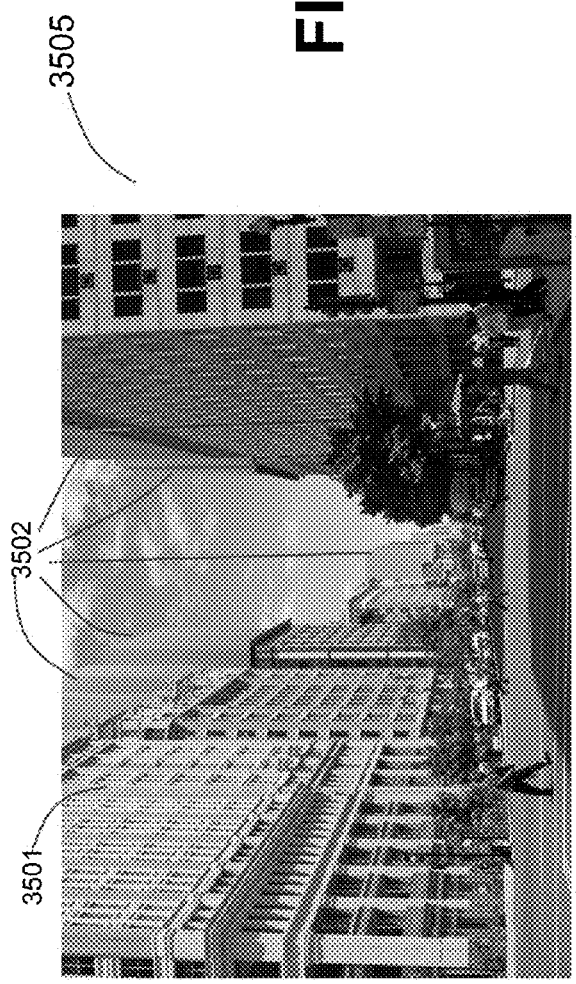
Figure 35C:
Figure 35D:
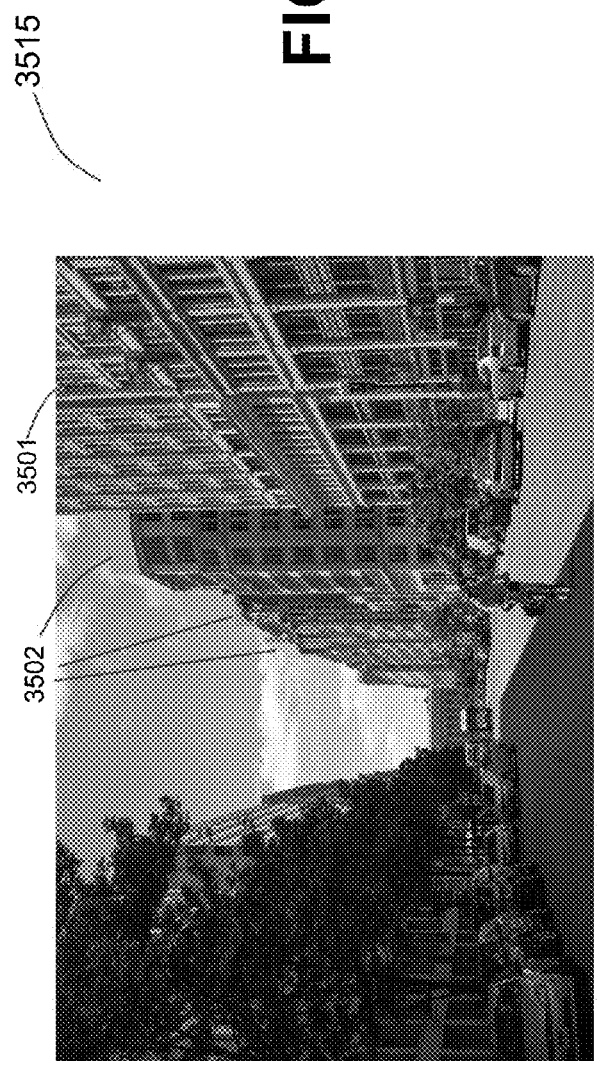
Figure 35E:
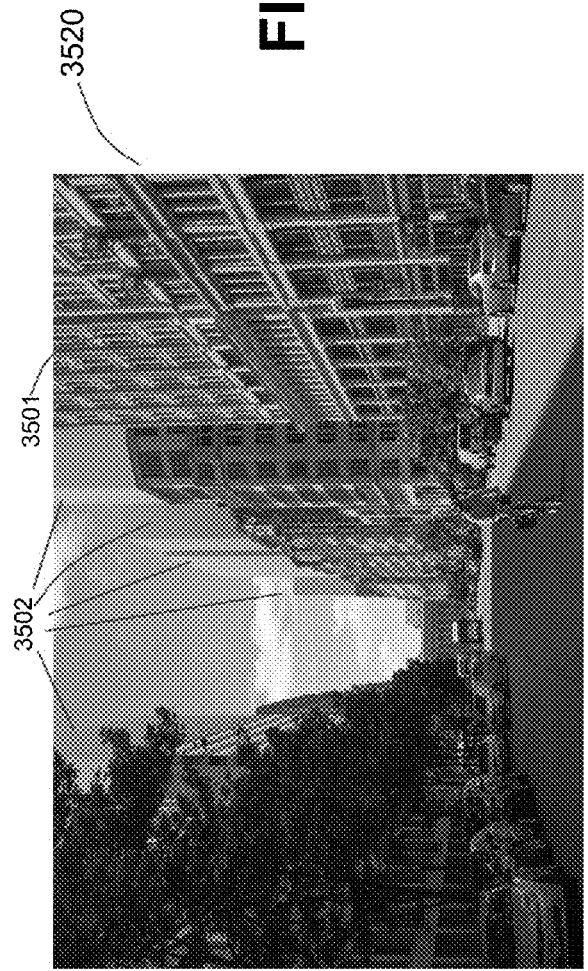
Figure 35F:
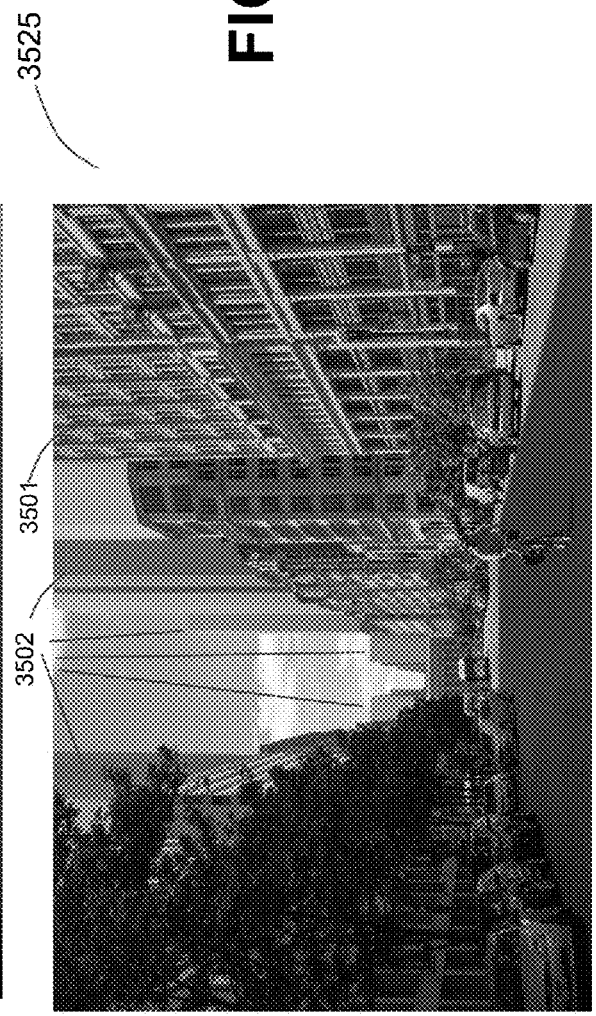
Figure 35G:
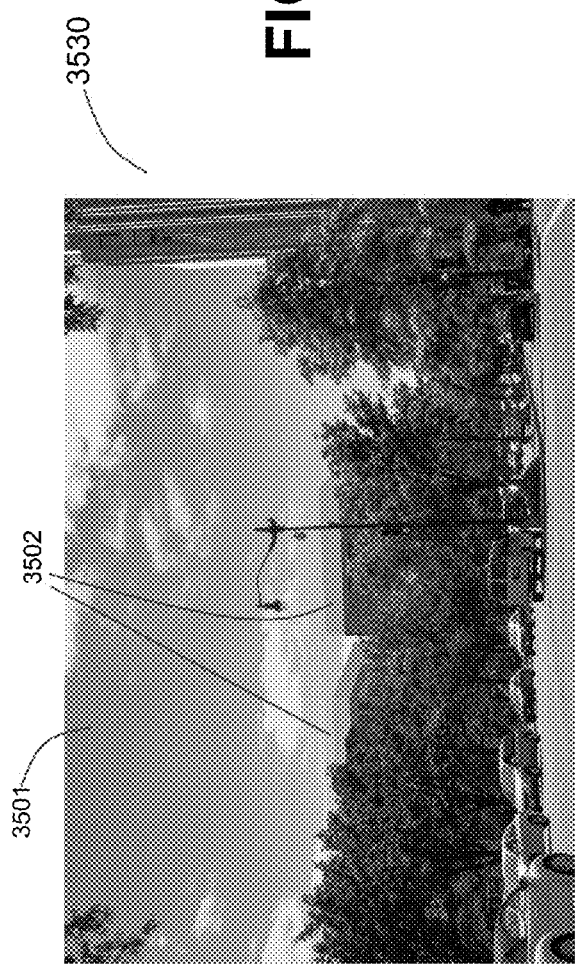
Figure 35H:
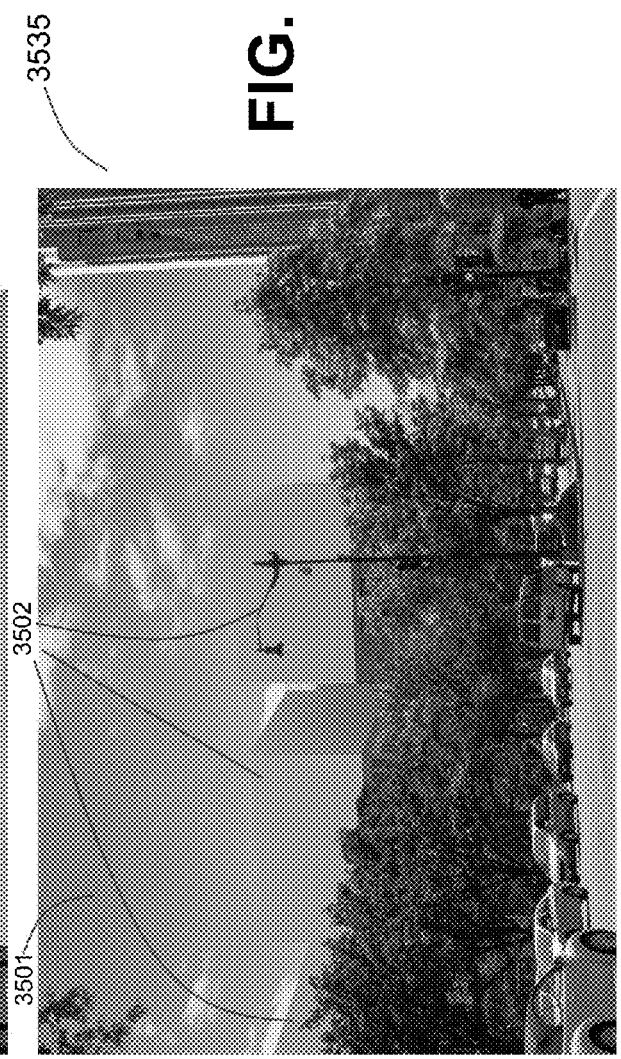
Figure 35I:
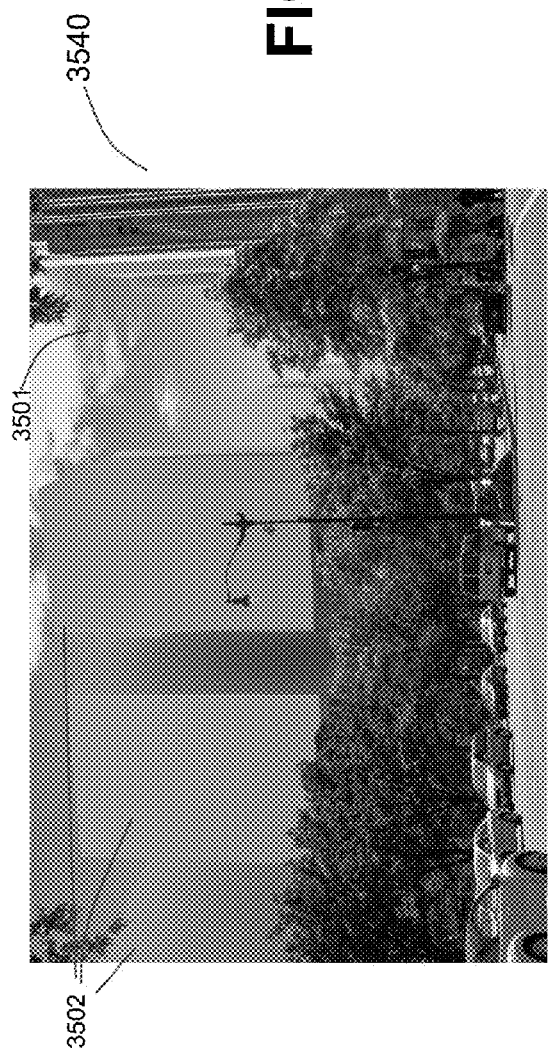
Figure 35J:
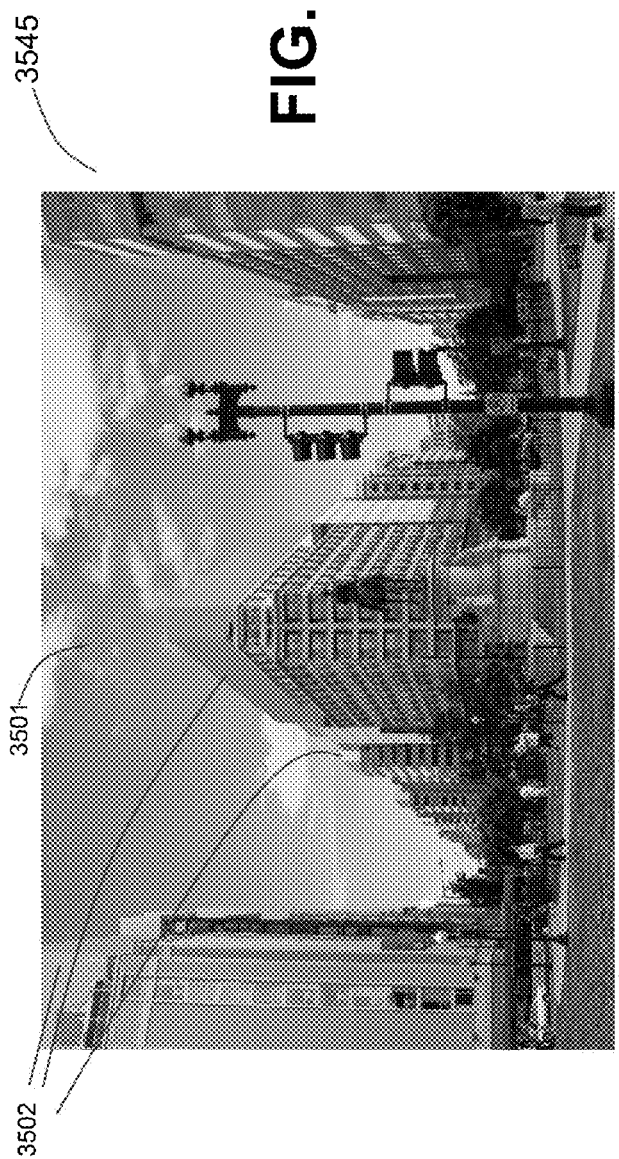

Some embodiments of the system and method 10 can include architectural detail rendering. For example, FIG. 34 illustrates a rendering 3400 including a plurality of building foot-prints 3401 of an architecture detail tool according to one embodiment of the computer-implemented system and method 10. In some embodiments, the system and method 10 can enable a user 195 to enhance traditional building footprints 3410 with one or more architectural details 3420. As shown in the example of FIG. 34, the building foot-prints can include architectural details, such as the building 3418 comprising architectural detail 3420.

In further embodiments, the structural relationship to building height modeling and comparison can be calculated and assessed. For example, as shown in the renderings 3500, 3505, 3510, 3515, 3520, 3525, 3530, 3535, 3540, 3545, 3550, 3555 in FIGS. 35A-L comprising a plurality of buildings 3501, three dimensional visualization models of various building height extensions 3502 can be calculated and rendered by the computer-implemented system and method 10. The building height extensions 3502 can be rendered onto at least one of the plurality of buildings 3501, extending the rendered height of the building. In some embodiments, essentially any geospatial reference requiring built environment information can be derived from some embodiments of this invention. These embodiments result in improved results for building height rules and city building parameters as they relate to architecture, utilities, public works and/or public safety.

Figure 36A:
FIG. 36A illustrates one example of an augmented reality rendering with GIS three dimensional geometry applied with real-time data information according to one embodiment of the computer-implemented system and method.

In some embodiments, the system and method 10 can render at least one building or structure including augmented reality information. Augmented reality is an overlap between the virtual and the real world. It is related to a more general concept called mediated reality, in which a view of reality is modified (possibly even diminished rather than augmented), by a computer. As a result, the technology functions by enhancing one's current perception of reality. An image is augmented when some visual graphics or texts are superimposed into the actual real world view to enhance the user experience in the real environment. The extra information provided with the help of augmented reality can create an improved experience for the user 195, and can aid in understanding information displayed to the user 195. Some embodiments can include computer generated graphics (two dimensional and three dimensional) that are merged with the imagery of the real world, and therefore can provide a superior experience to the user 195 in the real world. In some embodiments, augmented reality applications can be deployed with the help of smart phones, tablets, kiosks, and web-based applications. In some embodiments, an application is downloaded to a mobile phone, or web-based applications and/or kiosks can be used. The only requirement is that the product in which the application is being downloaded should be camera enabled. Some embodiments include various types of products that use augmented reality, including, but not limited to smart phones, eye wear, tablets, head-mounted displays, head-up displays, watches, clip-on devices, and other wearable computers. For example, FIG. 36A illustrates one example of an augmented reality rendering 3600 with GIS three dimensional geometry applied with real-time data information according to one embodiment of the computer-implemented system and method 10. As shown, a street scene 3610 with building renderings 3615 can be calculated and displayed to a user 195, and can include address information 3620 and heading information 3623 rendered over the scene 3610. In some embodiments, a user 195 can control the address information 3620 and heading information 3623 by moving within the scene 3610 and/or by selecting one or more of the building renderings 3615.

Figure 36B:
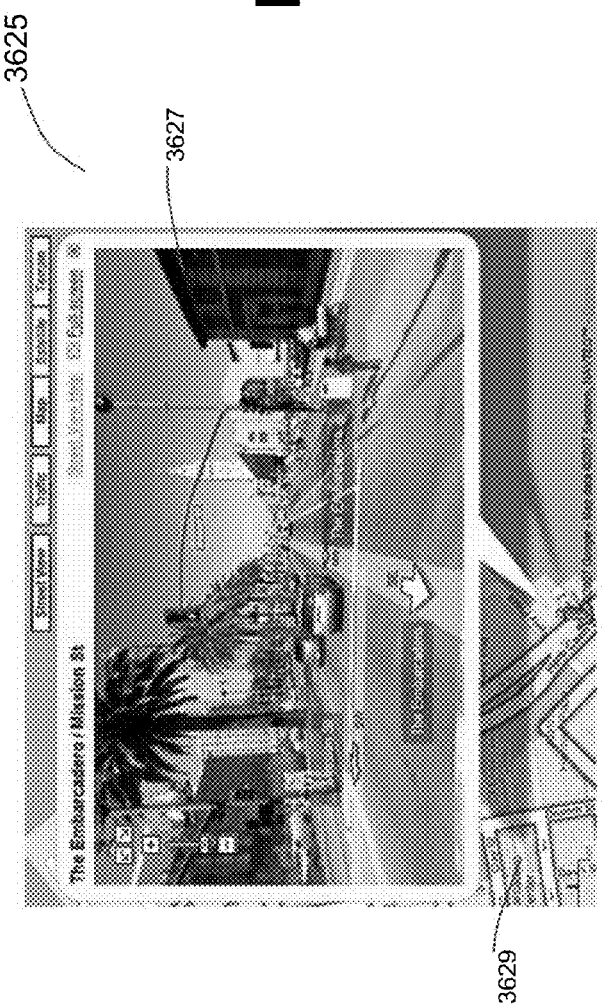
FIG. 36B illustrates one example of an intermediate step to three dimensional augmented reality rendering with real-time data information according to one embodiment of the computer-implemented system and method.

In some embodiments, an intermediate step to three dimensional augmented reality rendering display can include a three dimensional building geometry projected within various graphics platforms including Google Street View™ mapping service. For example, FIG. 36B illustrates one example of an intermediate step to three dimensional augmented reality rendering 3625 with real-time data information according to one embodiment of the computer-implemented system and method 10. In this example, the system and method 10 can render the three dimensional building geometry 3627, projected to a user 195 within Google Street View™ mapping service 3629. Google and the Google logo, and Google Street View™ are registered trademarks of Google Inc.

Figure 36C:
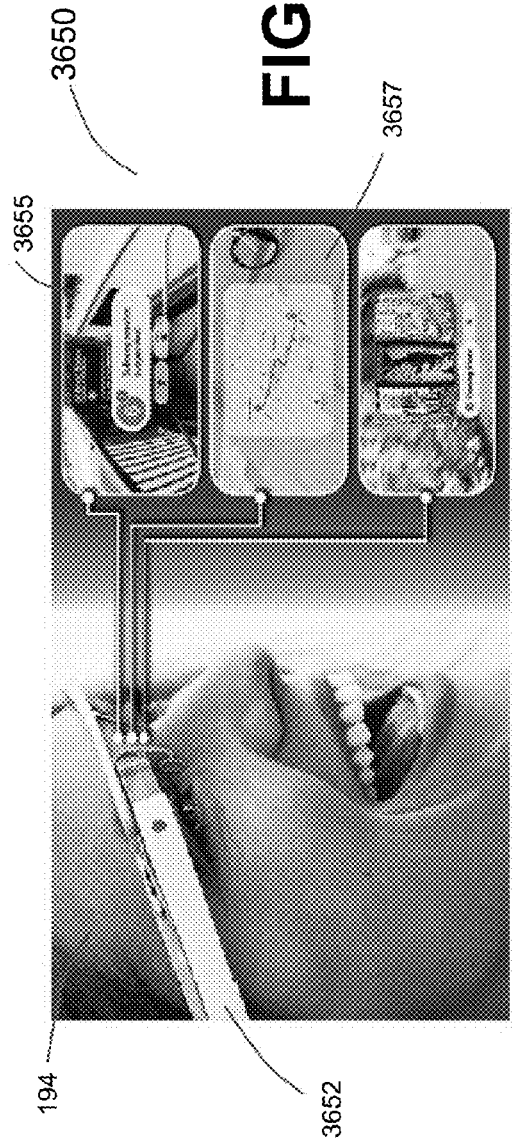
FIG. 36C illustrates one example of three dimensional augmented reality rendering expressed in augmented reality mapping platforms according to one embodiment of the computer-implemented system and method.

In other embodiments, three dimensional building geometry produced by the system and method 10 can be expressed through augmented reality platforms such as Google Glass™ wearable computing device. For example, FIG. 36C illustrates one example of three dimensional augmented reality rendering 3650 expressed in augmented reality mapping platforms according to one embodiment of the computer-implemented system and method 10. In some embodiments, a user 195 wearing a Google Glass™ device 3652 can look at a building in the real world, and the Google Glass™ device 3652 can display at least a partial representation of a virtual version of the real world building by displaying at least a partial outline of a building 3655, and/or a three dimensional map 3657 showing an approximate location of the building 3655 calculated according to at least one embodiment of the computer-implemented system and method 10 described herein. Google Glass™ is a trademark of Google Inc.

Figure 36D:
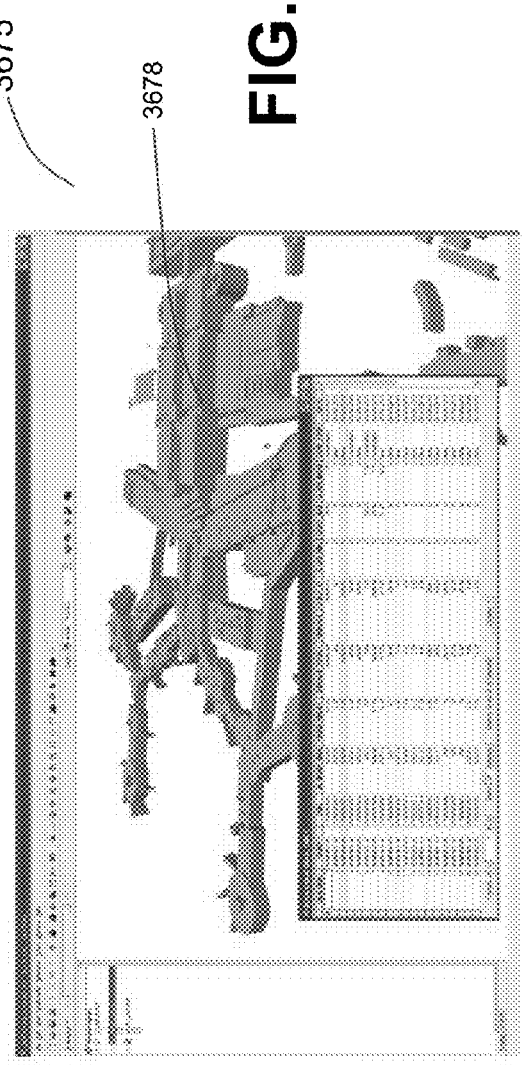
FIG. 36D illustrates one example of three dimensional augmented reality rendering integrated with the world-wide-web according to one embodiment of the computer-implemented system and method.

Referring now to the GUI 3675 of FIG. 36D, in some embodiments, the three dimensional augmented reality renderings calculated according to one embodiment of the computer-implemented system and method 10 can include integration with the world-wide-web. For example, in some embodiments, the renderings (such as three dimensional map 3657) can be displayed to a user 195 within a three dimensional augmented reality platform (e.g., with a Google Glass™ device 3652) and integrated with the world-wide-web. In some further embodiments, the augmented reality rendering of buildings 3678 can be displayed and integrated with the world-wide web. Further, as shown in FIG. 36E, in some embodiments, the system and method 10 can enable a user 195 to view an augmented reality display illustrating three dimensional augmented reality rendering 3685 of a street scene 3687 with buildings 3689.

In some further embodiments, one or more buildings or other structures can be displayed and rendered with real-time shading. For example, FIG. 36F illustrates one example of a GUI 3690 including a three dimensional augmented reality rendering 3691 with real-time shading according to one embodiment of the computer-implemented system and method 10. In this example embodiment, the rendering 3691 includes a plurality of trees 3693 that are shown to be casting at least one shadow 3695 over a building 3692.

In some embodiments, any of the above-described databases and models throughout the method and system 10 can display at least one polygon that includes a live, direct or indirect view of a physical real-world environment. For example, any of the above-described databases and models throughout the method and system 10 can display at least one polygon that can include one or more elements of the image augmented by computer-generated sensory input, including, but not limited to sound, video, graphics, shading, reflection, or location-based information such as GPS.

Figure 37A:
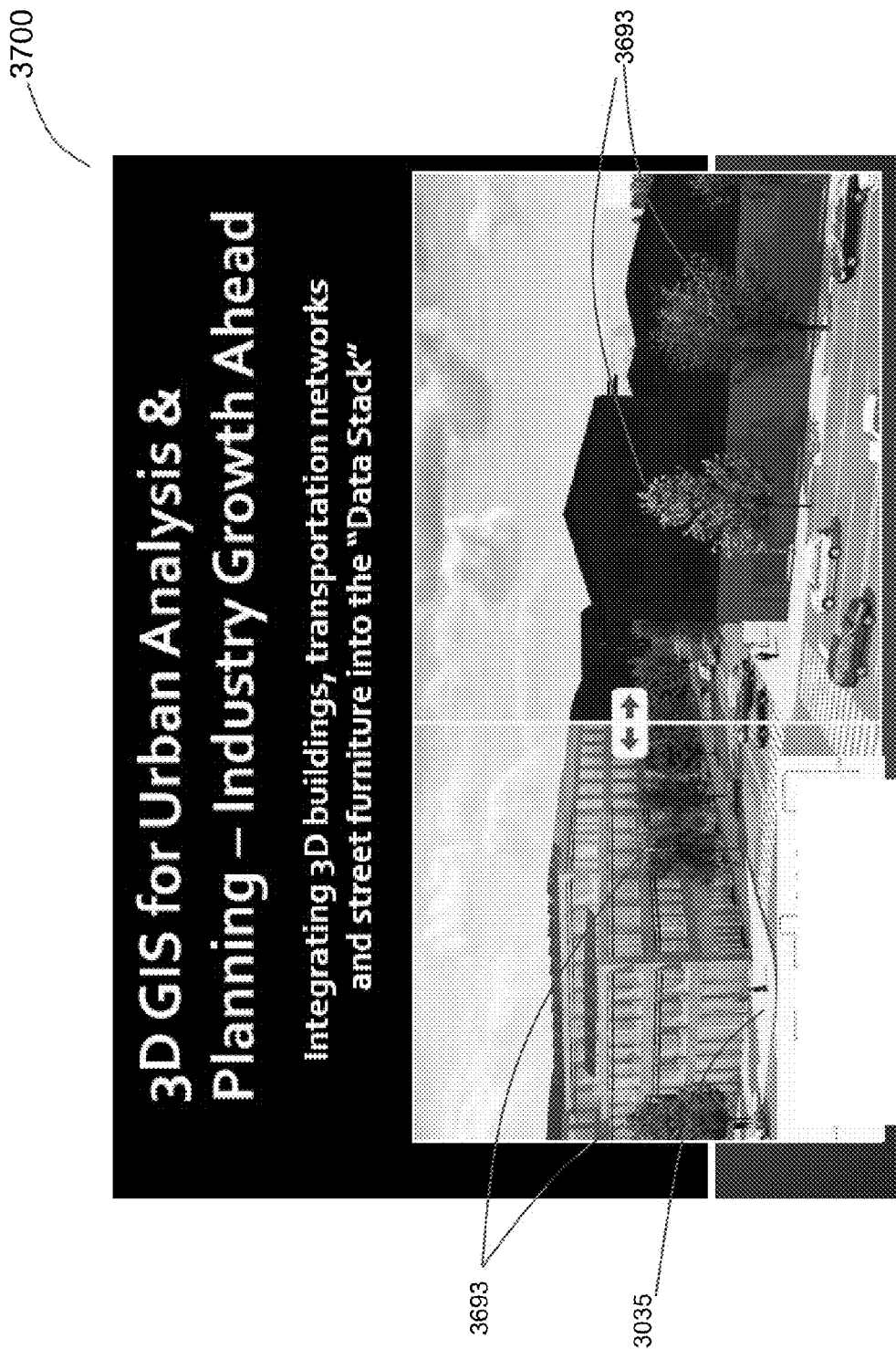
FIG. 37A illustrates one example of three dimensional augmented reality rendering of buildings and a street scene including street furniture according to one embodiment of the computer-implemented system and method.

In some embodiments, a three dimensional building geometry produced by the system and method 10 (including those expressed through an augmented reality platforms such as Google Glass™ wearable computing device and/or Google Street View™) can include street furniture. For example, FIG. 37A illustrates one example of three dimensional augmented reality rendering 3700 of buildings and a street scene including street furniture according to one embodiment of the computer-implemented system and method, and FIG. 37C illustrates one example of three dimensional augmented reality rendering 3760 of buildings and a street scene including street furniture according to another embodiment of the computer-implemented system and method 10.

Figure 37B:
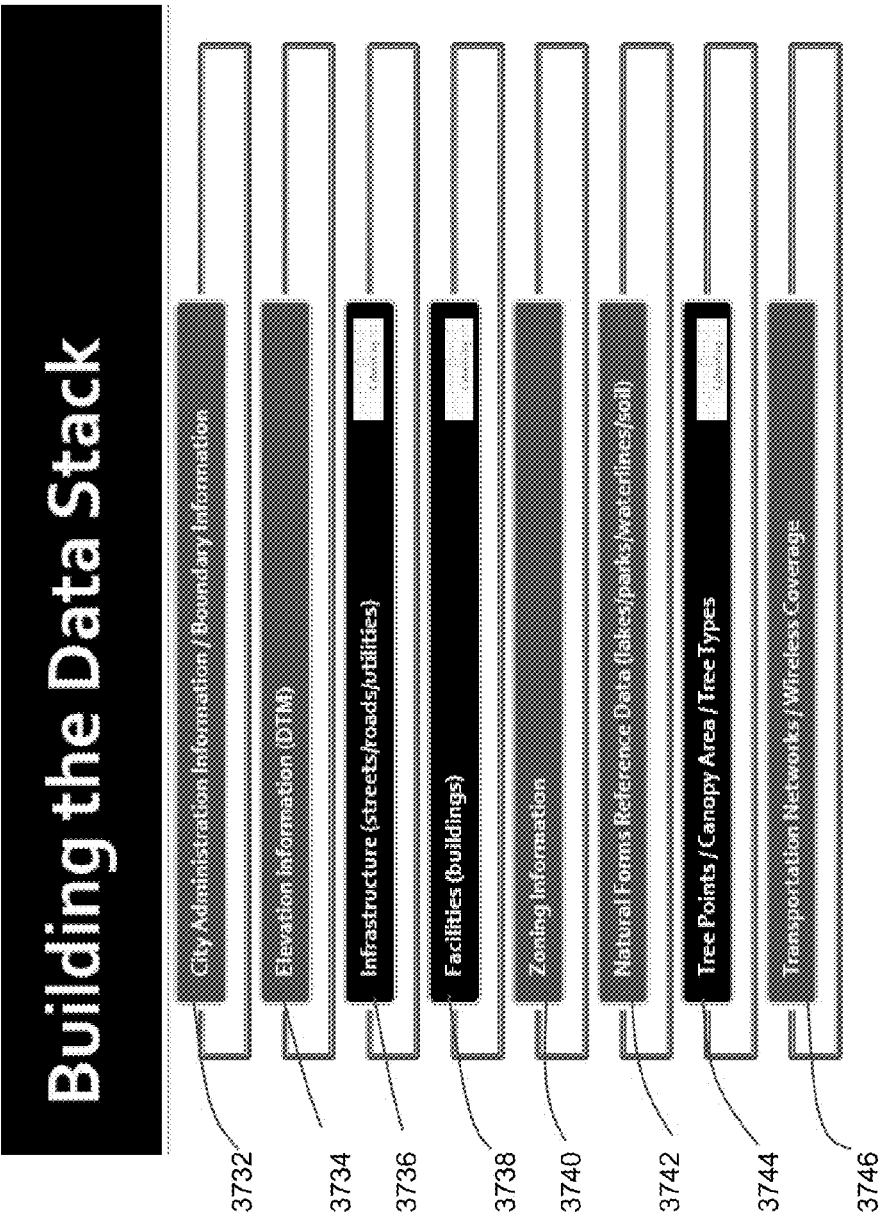
FIG. 37B illustrates one example of a data-stack of integrated three dimensional buildings, transportation networks and street furniture in accordance with one embodiment of the computer-implemented system and method.
Figure 37C:
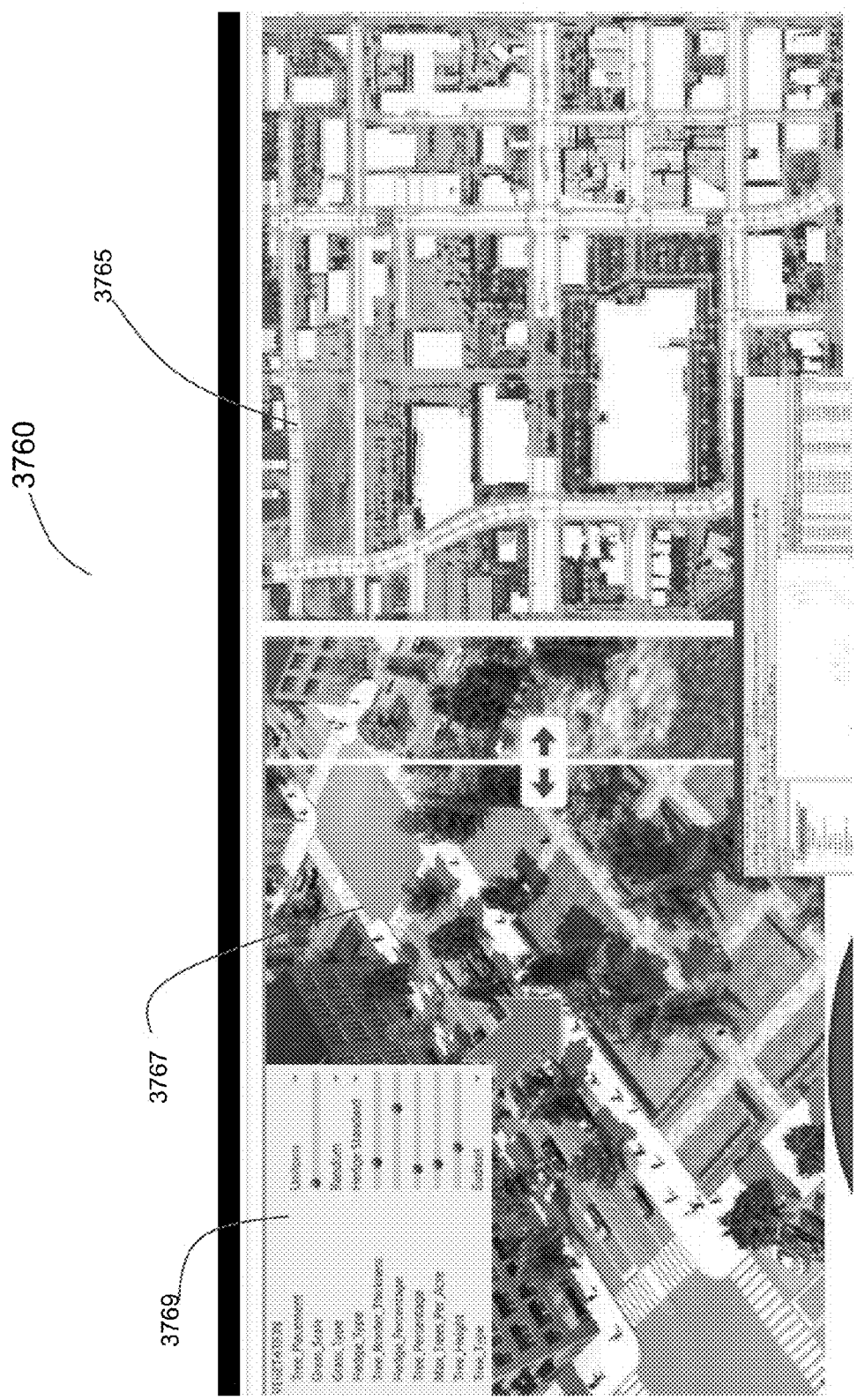
FIG. 37C illustrates one example of three dimensional augmented reality rendering of buildings and a street scene including street furniture according to another embodiment of the computer-implemented system and method.

In some embodiments, the three dimensional augmented reality rendering including street furniture includes the preparation of a data-stack 3730 as shown in FIG. 37B. For example, in some embodiments, the data-stack 3730 can include a plurality of variables that can be used and/or created by the system and method 10. In some embodiments, the data-stack 3730 can include one or more variables comprising a city administration and/or boundary information 3732, elevation information 3734, infrastructure information 3736, facilities information 3738, zoning information 3740, natural forms reference data 3742, tree points 3744, and transportation networks and/or wireless coverage 3746. In some embodiments, one or more of the variables 3732, 3734, 3736, 3738, 3740, 3742, 3744, and 3746 can be used by the system and method 10 to render at least one building or structure including comprising three dimensional augmented virtual reality. In some embodiments, the three dimensional building geometry produced by the system and method 10 can include at least one conventional street lamp, and/or at least one conventional street lighting fixture (e.g., such as lamp-posts 3040 depicted in FIG. 30). In some other embodiments, the street furniture can include at least one rendered plant, such as a grass, one or more shrubs, one or more bushes, and/or one or more trees 3693, as well as sidewalks (e.g., such as the sidewalk 3035). Some embodiments include at least one control to enable a user to control the rendering of at least one item of street furniture. For example, in the example illustration of FIG. 37C, at least one control window 3769 can be displayed to enable a user 195 to control the rendering of at least one item of street furniture (show in this example as a control window 3769 to control a plurality of parameters related to trees 3693).

In some further embodiments, the street furniture can include street culture. For example, in some embodiments, one or more paths, roadways, wall or signs can comprise a conventional cultural symbol. In some further embodiments, the street culture can include conventional graffiti or a mural applied across at least one surface of one or more of the paths, roadways, wall or signs. In other embodiments, the street furniture can include one or more parking meters, or at least one side-walk railing. Some embodiments include street furniture related to public safety service. For example, in some embodiments, the three dimensional building geometry produced by the system and method 10 can include at least one conventional fire hydrant and/or at least one conventional emergency call station.

Figure 38:
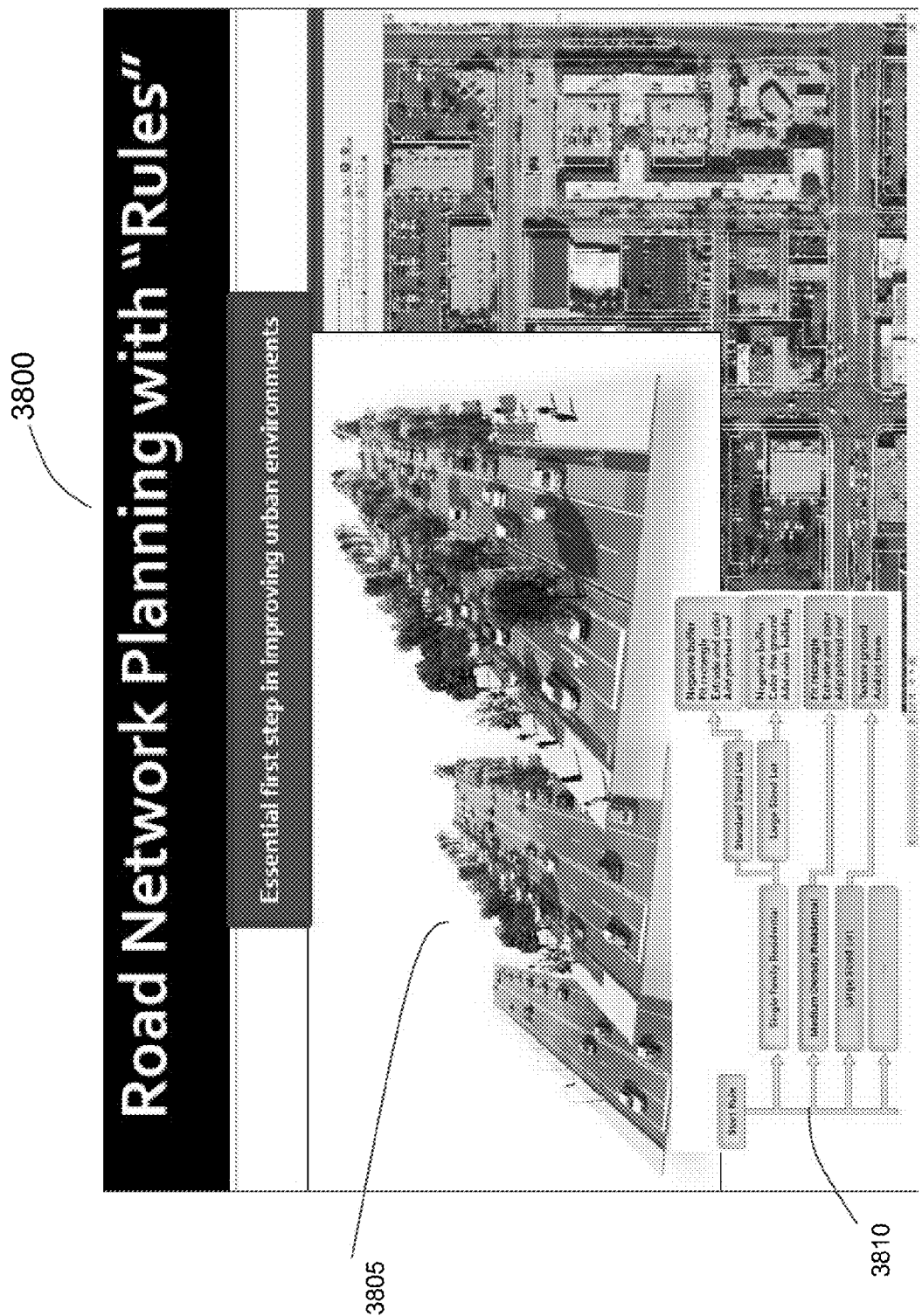
FIG. 38 illustrates one example of a three dimensional augmented reality rendering of buildings and a street scene including road network planning with rules according to another embodiment of the computer-implemented system and method.

FIG. 38 illustrates one example of a three dimensional augmented reality rendering 3800 of buildings and a street scene 3805 including road network planning with rules 3810 according to another embodiment of the computer-implemented system and method 10. As illustrated, in some embodiments, a road network plan can be implemented based on one or more rules 3810, and displayed as a three dimensional augmented reality rendering of buildings and streets within the scene 3805.

Figure 39:
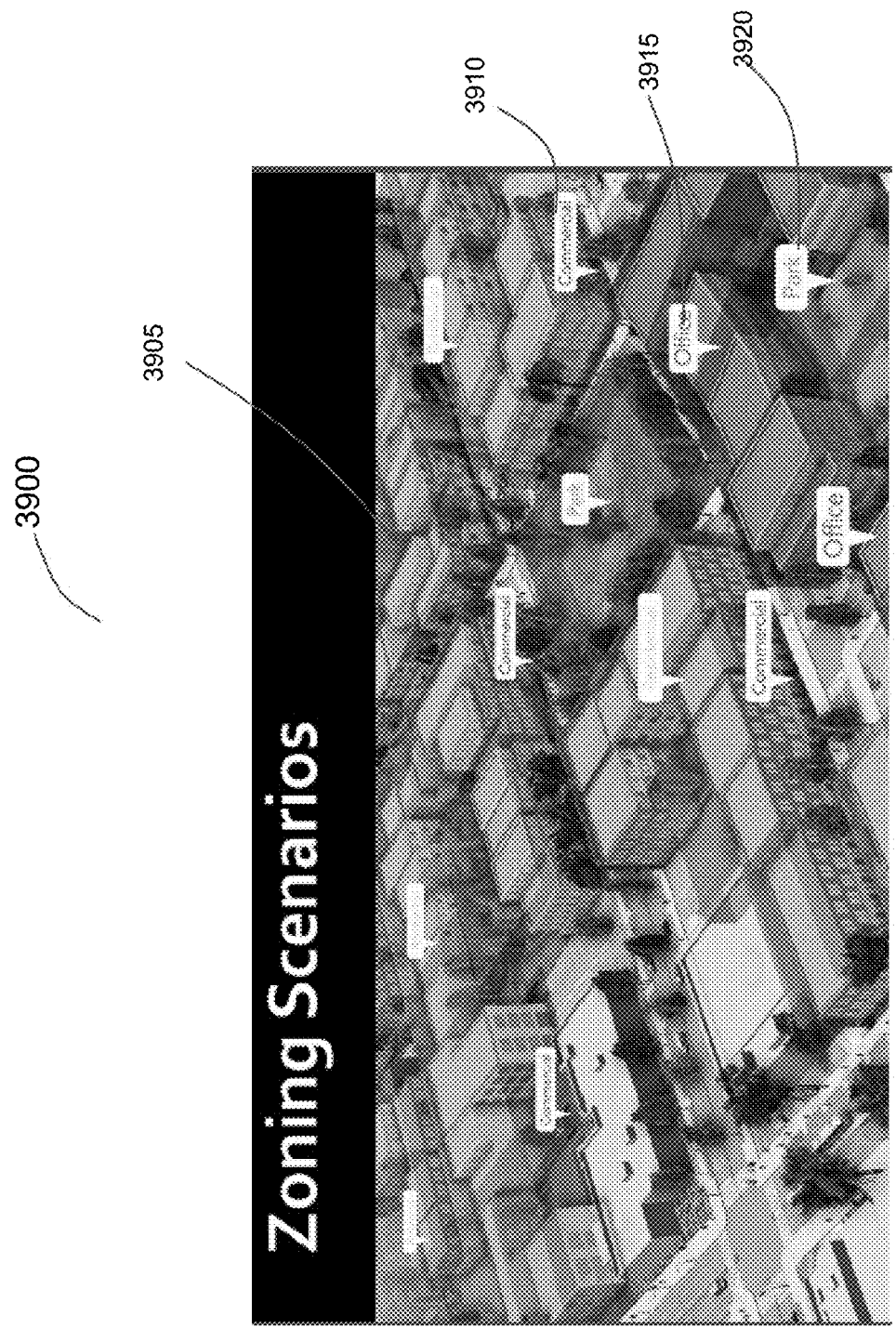
FIG. 39 illustrates one example of a three dimensional augmented reality rendering of buildings and a street scene including zone planning according to another embodiment of the computer-implemented system and method.

In some further embodiments, a road network plan can be implemented based on rules and extended to zone planning. For example, FIG. 39 illustrates one example of a three dimensional augmented reality rendering 3900 of buildings and a street scene 3905 including zone planning according to another embodiment of the computer-implemented system and method 10. As shown, in some embodiments, zoning scenarios can be simulated and displayed showing at least one commercial zoning 3910, at least one office zoning 3915, and at least one recreational area zoning 3920. In some embodiments, one or more of the regions of the street scene 3905 can be rendered in one or more colors and/or or color combinations to enable a user 195 to distinguish one or more zones 3910, 3915, 3920. For example, in some embodiments, at least one commercial zoning 3910 can be rendered within the street scene 3905 in a red color. At least one office zoning 3915 can be rendered within the street scene as a blue color, and at least one recreational area zoning 3920 can be rendered within a street scene as a green color. In other embodiments, any one of the zones 3910, 3915, 3920 can be rendered in one or more graphical patterns (e.g., such as a dotted, dashed, or other patterned fill). In some embodiments, any one of the zones 3910, 3915, 3920 can be made to appear opaque within the street scene 3905 so that a user 195 can retain a view of the street scene 3905 regardless of the position and area of coverage of any one of the zones 3910, 3915, 3920.

Figure 40:
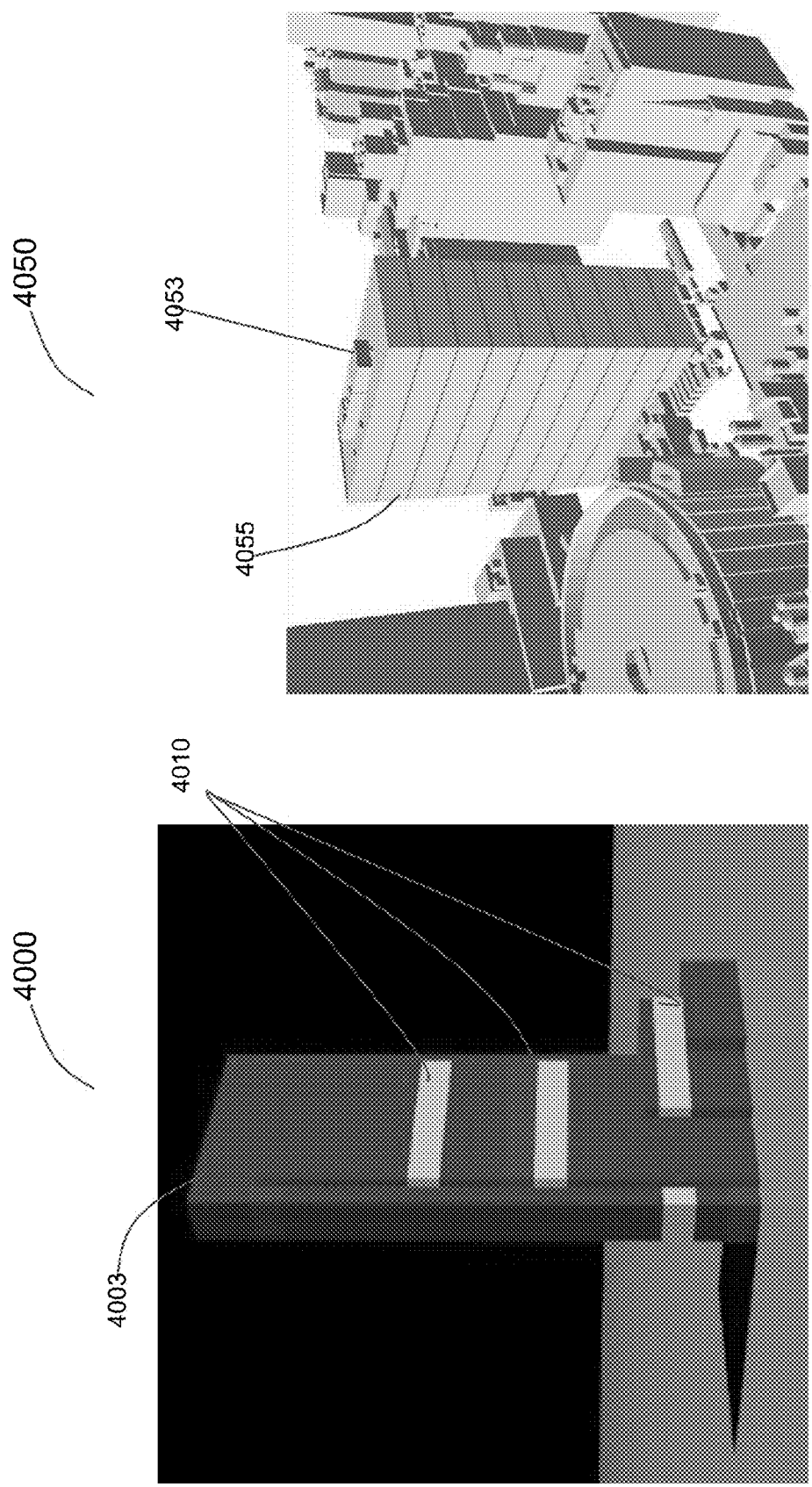
FIG. 40A illustrates one example of a building object with vertical measured floor separation according to another embodiment of the invention.
FIG. 40B illustrates an example of a building object with all building floors defined using vertical measured floor separation according to another embodiment of the invention.

Some embodiments of the system and method 10 can include one or more building object floor separation methods. As described earlier, some embodiments of the computer-implemented system and method 10 can generate a three-dimensional model of the buildings from rooftop to base. By applying these embodiments with building floor information (e.g., building foot-prints), automated processes can be applied and building floors can be cut and separated to provide building floor profiles with attribute data. In some embodiments, building floor-plan information can be used to define one or more building floors and each floor can be represented as an individual data file capable of being used to calculate one or more parameters of the building volume defined by the one or more floors. For example, FIG. 40A illustrates one example of a building object 4000 with vertical measured floor separation (showing floors 4010 rendered within the building object 4003) according to another embodiment of the invention. Further, FIG. 40B illustrates an example of a GUI rendering 4050 including a building object 4053 with all building floors 4055 rendered within the building object 4053 calculated and defined by the system and method using the vertical measured floor separation according to another embodiment of the invention. Further, each individual floor 4055 shown in FIG. 40B can be defined as an individual data file suitable for use in calculating one or more parameters of the building based on the volume defined by the specific floor derived from the building footprint calculation and a building floor-plan.

Figure 41:
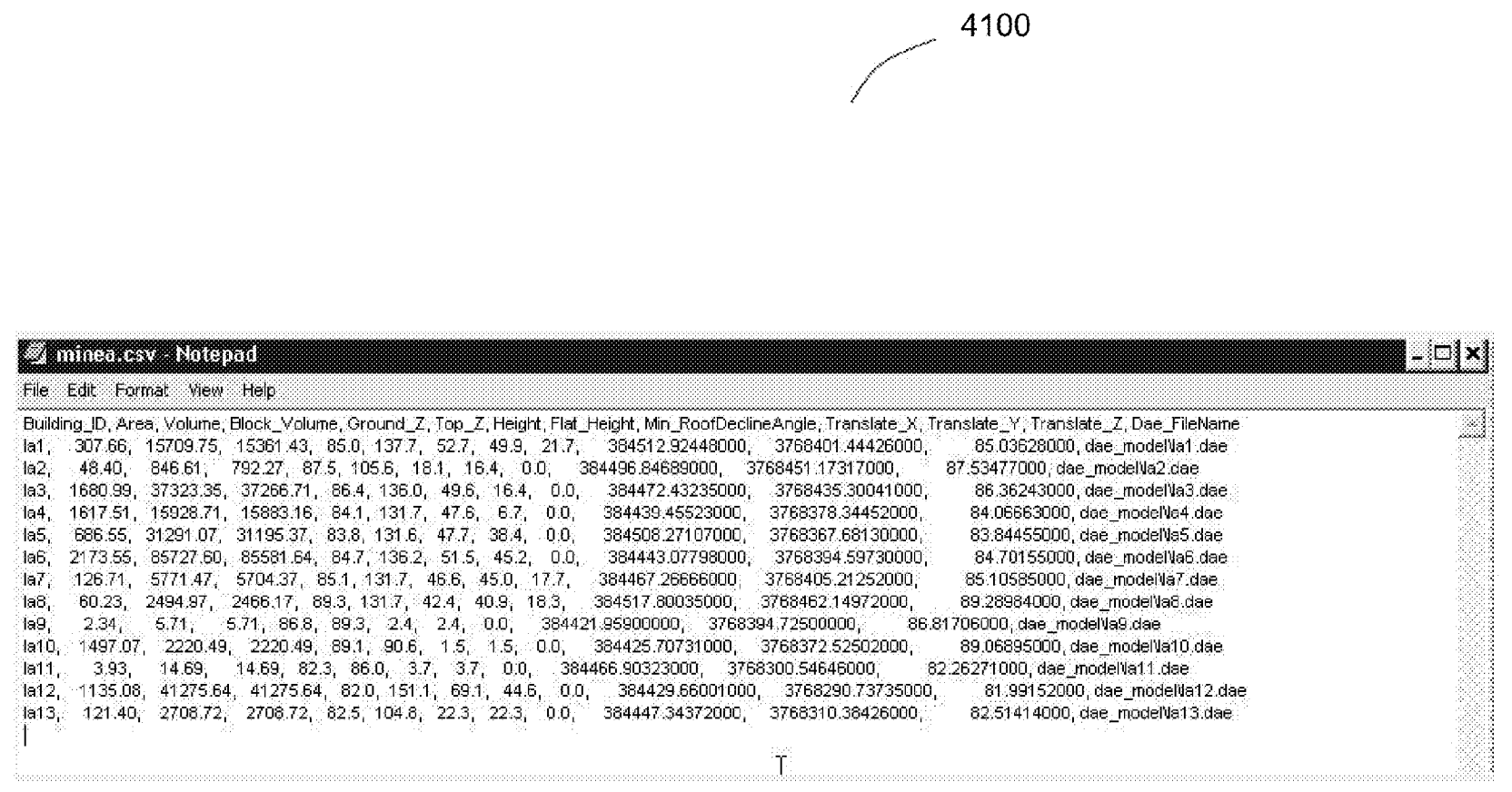

Some embodiments of the invention can be configured to transfer three-dimensional rendering information and scene information such as building information using open-source graphic files. For example, some embodiments of the system and method 10 can provide a computer-implemented system and method 10 for generating at least one three-dimensional model of one or more buildings or structures using a Collada® based file format, an interchange file format for interactive three dimensional graphics applications. Collada® is a registered trademark of the Khronos Group. FIG. 41 illustrates one example of a comma-separated values file portion 4100 of a Collada® file according to at least one embodiment of the invention. As shown, the Collada®-based file 4100 can include information used for generating one or more three dimensional polygons generated by the system and method 10. The representation of the comma-separated values file 4100 can form part of a Collada® file format and can include further Collada® file information. In some embodiments, the file 4100 can include polygon texture data that can be used to map specific images to polygon surfaces.

Figure 42:
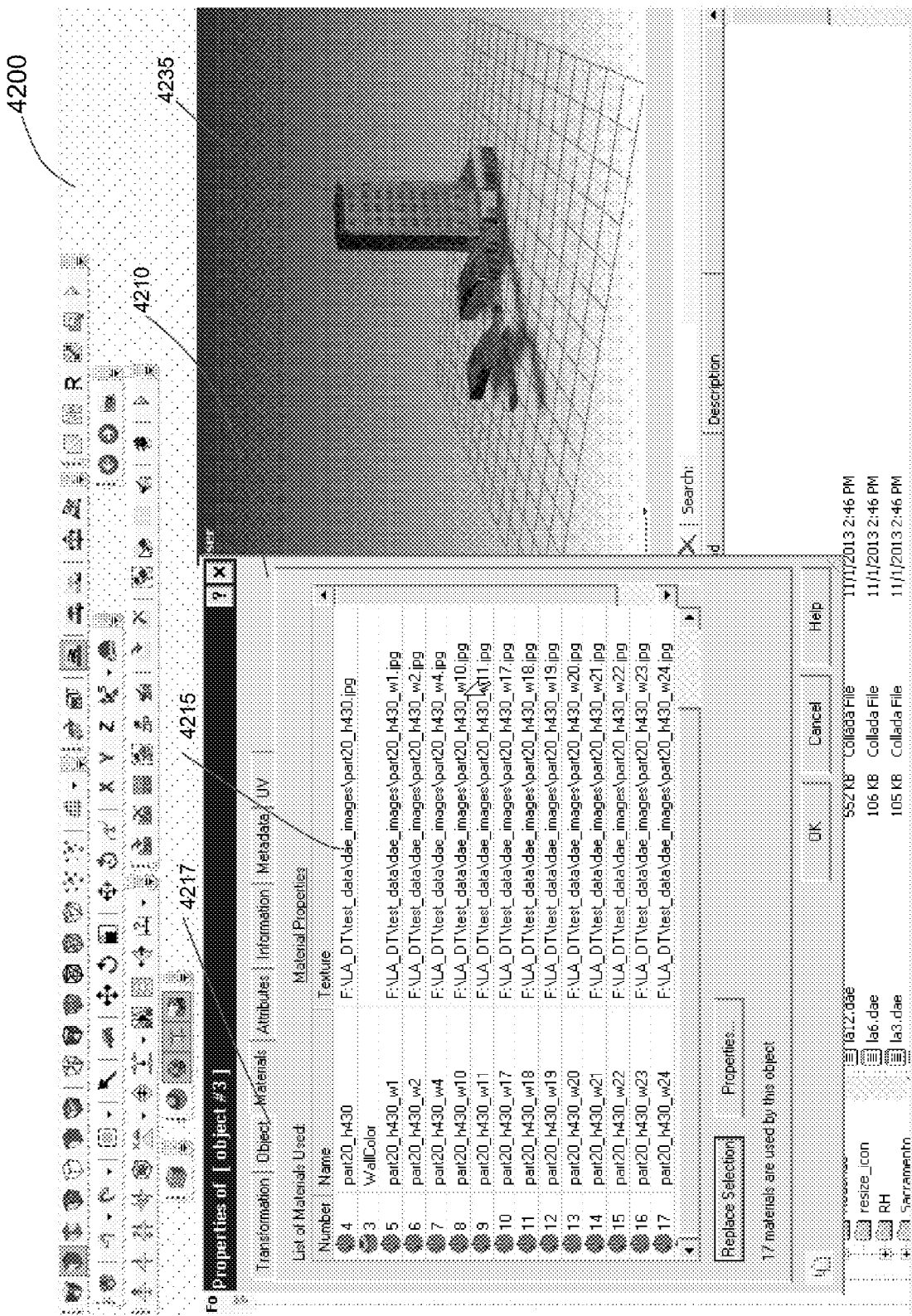
FIG. 42 illustrates a GUI depicting one example of a texture file with building texture file data for texturing polygons according to at least one embodiment of the invention.

Some embodiments of the invention can be configured to transfer three-dimensional texturing information such as building surface map information. For example, FIG. 42 illustrates one example of a GUI 4200 depicting a texture file 4210 with building texture file data 4215 for texturing polygons according to at least one embodiment of the invention. As shown, the text file 4210 can include data with various objects 4217, each of which can include parts onto which one or more texture images 4215 can be mapped to a rendered three dimensional building or structure 4235.

Figure 43:
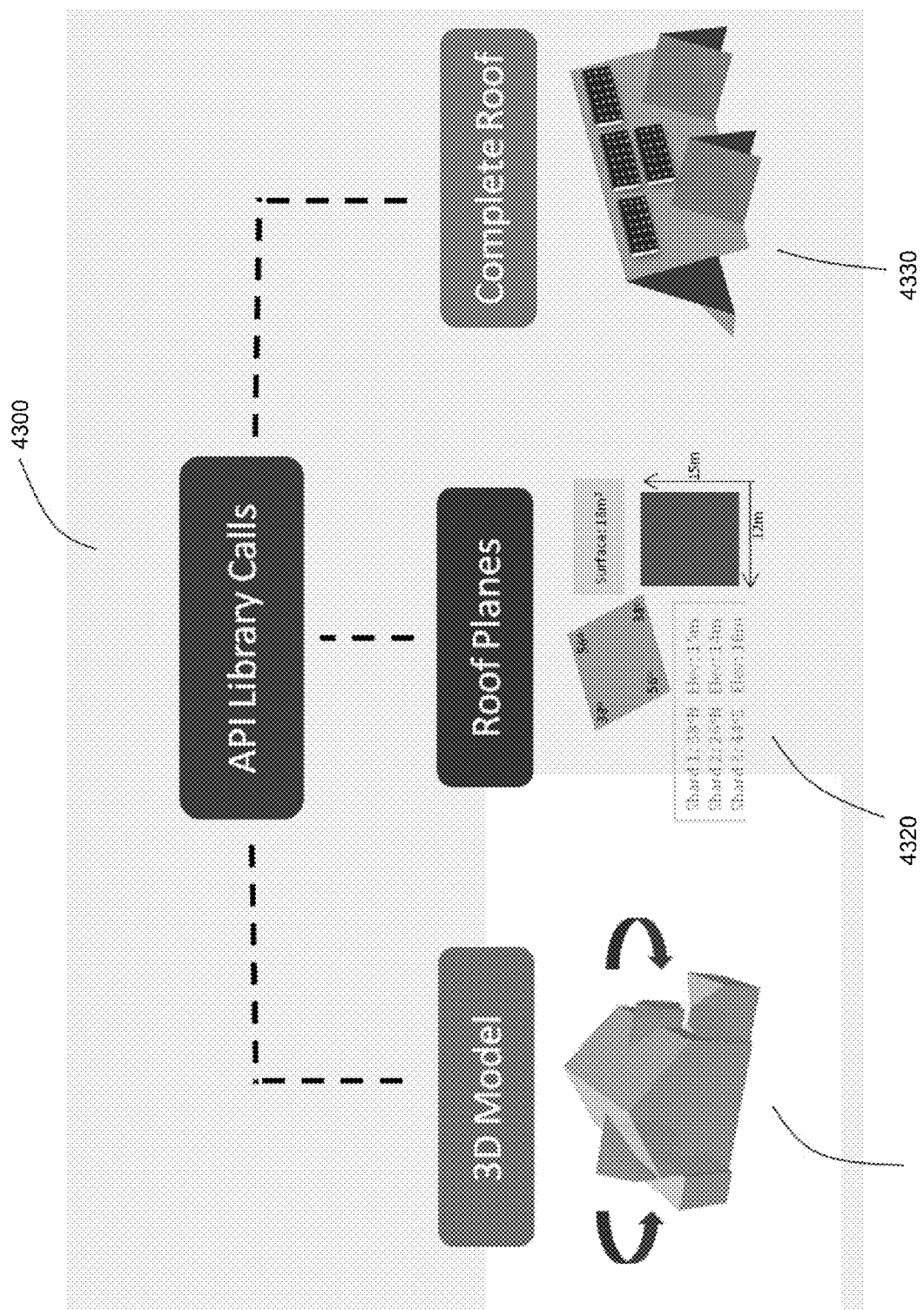
FIG. 43 illustrates an application programming interface schematic showing the inter-relationship of API calls for three dimensional models, roof planes, and a complete roof.

In some embodiments, roof measurement information can be calculated by the system and method 10 using one or more application programming interface (hereinafter "API") calls based on one or more user 195 requests. For example, in some embodiments, the system and method 10 can access a three dimensional model database 4310 and/or or a roof plane database 4320 and/or a complete roof database 4330 based on one or more requests from at least one user 195. For example, FIG. 43 illustrates a schematic 4300 showing the inter-relationship of API calls of the system and method 10 following at least one user 195 request. In some embodiments, the system and method 10 can access one or more databases including a three dimensional model database 4310, a roof planes database 4320, and a complete roof database 4330, using API calls following a user selection of at least one building or structure and/or a location or address provided by the user 195. For example, in some embodiments, a user 195 can provide an address of a building or structure, and the system and method 10 can access data from one or more databases 4310, 4320, 4330 through API calls, and calculate and render a three dimensional model of the building or structure defined by the address information including calculated roof measurement data (e.g., such as a solar energy potential or a stormwater runoff potential). In some embodiments, the system and method 10 can calculate and deliver information related to one or more roof portions that face south. Further, in some embodiments, the system and method 10 can re-assemble and render a complete roof structure based on the address or location identified by the user 195.

Any of the operations described herein that form part of the invention are useful machine operations. The systems and methods 10 cannot be performed in the human mind or derived by a human using pen and paper, and require machine operations to process input data to useful output data. The embodiments of the present invention can also be defined as a machine that transforms data from one state to another state. The data can represent an article, that can be represented as an electronic signal and electronically manipulate data. The transformed data can, in some cases, be visually depicted on a display, representing the physical object that results from the transformation of data. The transformed data can be saved to storage generally or in particular formats that enable the construction or depiction of a physical and tangible object. In some embodiments, the manipulation can be performed by a processor 182. In such an example, the processor 182 thus transforms the data from one thing to another. Still further, the methods can be processed by one or more machines or processors 182 that can be connected over a network. Each machine can transform data from one state or thing to another, and can also process data, save data to storage, transmit data over a network, display the result, or communicate the result to another machine. Computer-readable storage media 186, as used herein, refers to physical or tangible storage (as opposed to signals) and includes without limitation volatile and non-volatile, removable and non-removable storage media implemented in any method or technology for the tangible storage of information such as computer-readable instructions, data structures, program modules or other data.

Although method operations can be described in a specific order, it should be understood that other housekeeping operations can be performed in between operations, or operations can be adjusted so that they occur at slightly different times, or can be distributed in a system which allows the occurrence of the processing operations at various intervals associated with the processing, as long as the processing of the overlay operations are performed in the desired way.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the invention.

The invention claimed is:

1. A computer-implemented roof area measurement system, the system comprising:
   a processor;
   a non-transitory computer-readable storage medium in data communication with the processor,
   the non-transitory computer-readable storage medium including a rooftop modeling system executable by the processor, and configured to:
   prepare at least one three dimensional model of at least one physical roof including at least one rooftop by performing the steps executable by the processor comprising:
   calculate at least one stereoscopic image using a first aerial image and a second aerial image of a physical roof, the first aerial image and second aerial image including at least a 30% image overlap;
   calculate a point cloud from at least a portion of the at least one stereoscopic image;
   generate at least one polygonal chain using at least a portion of the point cloud;
   identify at least one rooftop portion defined by a closed polygonal chain;
   calculate a geometry and area of the at least one rooftop portion;
   calculate a slope, and orientation to North of the at least one rooftop portion;
   calculate a solar potential of the at least one rooftop portions using at least the geometry and area, slope and orientation to North of the at least one rooftop portions;
   display in a graphical user interface the at the least one three dimensional model including the at least one rooftop portions; and
   display a solar potential of at least one portion of the at least one rooftop.

2. The system of claim 1, and further comprising the rooftop modeling system executable by the processor and configured to:
   calculate a total rooftop area from the at least one rooftop portions.

3. The system of claim 2, and further comprising the rooftop modeling system executable by the processor and configured to:
   calculate and display a rooftop solar potential using at least the total rooftop area and slope and orientation to North of the at least one rooftop portions.

4. The system of claim 2, wherein the at least one rooftop comprises a plurality of solar values; and
   wherein the rooftop is rendered in a plurality of colors based at least in part on the plurality of solar values.

5. The system of claim 1, wherein displaying the solar potential of at least one portion of the at least one rooftop comprises rendering the at least one rooftop portions in one or more colors correlated to the solar potential of the at least one portion of the at least one rooftop.

6. The system of claim 1, wherein displaying the solar potential of at least one portion of the at least one rooftop comprises rendering the at least one rooftop portions in one or more graphical patterns correlated to the solar potential of the at least one portion of the at least one rooftop.

7. The system of claim 1, and further comprising the rooftop modeling system executable by the processor and configured to:
   display a three dimensional model of at least one building comprising the at least one rooftop portion; and
   display a roof data feature of the at least one building based at least in part on a user selection of the at least one rooftop portion.

8. The system of claim 7, wherein the roof data feature comprises a display window comprising a data field including at least one of an absolute height, a relative height, a surface area total, a surface area XY, a slope min, a slope max, a roof pitch angle, a roof type, a solar azimuth, a solar surface area, a two dimensional solar area, an sP façade or an SP roof.

9. The system of claim 7, wherein the roof data feature comprises a display window comprising at an orientation to North, an area and a potential.

10. The system of claim 1, wherein the solar potential of at least one portion of the at least one rooftop is designated to be at least one of a poor solar potential, a fair solar potential, a good solar potential and an excellent solar potential, a no solar potential, a low solar potential, a medium solar potential, a high solar potential or a highest solar potential.

11. The system of claim 1, wherein at least one portion of the at least one rooftop is assigned a solar value.

12. The system of claim 11, wherein the solar value comprises a numerical value; and
wherein the at least one portion of the at least one rooftop is rendered in a color assigned to the numerical value.

13. The system of claim 11, wherein the solar value comprises a numerical value; and
wherein the at least one portion of the at least one rooftop is rendered with a graphical pattern assigned to the numerical value.

14. A non-transitory computer-readable storage medium storing computer-readable instructions, which when executed by at least one processor of a computer, cause a roof area modeling system to perform steps comprising:
receiving and storing on a computer-readable storage medium a first file comprising; and
using the least one processor, preparing at least one three dimensional model of at least one physical roof including at least one rooftop by performing the steps executable by the processor comprising:
acquire at least a first aerial image and a second aerial image of a physical rooftop,
the first aerial image and second aerial image including at least a 30% image overlap;
calculate at least one stereoscopic image of the physical rooftop using the first aerial image and a second aerial image;
calculate a point cloud from at least a portion of the at least one stereoscopic image;
generate at least one polygonal chain using at least a portion of the point cloud;
identify at least one rooftop portion defined by a closed polygonal chain;
calculate a geometry and area of the at least one rooftop portion;
calculate a slope and orientation to North of the at least one rooftop portion;
calculate a solar potential of the at least one rooftop portions using at least the geometry and area, slope, and orientation to North of the at least one rooftop portions;
display in a graphical user interface the at the least one three dimensional model including the at least one rooftop portions; and
display a solar potential of at least one portion of the at least one rooftop.

15. The non-transitory computer-readable storage medium of claim 14, and further comprising the rooftop modeling system executable by the processor and configured to:
calculate a total rooftop area from the at least one rooftop portions; and
display the solar potential of at least one portion of the at least one rooftop by rendering the at least one rooftop portions in one or more colors correlated to the solar potential of the at least one portion of the at least one rooftop.

16. The non-transitory computer-readable storage medium of claim 14, wherein the solar potential of at least one portion of the at least one rooftop is designated to be at least one of a poor solar potential, a fair solar potential, a good solar potential, an excellent solar potential, a no solar potential, a low solar potential, a medium solar potential, a high solar potential or a highest solar potential.

17. The non-transitory computer-readable storage medium of claim 14, and further comprising the rooftop modeling system executable by the processor and configured to:
display a three dimensional model of at least one building comprising the at least one rooftop portion;
display a roof data feature of the at least one building based at least in part on a user selection of the at least one rooftop portion,
the roof data feature comprising at least one of an absolute height, a relative height, a surface area total, a surface area XY, a slope min, a slope max, a roof pitch angle, a roof type, a solar azimuth, a solar surface area, a two dimensional solar area, an sP façade or an SP roof.

18. A computer-implemented roof runoff measurement system, the system comprising:
a processor;
a non-transitory computer-readable storage medium in data communication with the processor,
the non-transitory computer-readable storage medium including a rooftop modeling system executable by the processor, and configured to:
prepare at least one three dimensional model of at least one physical roof including at least one rooftop by performing the steps executable by the processor comprising:
calculating at least one stereoscopic image using a first aerial image and a second aerial image of a physical roof, the first aerial image and second aerial image including at least a 30% image overlap;
calculate a point cloud from at least a portion of the at least one stereoscopic image;
generate at least one polygonal chain using at least a portion of the point cloud;
identify at least one rooftop portion defined by a closed polygonal chain;
calculate a geometry and area of the at least one rooftop portion;
calculate a slope of the at least one rooftop portion;
calculate a rainwater runoff of the at least one rooftop portions using at least the geometry and area and slope of the at least one rooftop portions;
display in a graphical user interface the at the least one three dimensional model including the at least one rooftop portions; and
display a rainwater runoff potential of at least one portion of the at least one rooftop.

19. The system of claim 18, wherein the runoff potential is calculated based at least in part on a flow of rainwater per unit width of the at least one rooftop portion which is calculated using the expression:

$$q = \frac{iL}{\sqrt{1+S_0^2}}$$

where i is the rainfall intensity falling on the at least one rooftop portion with a longitudinal slope of So and length L.

20. The system of claim 18, wherein the runoff potential is calculated based at least in part on a time for a water droplet to travel from a top of the at least one roof portion to the bottom of the at least one roof portion based on a water droplet velocity calculated using the expression:

$$V = \frac{1.49}{n} y^{2/3} S_0^{1/2}$$

where n equals a roughness coefficient of the surface of the at least one rooftop portion and y is the depth of flow of rainwater runoff.

* * * * *